US008723028B2

United States Patent
Zhu et al.

(10) Patent No.: US 8,723,028 B2
(45) Date of Patent: May 13, 2014

(54) CONJUGATED POLYMERS AND THEIR USE IN OPTOELECTRONIC DEVICES

(71) Applicant: Polyera Corporation, Skokie, IL (US)

(72) Inventors: Zhengguo Zhu, Chelmsford, MA (US); Hualong Pan, Skokie, IL (US); Martin Drees, Glenview, IL (US); Hakan Usta, Evanston, IL (US); Shaofeng Lu, Skokie, IL (US); Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 33 days.

(21) Appl. No.: 13/829,738

(22) Filed: Mar. 14, 2013

(65) Prior Publication Data
US 2013/0200354 A1     Aug. 8, 2013

Related U.S. Application Data

(63) Continuation of application No. PCT/US2011/057410, filed on Oct. 22, 2011.

(60) Provisional application No. 61/405,870, filed on Oct. 22, 2010.

(51) Int. Cl.
*H01L 31/00* (2006.01)

(52) U.S. Cl.
USPC ...... 136/263; 526/256; 257/40; 257/E51.005; 257/E51.008; 528/377; 528/380

(58) Field of Classification Search
USPC ............. 136/263; 526/256; 257/40, E51.005, 257/E51.018; 528/377, 380
See application file for complete search history.

(56) References Cited

U.S. PATENT DOCUMENTS

| | | | |
|---|---|---|---|
| 2010/0307594 A1 | 12/2010 | Zhu et al. | 136/263 |
| 2011/0156018 A1 | 6/2011 | Moriwaki et al. | 257/40 |
| 2011/0226338 A1 | 9/2011 | Lu et al. | 136/263 |
| 2012/0152357 A1 | 6/2012 | Brown et al. | 136/263 |
| 2012/0186652 A1 | 7/2012 | Pan et al. | 136/263 |
| 2012/0187385 A1 | 7/2012 | Pan et al. | 257/40 |
| 2013/0098448 A1 | 4/2013 | Zhu et al. | 136/263 |

FOREIGN PATENT DOCUMENTS

| | | |
|---|---|---|
| WO | 2010/083161 | 7/2010 |
| WO | 2011/060526 | 5/2011 |
| WO | 2011/156478 | 12/2011 |
| WO | 2012/028246 | 3/2012 |

OTHER PUBLICATIONS

Ding et al., "A High-Mobility Low-Bandgap Copolymer for Efficient Solar Cells," *Macromol. Chem. Phys.*, 211(24): 2555-2561 (Oct. 21, 2010).

(Continued)

*Primary Examiner* — Shane Fang
(74) *Attorney, Agent, or Firm* — Karen K. Chan

(57) ABSTRACT

Disclosed are certain polymeric compounds and their use as organic semiconductors in organic and hybrid optical, optoelectronic, and/or electronic devices such as photovoltaic cells, light emitting diodes, light emitting transistors, and field effect transistors. The disclosed compounds can provide improved device performance, for example, as measured by power conversion efficiency, fill factor, open circuit voltage, field-effect mobility, on/off current ratios, and/or air stability when used in photovoltaic cells or transistors. The disclosed compounds can have good solubility in common solvents enabling device fabrication via solution processes.

20 Claims, 1 Drawing Sheet

(56) References Cited

OTHER PUBLICATIONS

Helgesen et al., "Substituted 2,1,3-Benzothiadiazole- and Thiophen-Based Polymers for Solar Cells—Introducing a New Thermocleavable Precursor," *Chem. Mater.*, 21(19): 4669-4675 (2009).

Huo et al., "A polybenzo[1,2-b:4,5-b']dithiophene Derivative with Deep HOMO Level and Its Application in High-Performance Polymer Solar Cells," *Angew. Chem. Int. Ed.*, 49:1500-1503 (Jan. 25, 2010).

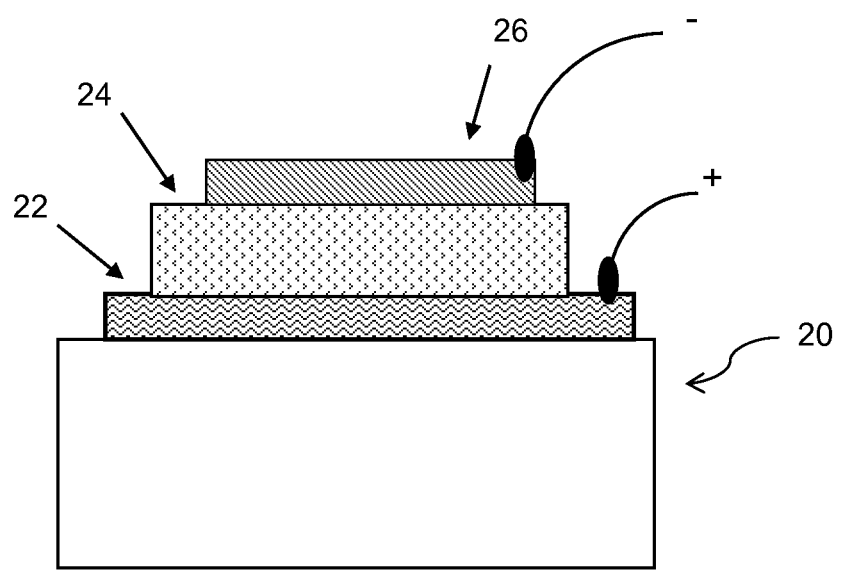

CONJUGATED POLYMERS AND THEIR USE IN OPTOELECTRONIC DEVICES

CROSS-REFERENCE TO RELATED APPLICATIONS

This application is a continuation of International Application No. PCT/US2011/057410, filed on Oct. 22, 2011, which claims priority to and the benefit of U.S. Provisional Patent Application Ser. No. 61/405,870, filed on Oct. 22, 2010, the disclosure of each of which is incorporated by reference herein in its entirety.

BACKGROUND

A new generation of optoelectronic devices such as organic photovoltaics (OPVs) and organic light-emitting transistors (OLETs) are fabricated using organic semiconductors as their active components. To be commercially relevant, these organic semiconductor-based devices should be processable in a cost-effective manner.

Bulk heterojunction (BHJ) solar cells commonly are considered the most promising OPV structures because they can be fabricated using roll-to-roll and large-scale production. BHJ solar cells include a photoactive layer disposed between an anode and a cathode, where the photoactive layer is composed of a blend film including a "donor" material and an "acceptor" material. State-of-the-art BHJ solar cells use fullerene-based compounds as the acceptor material. Typical fullerenes include C60 or C70 "bucky ball" compounds functionalized with solubilizing side chains such as [6,6]-phenyl-$C_{61}$-butyric acid methyl ester (C60-PCBM) or [6,6]-phenyl-$C_{71}$-butyric acid methyl ester (C70-PCBM). The most common donor material used in BHJ solar cells is poly(3-hexylthiophene) (P3HT). However, it is well known that P3HT has poor air stability.

Accordingly, the art desires new materials for OPV devices.

SUMMARY

In light of the foregoing, the present teachings provide certain polymeric compounds that can be used as organic semiconductor materials. Also provided are associated devices and related methods for the preparation and use of these compounds. The present compounds can exhibit properties such as optimized optical absorption, good charge transport characteristics and chemical stability in ambient conditions, low-temperature processability, large solubility in common solvents, and processing versatility (e.g., via various solution processes). As a result, optoelectronic devices such as solar cells that incorporate one or more of the present compounds as a photoactive layer can exhibit high performance in ambient conditions, for example, demonstrating one or more of low band-gap, high fill factor, high open circuit voltage, and high power conversion efficiency, and preferably all of these criteria. Similarly, other organic semiconductor-based devices such as OLETs can be fabricated efficiently using the organic semiconductor materials described herein.

The present teachings also provide methods of preparing such compounds and semiconductor materials, as well as various compositions, composites, and devices that incorporate the compounds and semiconductor materials disclosed herein.

The foregoing as well as other features and advantages of the present teachings will be more fully understood from the following figures, description, examples, and claims.

BRIEF DESCRIPTION OF DRAWINGS

It should be understood that the drawings described below are for illustration purposes only. The drawings are not necessarily to scale, with emphasis generally being placed upon illustrating the principles of the present teachings. The drawings are not intended to limit the scope of the present teachings in any way.

FIG. 1 illustrates a representative bulk-heterojunction (BHJ) organic photovoltaic device (also known as a solar cell) structure, which can incorporate one or more compounds of the present teachings as its photoactive layer (as donor and/or acceptor materials).

DETAILED DESCRIPTION

The present teachings provide polymeric compounds based upon at least one repeating unit that includes an electron-poor polycyclic heteroaryl group that is substituted with one or more electron-withdrawing groups.

Compounds of the present teachings can exhibit semiconductor behavior such as optimized light absorption/charge separation in a photovoltaic device; charge transport/recombination/light emission in a light-emitting device; and/or high carrier mobility and/or good current modulation characteristics in a field-effect device. In addition, the present compounds can possess certain processing advantages such as solution-processability and/or good stability (e.g., air stability) in ambient conditions. The compounds of the present teachings can be used to prepare either p-type (donor or hole-transporting), n-type (acceptor or electron-transporting), or ambipolar semiconductor materials, which in turn can be used to fabricate various organic or hybrid optoelectronic articles, structures and devices, including organic photovoltaic devices and organic light-emitting transistors.

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or the element or component can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material" or a "donor" material refers to a semiconductor material, for example, an organic semiconductor material, having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor also can exhibit a current on/off ratio of greater than about 10.

As used herein, an "n-type semiconductor material" or an "acceptor" material refers to a semiconductor material, for example, an organic semiconductor material, having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor also can exhibit a current on/off ratio of greater than about 10.

As used herein, "mobility" refers to a measure of the velocity with which charge carriers, for example, holes (or units of positive charge) in the case of a p-type semiconductor material and electrons (or units of negative charge) in the case of an n-type semiconductor material, move through the material under the influence of an electric field. This parameter, which depends on the device architecture, can be measured using a field-effect device or space-charge limited current measurements.

As used herein, a compound can be considered "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period.

As used herein, fill factor (FF) is the ratio (given as a percentage) of the actual maximum obtainable power, (P$_m$ or V$_{mp}$*J$_{mp}$), to the theoretical (not actually obtainable) power, (J$_{sc}$*V$_{oc}$). Accordingly, FF can be determined using the equation:

$$FF=(V_{mp}*J_{mp})/(J_{sc}*V_{oc})$$

where J$_{mp}$ and V$_{mp}$ represent the current density and voltage at the maximum power point (P$_m$), respectively, this point being obtained by varying the resistance in the circuit until J*V is at its greatest value; and J$_{sc}$ and V$_{oc}$ represent the short circuit current and the open circuit voltage, respectively. Fill factor is a key parameter in evaluating the performance of solar cells. Commercial solar cells typically have a fill factor of about 0.60% or greater.

As used herein, the open-circuit voltage (V$_{oc}$) is the difference in the electrical potentials between the anode and the cathode of a device when there is no external load connected.

As used herein, the power conversion efficiency (PCE) of a solar cell is the percentage of power converted from absorbed light to electrical energy. The PCE of a solar cell can be calculated by dividing the maximum power point (P$_m$) by the input light irradiance (E, in W/m$^2$) under standard test conditions (STC) and the surface area of the solar cell (A$_c$ in m$^2$). STC typically refers to a temperature of 25° C. and an irradiance of 1000 W/m$^2$ with an air mass 1.5 (AM 1.5) spectrum.

As used herein, a component (such as a thin film layer) can be considered "photoactive" if it contains one or more compounds that can absorb photons to produce excitons for the generation of a photocurrent.

As used herein, "solution-processable" refers to compounds (e.g., polymers), materials, or compositions that can be used in various solution-phase processes including spin-coating, printing (e.g., inkjet printing, gravure printing, offset printing and the like), spray coating, electrospray coating, drop casting, dip coating, and blade coating.

As used herein, a "semicrystalline polymer" refers to a polymer that has an inherent tendency to crystallize at least partially either when cooled from a melted state or deposited from solution, when subjected to kinetically favorable conditions such as slow cooling, or low solvent evaporation rate and so forth. The crystallization or lack thereof can be readily identified by using several analytical methods, for example, differential scanning calorimetry (DSC) and/or X-ray diffraction (XRD).

As used herein, "annealing" refers to a post-deposition heat treatment to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing can result in an increase of crystallinity in the polymer film, where possible, thereby increasing field effect mobility. The increase in crystallinity can be monitored by several methods, for example, by comparing the differential scanning calorimetry (DSC) or X-ray diffraction (XRD) measurements of the as-deposited and the annealed films.

As used herein, a "polymeric compound" (or "polymer") refers to a molecule including a plurality of one or more repeating units connected by covalent chemical bonds. A polymeric compound can be represented by the general formula:

wherein M is the repeating unit or monomer. The polymeric compound can have only one type of repeating unit as well as two or more types of different repeating units. When a polymeric compound has only one type of repeating unit, it can be referred to as a homopolymer. When a polymeric compound has two or more types of different repeating units, the term "copolymer" or "copolymeric compound" can be used instead. For example, a copolymeric compound can include repeating units

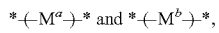

where M$^a$ and M$^b$ represent two different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer. For example, the general formula:

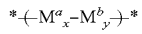

can be used to represent a copolymer of M$^a$ and M$^b$ having x mole fraction of M$^a$ and y mole fraction of M$^b$ in the copolymer, where the manner in which comonomers M$^a$ and M$^b$ is repeated can be alternating, random, regiorandom, regioregular, or in blocks. In addition to its composition, a polymeric compound can be further characterized by its degree of polymerization (n) and molar mass (e.g., number average molecular weight (M$_n$) and/or weight average molecular weight (M$_w$) depending on the measuring technique(s)).

As used herein, "halo" or "halogen" refers to fluoro, chloro, bromo, and iodo.

As used herein, "oxo" refers to a double-bonded oxygen (i.e., =O).

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neo-pentyl), hexyl groups, and the like. In various embodiments, an alkyl group can have 1 to 40 carbon atoms (i.e., $C_{1-40}$ alkyl group), for example, 1-20 carbon atoms (i.e., $C_{1-20}$ alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted as described herein. An alkyl group is generally not substituted with another alkyl group, an alkenyl group, or an alkynyl group.

As used herein, "haloalkyl" refers to an alkyl group having one or more halogen substituents. At various embodiments, a haloalkyl group can have 1 to 40 carbon atoms (i.e., $C_{1-40}$ haloalkyl group), for example, 1 to 20 carbon atoms (i.e., $C_{1-20}$ haloalkyl group). Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups where all of the hydrogen atoms are replaced with halogen atoms (e.g., $CF_3$ and $C_2F_5$), are included within the definition of "haloalkyl." For example, a $C_{1-40}$ haloalkyl group can have the formula —$C_sH_{2s+1-t}X^o_t$, where $X^o$, at each occurrence, is F, Cl, Br or I, s is an integer in the range of 1 to 40, and t is an integer in the range of 1 to 81, provided that t is less than or equal to 2s+1. Haloalkyl groups that are not perhaloalkyl groups can be substituted as described herein.

As used herein, "alkoxy" refers to —O— alkyl group. Examples of alkoxy groups include, but are not limited to, methoxy, ethoxy, propoxy (e.g., n-propoxy and isopropoxy), t-butoxy, pentoxyl, hexoxyl groups, and the like. The alkyl group in the —O— alkyl group can be substituted as described herein.

As used herein, "alkylthio" refers to an —S— alkyl group. Examples of alkylthio groups include, but are not limited to, methylthio, ethylthio, propylthio (e.g., n-propylthio and iso-propylthio), t-butylthio, pentylthio, hexylthio groups, and the like. The alkyl group in the —S— alkyl group can be substituted as described herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 40 carbon atoms (i.e., $C_{2-40}$ alkenyl group), for example, 2 to 20 carbon atoms (i.e., $C_{2-20}$ alkenyl group). In some embodiments, alkenyl groups can be substituted as described herein. An alkenyl group is generally not substituted with another alkenyl group, an alkyl group, or an alkynyl group.

As used herein, "alkynyl" refers to a straight-chain or branched alkyl group having one or more triple carbon-carbon bonds. Examples of alkynyl groups include ethynyl, propynyl, butynyl, pentynyl, hexynyl, and the like. The one or more triple carbon-carbon bonds can be internal (such as in 2-butyne) or terminal (such as in 1-butyne). In various embodiments, an alkynyl group can have 2 to 40 carbon atoms (i.e., $C_{2-40}$ alkynyl group), for example, 2 to 20 carbon atoms (i.e., $C_{2-20}$ alkynyl group). In some embodiments, alkynyl groups can be substituted as described herein. An alkynyl group is generally not substituted with another alkynyl group, an alkyl group, or an alkenyl group.

As used herein, a "cyclic moiety" can include one or more (e.g., 1-6) carbocyclic or heterocyclic rings. The cyclic moiety can be a cycloalkyl group, a heterocycloalkyl group, an aryl group, or a heteroaryl group (i.e., can include only saturated bonds, or can include one or more unsaturated bonds regardless of aromaticity), each including, for example, 3-24 ring atoms and optionally can be substituted as described herein. In embodiments where the cyclic moiety is a "monocyclic moiety," the "monocyclic moiety" can include a 3-14 membered aromatic or non-aromatic, carbocyclic or heterocyclic ring. A monocyclic moiety can include, for example, a phenyl group or a 5- or 6-membered heteroaryl group, each of which optionally can be substituted as described herein. In embodiments where the cyclic moiety is a "polycyclic moiety," the "polycyclic moiety" can include two or more rings fused to each other (i.e., sharing a common bond) and/or connected to each other via a spiro atom, or one or more bridged atoms. A polycyclic moiety can include an 8-24 membered aromatic or non-aromatic, carbocyclic or heterocyclic ring, such as a $C_{8-24}$ aryl group or an 8-24 membered heteroaryl group, each of which optionally can be substituted as described herein.

As used herein, a "fused ring" or a "fused ring moiety" refers to a polycyclic ring system having at least two rings where at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes (or analogs thereof containing one or more heteroatoms) having the formula:

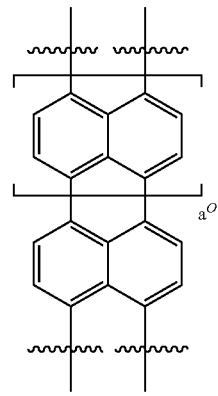

where $a^o$ can be an integer in the range of 0-3; coronenes (or analogs thereof containing one or more heteroatoms) having the formula:

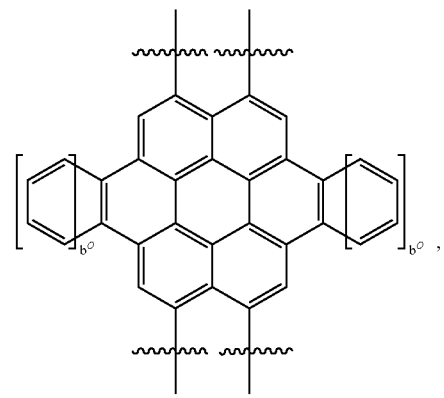

where $b^o$ can be an integer in the range of 0-3; and linear acenes (or analogs thereof containing one or more heteroatoms) having the formula:

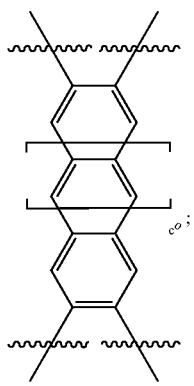

where $c^o$ can be an integer in the range of 0-4. The fused ring moiety can be optionally substituted as described herein.

As used herein, "cycloalkyl" refers to a non-aromatic carbocyclic group including cyclized alkyl, alkenyl, and alkynyl groups. In various embodiments, a cycloalkyl group can have 3 to 24 carbon atoms, for example, 3 to 20 carbon atoms (e.g., $C_{3-14}$ cycloalkyl group). A cycloalkyl group can be monocyclic (e.g., cyclohexyl) or polycyclic (e.g., containing fused, bridged, and/or spiro ring systems), where the carbon atoms are located inside or outside of the ring system. Any suitable ring position of the cycloalkyl group can be covalently linked to the defined chemical structure. Examples of cycloalkyl groups include cyclopropyl, cyclobutyl, cyclopentyl, cyclohexyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as described herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, S, Se, N, P, and Si (e.g., O, S, and N), and optionally contains one or more double or triple bonds. A cycloheteroalkyl group can have 3 to 24 ring atoms, for example, 3 to 20 ring atoms (e.g., 3-14 membered cycloheteroalkyl group). One or more N, P, S, or Se atoms (e.g., N or S) in a cycloheteroalkyl ring may be oxidized (e.g., morpholine N-oxide, thiomorpholine S-oxide, thiomorpholine S,S-dioxide). In some embodiments, nitrogen or phosphorus atoms of cycloheteroalkyl groups can bear a substituent, for example, a hydrogen atom, an alkyl group, or other substituents as described herein. Cycloheteroalkyl groups can also contain one or more oxo groups, such as oxopiperidyl, oxooxazolidyl, dioxo-(1H,3H)-pyrimidyl, oxo-2(1H)-pyridyl, and the like. Examples of cycloheteroalkyl groups include, among others, morpholinyl, thiomorpholinyl, pyranyl, imidazolidinyl, imidazolinyl, oxazolidinyl, pyrazolidinyl, pyrazolinyl, pyrrolidinyl, pyrrolinyl, tetrahydrofuranyl, tetrahydrothiophenyl, piperidinyl, piperazinyl, and the like. In some embodiments, cycloheteroalkyl groups can be substituted as described herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have 6 to 24 carbon atoms in its ring system (e.g., $C_{6-20}$ aryl group), which can include multiple fused rings. In some embodiments, a polycyclic aryl group can have 8 to 24 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), pentacenyl (pentacyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as described herein. In some embodiments, an aryl group can have one or more halogen substituents, and can be referred to as a "haloaryl" group. Perhaloaryl groups, i.e., aryl groups where all of the hydrogen atoms are replaced with halogen atoms (e.g., $-C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "arylalkyl" refers to an -alkyl-aryl group, where the arylalkyl group is covalently linked to the defined chemical structure via the alkyl group. An arylalkyl group is within the definition of a $-Y-C_{6-14}$ aryl group, where Y is as defined herein. An example of an arylalkyl group is a benzyl group ($-CH_2-C_6H_5$). An arylalkyl group can be optionally substituted, i.e., the aryl group and/or the alkyl group, can be substituted as disclosed herein.

As used herein, "heteroaryl" refers to an aromatic monocyclic ring system containing at least one ring heteroatom selected from oxygen (O), nitrogen (N), sulfur (S), silicon (Si), and selenium (Se) or a polycyclic ring system where at least one of the rings present in the ring system is aromatic and contains at least one ring heteroatom. Polycyclic heteroaryl groups include those having two or more heteroaryl rings fused together, as well as those having at least one monocyclic heteroaryl ring fused to one or more aromatic carbocyclic rings, non-aromatic carbocyclic rings, and/or non-aromatic cycloheteroalkyl rings. A heteroaryl group, as a whole, can have, for example, 5 to 24 ring atoms and contain 1-5 ring heteroatoms (i.e., 5-20 membered heteroaryl group). The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5- or 6-membered monocyclic and 5-6 bicyclic ring systems shown below:

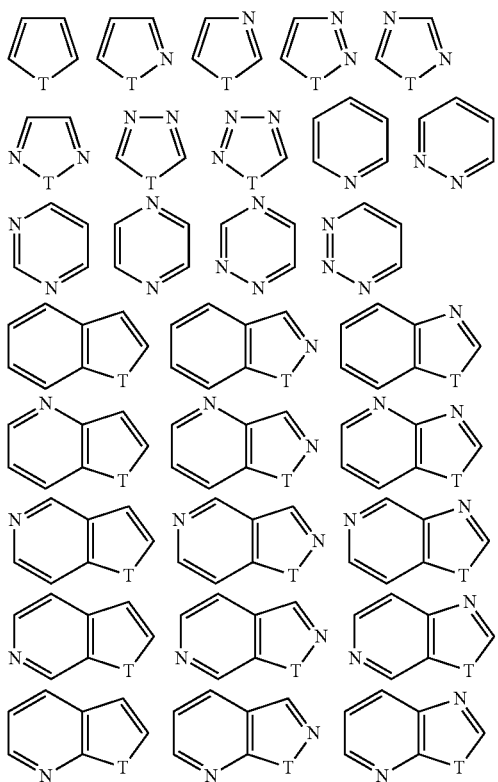

where T is O, S, NH, N-alkyl, N-aryl, N-(arylalkyl) (e.g., N-benzyl), $SiH_2$, SiH(alkyl), Si(alkyl)$_2$, SiH(arylalkyl), Si(arylalkyl)$_2$, or Si(alkyl)(arylalkyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as described herein.

Compounds of the present teachings can include a "divalent group" defined herein as a linking group capable of forming a covalent bond with two other moieties. For example, compounds of the present teachings can include a divalent $C_{1-20}$ alkyl group (e.g., a methylene group), a divalent $C_{2-20}$ alkenyl group (e.g., a vinylyl group), a divalent $C_{2-20}$ alkynyl group (e.g., an ethynylyl group). a divalent $C_{6-14}$ aryl group (e.g., a phenylyl group); a divalent 3-14 membered cycloheteroalkyl group (e.g., a pyrrolidylyl), and/or a divalent 5-14 membered heteroaryl group (e.g., a thienylyl group). Generally, a chemical group (e.g., -Ar-) is understood to be divalent by the inclusion of the two bonds before and after the group.

The electron-donating or electron-withdrawing properties of several hundred of the most common substituents, reflecting all common classes of substituents have been determined, quantified, and published. The most common quantification of electron-donating and electron-withdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electron-acceptor" refers to a functional group that draws electrons to itself more than a hydrogen atom would if it occupied the same position in a molecule. Examples of electron-withdrawing groups include, but are not limited to, halogen or halo (e.g., F, Cl, Br, I), —$NO_2$, —CN, —NC, —$S(R^o)_2{}^+$, —$N(R^o)_3{}^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, —$CON(R^o)_2$, $C_{1-40}$ haloalkyl groups, $C_{6-14}$ aryl groups, and 5-14 membered electron-poor heteroaryl groups; where $R^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electron-withdrawing groups such as F, Cl, Br, —$NO_2$, —CN, —NC, —$S(R^o)_2{}^+$, —$N(R^o)_3{}^+$, —$SO_3H$, —$SO_2R^o$, —$SO_3R^o$, —$SO_2NHR^o$, —$SO_2N(R^o)_2$, —COOH, —$COR^o$, —$COOR^o$, —$CONHR^o$, —$CON(R^o)_2$.

It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —$OR^o$, —$NH_2$, —$NHR^o$, —$N(R^o)_2$, and 5-14 membered electron-rich heteroaryl groups, where $R^o$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine.

Mixed heteroaromatic rings can belong to either class depending on the type, number, and position of the one or more heteroatom(s) in the ring. See Katritzky, A. R and Lagowski, J. M., Heterocyclic Chemistry (John Wiley & Sons, New York, 1960).

At various places in the present specification, substituents are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Compounds described herein can contain an asymmetric atom (also referred as a chiral center) and some of the compounds can contain two or more asymmetric atoms or centers, which can thus give rise to optical isomers (enantiomers) and geometric isomers (diastereomers). The present teachings include such optical and geometric isomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of compounds containing alkenyl moieties (e.g., alkenes, azo, and imines). It also should be understood that the compounds of the present teachings encompass all possible regioisomers in pure form and mixtures thereof. In some embodiments, the preparation of the present compounds can include separating such isomers using standard separation procedures known to those skilled in the art, for example, by using one or more of column chromatography, thin-layer chromatography, simulated moving-bed chromatography, and high-performance liquid chromatography. However, mixtures of regioisomers can be used similarly to the uses of each individual regioisomer of the present teachings as described herein and/or known by a skilled artisan.

It is specifically contemplated that the depiction of one regioisomer includes any other regioisomers and any regioisomeric mixtures unless specifically stated otherwise.

As used herein, a "leaving group" ("LG") refers to a charged or uncharged atom (or group of atoms) that can be displaced as a stable species as a result of, for example, a substitution or elimination reaction. Examples of leaving groups include, but are not limited to, halogen (e.g., Cl, Br, I), azide ($N_3$), thiocyanate (SCN), nitro ($NO_2$), cyanate (CN), water ($H_2O$), ammonia ($NH_3$), and sulfonate groups (e.g., $OSO_2$—R, wherein R can be a $C_{1-10}$ alkyl group or a $C_{6-14}$ aryl group each optionally substituted with 1-4 groups independently selected from a $C_{1-10}$ alkyl group and an electron-withdrawing group) such as tosylate (toluenesulfonate, OTs), mesylate (methanesulfonate, OMs), brosylate (p-bromobenzenesulfonate, OBs), nosylate (4-nitrobenzenesulfonate, ONs), and triflate (trifluoromethanesulfonate, OTf).

Throughout the specification, structures may or may not be presented with chemical names. Where any question arises as to nomenclature, the structure prevails.

The present teachings relate to polymeric compounds that can be used as organic semiconductor materials. The present compounds can have good solubility in various common solvents and good stability in air. When incorporated into optical or optoelectronic devices including, but not limited to, photovoltaic or solar cells, light emitting diodes, and light emitting transistors, the present compounds can confer various desirable performance properties. For example, when the present compounds are used in a photoactive layer of a solar cell (e.g., bulk heterojunction devices), the solar cell can exhibit very high power conversion efficiency (e.g., about 3.0% or greater).

The present teachings provide polymeric compounds based upon at least one repeating unit that includes an electron-poor polycyclic heteroaryl group that is substituted with one or more electron-withdrawing groups, thereby providing a strong acceptor moiety. For example, the electron-poor polycyclic heteroaryl group can be a bicyclic heteroaryl group that includes one or more nitrogen atoms. In some embodiments, the electron-poor polycyclic heteroaryl group can be a benzo-fused bicyclic heteroaryl group that includes one or more nitrogen atoms. In other embodiments, the electron-poor polycyclic heteroaryl group can be a pyrido-fused bicyclic heteroaryl group that includes two or more nitrogen atoms. Examples of electron-withdrawing groups include F, Cl, CN, an acyl group, and a haloalkyl group. To illustrate, various embodiments of the present polymers can be based upon at least one repeating unit that includes a benzo[c][1,2,5]thiadiazole (2,1,3-benzothiadiazole) or a thiadiazolo[3,4-c]pyridine, i.e.,

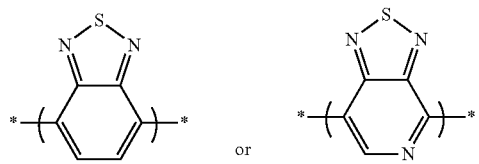

which can be mono- or bis-substituted with electron-withdrawing groups such as F, Cl, CN, an acyl group, a haloalkyl group, or a combination thereof.

Accordingly, in various embodiments, the present polymeric compounds generally can be represented by the formula:

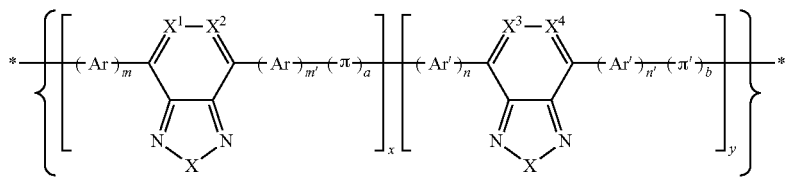

wherein:
Ar and Ar' are identical or different optionally substituted 5-8 membered heteroaryl groups;
π and π' are identical or different optionally substituted 11-24 membered polycyclic aryl or heteroaryl groups;
$X^1$ is $CR^1$;
$X^2$ is N or $CR^2$;
$X^3$ is N or $CR^3$;
$X^4$ is N or $CR^4$;
$R^1$, $R^2$, $R^3$ and $R^4$ independently are selected from H, F, Cl, —C(O)$R^5$, CN, $R^5$, O$R^5$, and S$R^5$, wherein $R^5$, at each occurrence, independently is selected from a $C_{1-20}$ alkyl group, and a $C_{1-20}$ haloalkyl group, provided that at least one of $R^1$ and $R^2$ is selected from F, Cl, —C(O)$R^5$, —CF$_2R^5$, and CN;
X is O, S, or N$R^6$, wherein $R^6$ is selected from H and a $C_{1-20}$ alkyl group;
a and b are 0 or 1;
m, m', n and n' are 0, 1, or 2; and
x and y are real numbers representing mole fractions, wherein $0.05 \leq x \leq 0.95$, $0.05 \leq y \leq 0.95$, and the sum of x and y is about 1.

The present polymeric compounds generally can have a molecular weight in the range of about 3,000 to about 300,000. In some embodiments, the present compounds can be represented the formula:

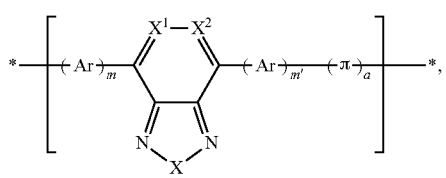

that is, when Ar is identical to Ar', π is identical to π'; $X^1$ is identical to $X^3$; $X^2$ is identical to $X^4$; m is identical to n; m' is identical to n; and a is identical to b. In other embodiments, the first unit and the second unit

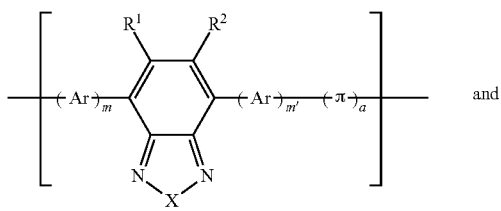

and

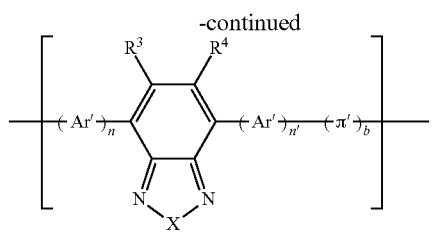

are different from each other in one or more ways. For example, the type of cyclic moieties, the number of cyclic moieties, and/or the substitution of at least one of the cyclic moieties can be different. Embodiments of the present compounds including different first unit and second unit can have the two units repeated in a random or alternating manner. In most embodiments of the present polymers, the first unit and the second unit independently can include at least one of Ar/Ar' and π/π', i.e., at least one of m, m', and a is 1, and at least one of n, n', and b is 1. In certain embodiments, at least one of the first unit and the second unit includes an optionally substituted polycyclic aryl or heteroaryl group (π/π').

In some embodiments, the present compounds can be represented by formula (I):

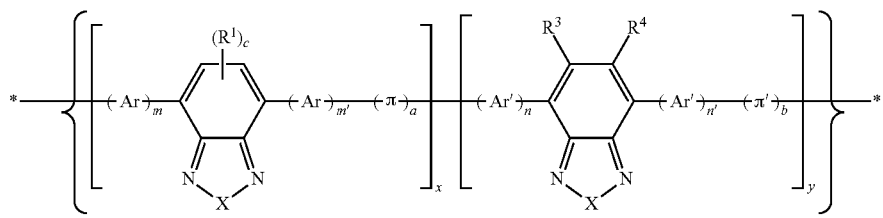

(I)

wherein:
Ar and Ar' are identical or different optionally substituted 5-8 membered heteroaryl groups;
π and π' are identical or different optionally substituted 11-24 membered polycyclic aryl or heteroaryl groups;
$R^1$ is selected from F, Cl, —C(O)$R^5$, —CF$_2R^5$, and CN;
$R^3$ and $R^4$ independently are selected from H, F, Cl, —C(O)$R^5$, CN, $R^5$, O$R^5$, and S$R^5$, wherein
$R^5$, at each occurrence, independently is selected from a $C_{1-20}$ alkyl group and a $C_{1-20}$ haloalkyl group;
X is O, S, or N$R^6$, wherein $R^6$ is selected from H and a $C_{1-20}$ alkyl group;
a and b independently are 0 or 1;
c is 1 or 2;
m and m' are 0, 1, or 2;
n and n' are 0, 1, or 2, provided that m and m' are 1 and/or n and n' are 1, and/or at least one of a and b is 1; and
x and y are real numbers representing mole fractions, wherein $0.05 \leq x \leq 0.95$, $0.05 \leq y \leq 0.95$, and the sum of x and y is about 1.

In certain embodiments, X can be S or O. Accordingly, these embodiments can be represented by formula (II) or (III):

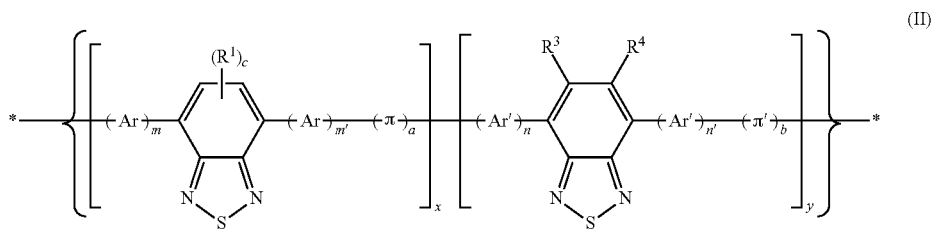

(II)

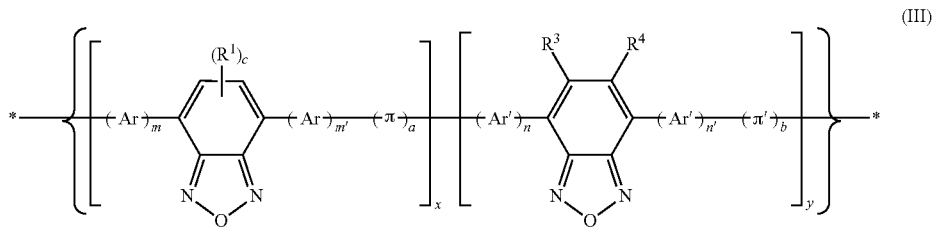

(III)

where Ar, Ar', π, π', $R^1$, $R^3$, $R^4$, m, m', n, n', a, b, c, x and y are as defined herein.

In certain embodiments, $R^1$, $R^2$, $R^3$, and $R^4$ can be identical, and each of $R^1$, $R^2$, $R^3$, and $R^4$ can be an electron-withdrawing group selected from F, Cl, CN, a —C(O)—$C_{1-10}$ alkyl group, a —$CF_2$—$C_{1-10}$ alkyl group, and a —$CF_2$—$C_{1-10}$ haloalkyl group. For example, certain embodiments of the present compounds can be represented by formula (IVa), (IVb), or (IVc:

wherein Ar, Ar', π, π', m, m', n, n', a, b, x and y are as defined herein.

In some embodiments, $R^1$ and $R^2$ can be identical, $R^3$ and $R^4$ can be identical, but $R^1/R^2$ is different from $R^3/R^4$. For example, each of $R^1$ and $R^2$ can be an electron-withdrawing group selected from F, Cl, CN, a —C(O)—$C_{1-10}$ alkyl group, a —$CF_2$—$C_{1-10}$ alkyl group, and a —$CF_2$—$C_{1-10}$ haloalkyl group; while $R^3$ and $R^4$ can be H. Alternatively, $R^1/R^2$ and $R^3/R^4$ can be different electron-withdrawing groups. Accordingly, for example, certain embodiments of the present compounds can be represented by formula (IVd), (IVe), or (IVf):

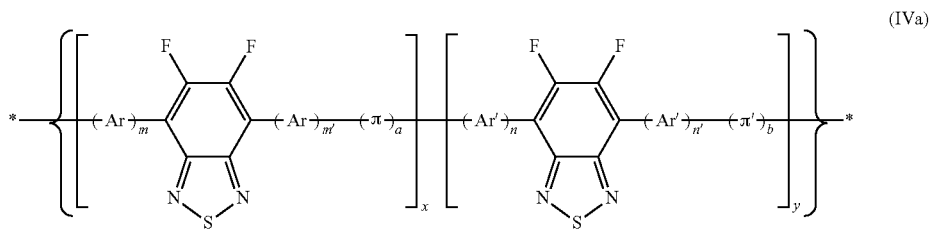

(IVa)

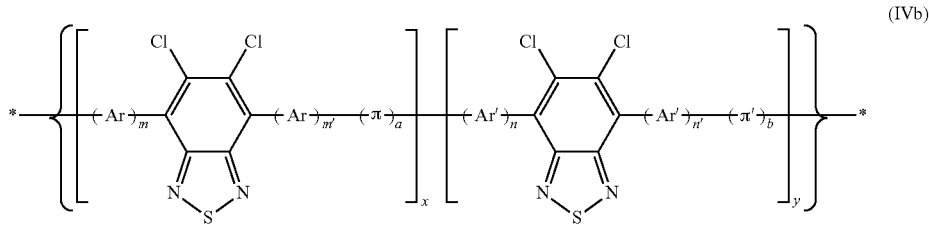

(IVb)

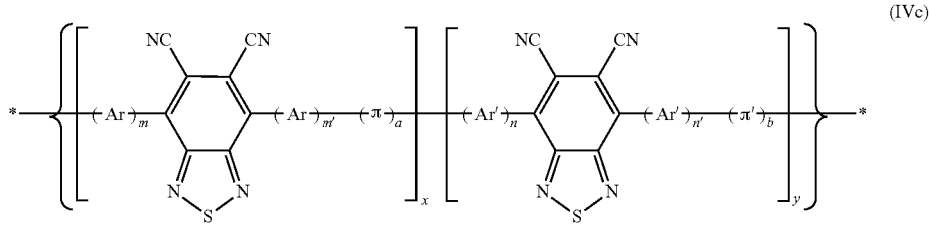

(IVc)

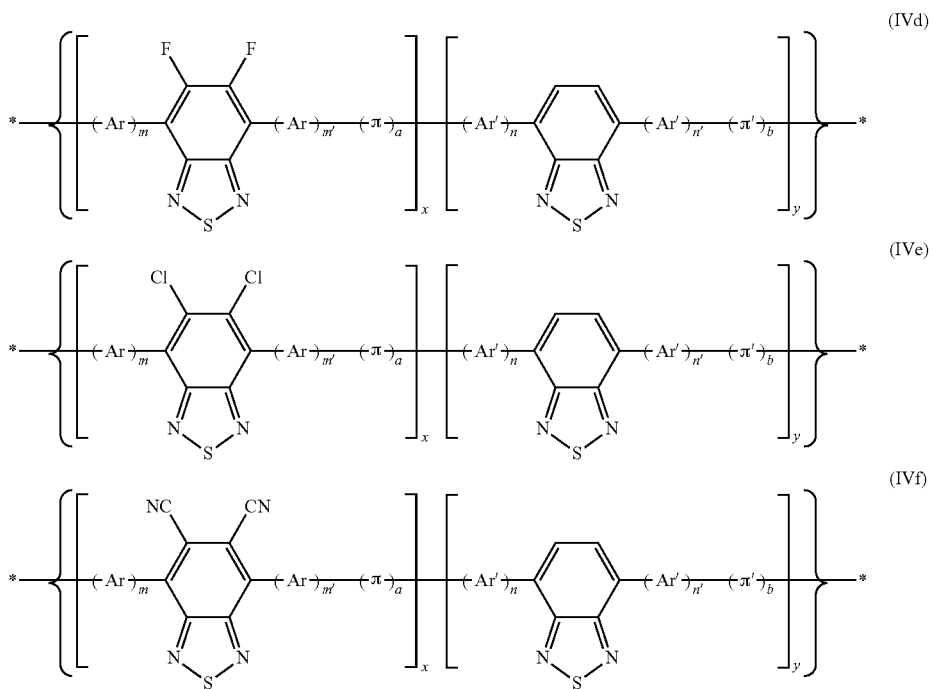
(IVd)
(IVe)
(IVf)
wherein Ar, Ar', π, π', m, m', n, n', a, b, x and y are as defined herein.
In some embodiments, the electron-poor bicyclic heteroaryl group can be monosubstituted. For example, certain embodiments of the present compounds can be represented by formula (Va), (Vb), (Vc), (Vd), (Ve) or (Vf):
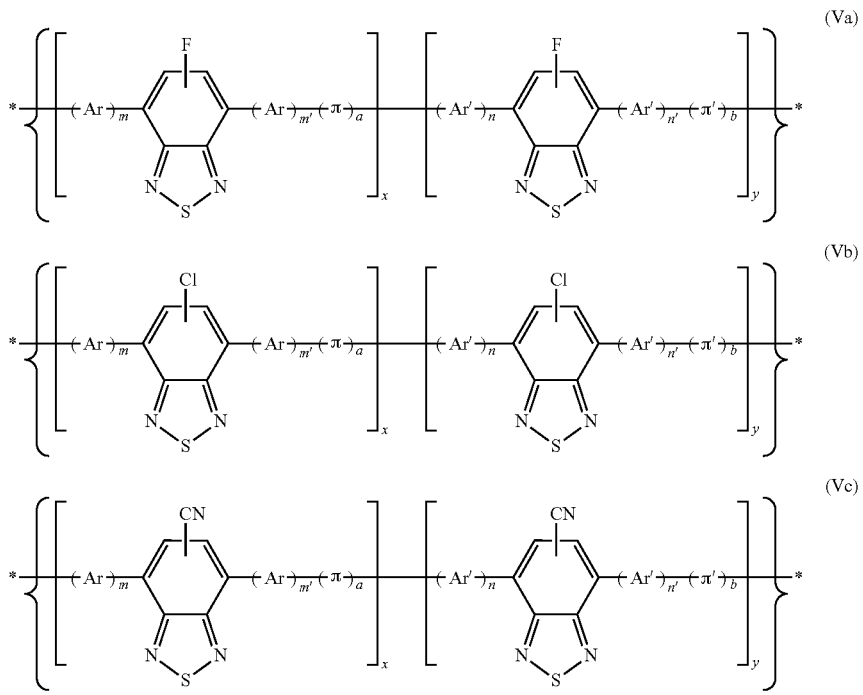
(Va)
(Vb)
(Vc)

-continued

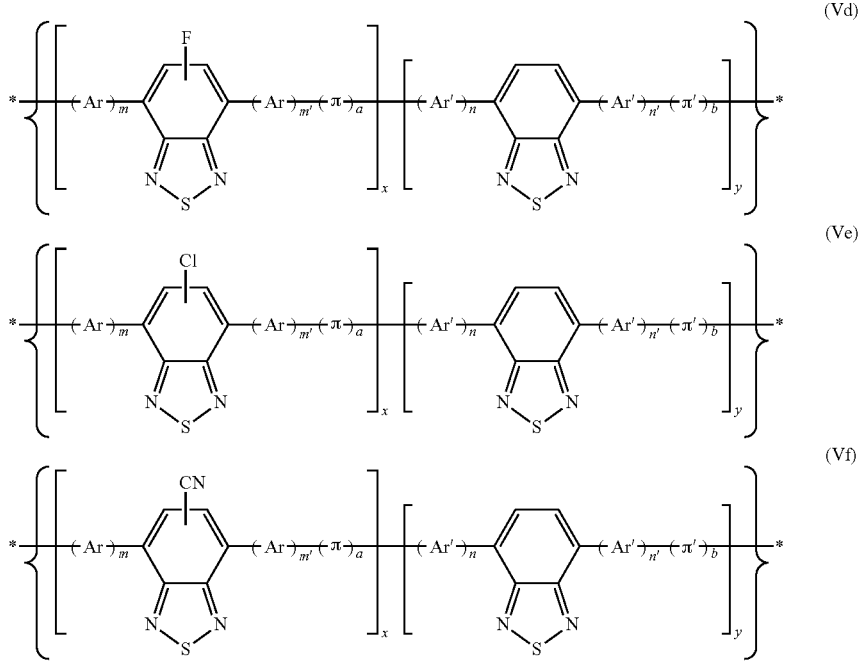

where Ar, Ar', π, π', m, m', n, n', a, b, x and y are as defined herein.

In some embodiments, both the first unit and the second unit can include a polycyclic group. Accordingly, certain embodiments of the present compounds can be represented by formula (VI):

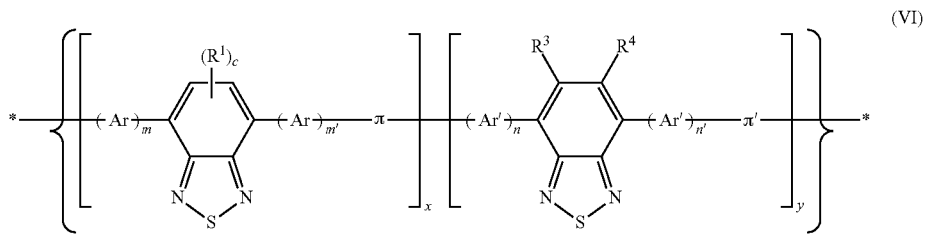

where Ar, Ar', π, π', $R^1$, $R^3$, $R^4$, c, m, m', n, n', x and y are as defined herein, provided that the first unit and the second unit are different in one or more ways. For example, Ar can be absent in the first unit, in which case, the compound can be represented by formula (VIa):

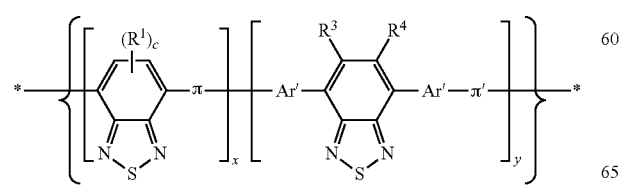

where Ar', π, π', $R^1$, $R^3$, $R^4$, c, x and y are as defined herein. In certain embodiments, the substitution of the 2,1,3-benzothiadiazole units can be different. For example, certain compounds of the present teachings can be represented by formula (VIb):

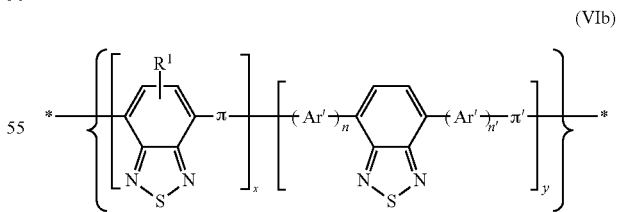

wherein Ar', π, π', $R^1$, c, n, n', x and y are as defined herein. In the embodiments represented by any one of formulae (VI), (VIa), and (VIb), π and π' can be identical or different, and $R^1$ can be F or Cl. Accordingly, certain embodiments can be represented by formula (VIc):

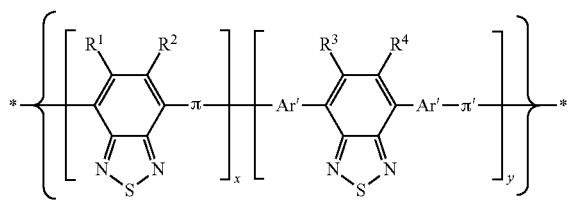

(VIc)

where $R^1$ and $R^2$ are selected from F and Cl, and Ar', $\pi$, $\pi'$, $R^3$, $R^4$, x and y are as defined herein. In some embodiments, the first and second unit can be different by the polycyclic moieties ($\pi$ and $\pi'$) only. For example, certain compounds of such embodiments can be represented by formula (VId):

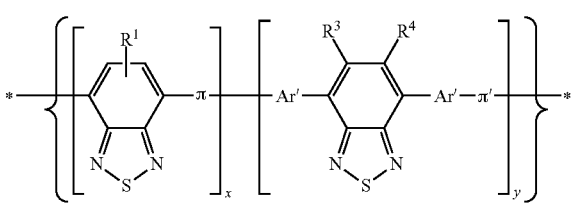

(VId)

wherein $R^1$ can be selected from F and Cl; $\pi$ and $\pi'$ are different optionally substituted 11-24 membered polycyclic heteroaryl groups; and Ar', $R^3$, $R^4$, x and y are as defined herein.

In various embodiments, $\pi$ and $\pi'$ are optionally substituted 11-24 membered polycyclic heteroaryl groups having the formula:

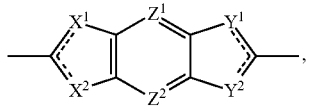

wherein:
$X^1$ and $X^2$ independently are selected from S, O, $NR^7$, CH=CH, and $CR^8$, provided that one of $X^1$ and $X^2$ is selected from S, O, CH=CH, and $NR^7$, and the other $X^1$ and $X^2$ is $CR^8$;
$Y^1$ and $Y^2$ independently are selected from S, O, $NR^7$, CH=CH, and $CR^8$, provided that one of $Y^1$ and $Y^2$ is selected from S, O, CH=CH, and $NR^7$, and the other $Y^1$ and $Y^2$ is $CR^8$;
$Z^1$ and $Z^2$ independently are selected from $CR^9$, $SiR^{10}R^{11}$, $NR^{12}$, and a covalent bond, provided that at least one of $Z^1$ and $Z^2$ is $CR^9$, $SiR^{10}R^{11}$, or $NR^{12}$;
$R^7$, at each occurrence, independently is selected from H and a $C_{1-20}$ alkyl group;
$R^8$ and $R^9$ independently are H, $R^{12}$, $OR^{12}$, $SR^{12}$, or -Het-$R^{12}$, wherein -Het- is a divalent 5-8 membered aryl or heteroaryl group;

$R^{10}$ and $R^{11}$ independently are selected from a $C_{1-20}$ alkyl group, a $C_{1-20}$ alkenyl group, and a $C_{1-20}$ haloalkyl group; and $R^{12}$, at each occurrence, independently is selected from a $C_{1-20}$ alkyl group, a $C_{1-20}$ alkenyl group, and a $C_{1-20}$ haloalkyl group.

In certain embodiments, $\pi$ and $\pi'$ independently can be a polycyclic heteroaryl group selected from a benzodithiophenyl group, a silylene-bithiophenyl group, a carbazolyl group, and a dibenzosilole group, each of which can be optionally substituted as described herein. For example, the benzodithiophenyl group, the silylene-bithiophenyl group, the carbazolyl group, and the dibenzosilole group can be substituted with one, two, three or four solubilizing groups. Each solubilizing group can be a linear or branched aliphatic group (e.g., an alkyl group, an alkenyl group, an alkoxy group, or an alkylthio group) having 6-20 carbon atoms. In particular embodiments, each solubilizing group can be a branched $C_{6-20}$ alkyl group or a branch $C_{6-20}$ alkoxy group.

Accordingly, in certain embodiments, $\pi$ and $\pi'$ independently can be selected from:

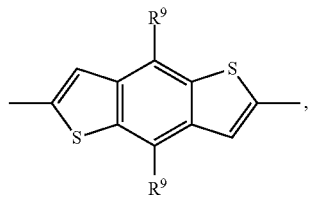

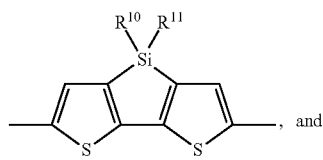

, and

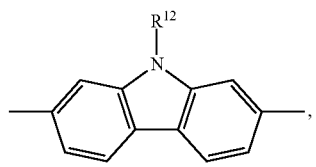

, where $R^9$ can be selected from a $C_{6-20}$ alkyl group, a —O—$C_{6-20}$ alkyl group, a —O—$C_{6-20}$ alkenyl group, a —O—$C_{6-20}$ haloalkyl group, a —S—$C_{6-20}$ alkyl group, a —S—$C_{6-20}$ alkenyl group, a —S—$C_{6-20}$ haloalkyl group, a -thienyl-$C_{6-20}$ alkyl group, a -thienyl-$C_{6-20}$ alkenyl group, and a -thienyl-$C_{6-20}$ haloalkyl group; and each of $R^{10}$, $R^{11}$, and $R^{12}$ independently can be selected from a $C_{6-20}$ alkyl group, a $C_{6-20}$ alkenyl group, and a $C_{6-20}$ haloalkyl group.

In various embodiments, Ar and Ar' can be identical or different optionally substituted phenyl or thienyl groups. For example, certain compounds according to the present teachings can be represented by formula (VII):

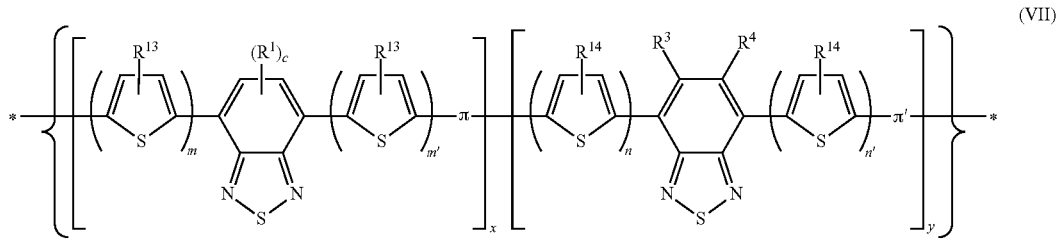

wherein:
$R^{13}$ and $R^{14}$ independently are selected from H, $R^{15}$, $OR^{15}$, and $SR^{15}$, wherein $R^{15}$, at each occurrence, independently is selected from a $C_{1-20}$ alkyl group, a $C_{1-20}$ alkenyl group, and a $C_{1-20}$ haloalkyl group; and
$\pi$, $\pi'$, $R^1$, $R^3$, $R^4$, c, m, m', n, n', x and y are as defined herein.

In the embodiments represented by formula (VII), $R^{13}$ and $R^{14}$ can be different. In particular, one of $R^{13}$ and $R^{14}$ can be H, while the other of $R^{13}$ and $R^{14}$ can be selected from a $C_{1-20}$ alkyl group, a $C_{1-20}$ alkoxy group, and a $C_{1-20}$ alkylthio group. Accordingly, certain compounds according to such embodiments can be represented by formula (VIIa):

wherein:

$R^{13}$ and $R^{14}$ can be the same and can be selected from $R^{15}$, $OR^{15}$, and $SR^{15}$, wherein $R^{15}$ is a $C_{1-20}$ alkyl group; and $\pi$, $\pi'$, $R^1$, c, x and y are as defined herein.

In some embodiments, only one of the first unit and the second unit includes optionally substituted thienyl groups. For example, certain compounds can be represented by formula (VIIc):

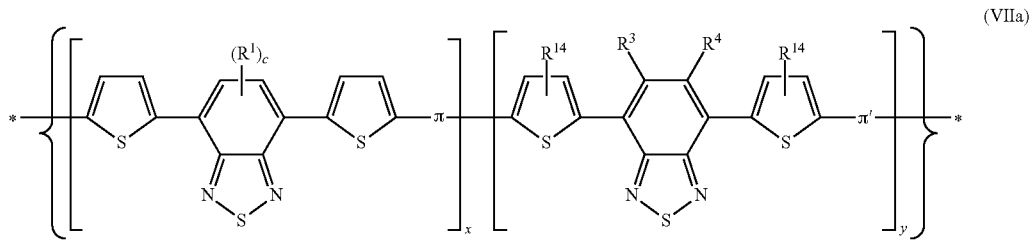

wherein $R^{14}$ can be selected from $R^{15}$, $OR^{15}$, and $SR^{15}$, wherein $R^{15}$ is a $C_{1-20}$ alkyl group; and $\pi$, $\pi'$, $R^1$, $R^2$, $R^3$, $R^4$, $R^5$, x and y are as defined herein. In some embodiments, $R^1$ can be selected from F and Cl. In certain embodiments $R^3$ and $R^4$ can be the same as $R^1$. In alternative embodiments, $R^3$ and $R^4$ can be H.

In some embodiments, both Ar and Ar' can be identically substituted thienyl groups, and the first unit and the second unit can differ from each other based on differences between $R^1$ and $R^3$ and $R^4$. Accordingly, certain compounds of the present teachings can be represented by formula (VIIb):

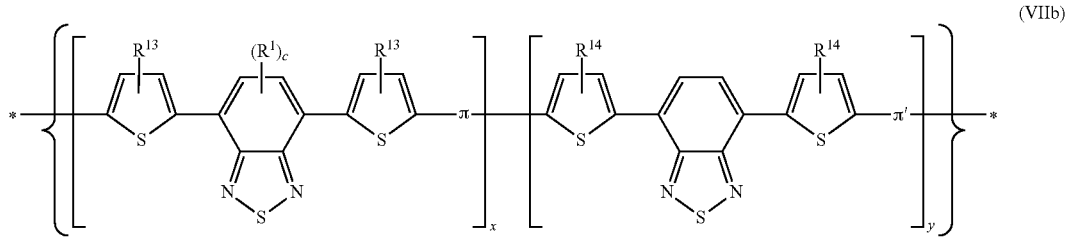

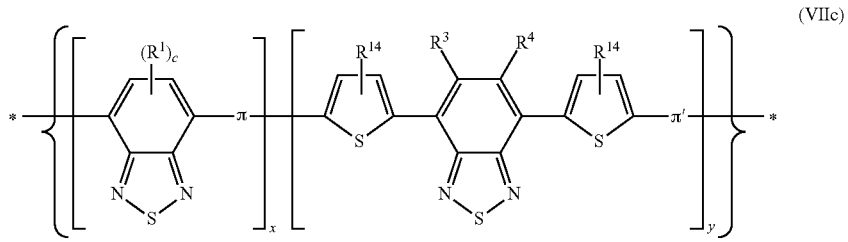

(VIIc)

where $R^{14}$ can be selected from $R^{15}$, $OR^{15}$, and $SR^{15}$, wherein $R^{15}$ is a $C_{1-20}$ alkyl group; and $\pi$, $\pi'$, $R^1$, $R^3$, $R^4$, c, x and y are as defined herein. In some embodiments, $R^3$ and $R^4$ can be the same as $R^1$. In other embodiments, $R^3$ and $R^4$ can be H.

In some embodiments, $\pi$ and $\pi'$ can be a polycyclic moiety as described herein substituted with one or more solubilizing groups. To illustrate, certain compounds according to the present teachings can be represented by formula (VIIIa), (VIIIb), or (VIIIc):

$R^{13}$ and $R^{14}$ independently are selected from H, $R^{15}$, $OR^{15}$, and $SR^{15}$;

$R^{15}$, at each occurrence, independently is selected from a $C_{1-20}$ alkyl group, a $C_{1-20}$ alkenyl group, and a $C_{1-20}$ haloalkyl group; and $R^3$, $R^4$, m, m', n, n', x and y are as defined herein.

For example, in formula VIIIa, one of $R^8$ and $R^9$ can be a branched $C_{6-20}$ alkoxy group, and the other of $R^8$ and $R^9$ can be H. In formula VIIIb, $R^{10}$ and $R^{11}$ independently can be a

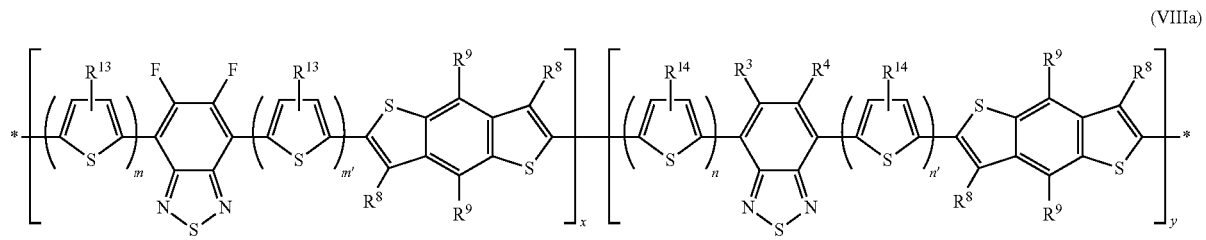

(VIIIa)

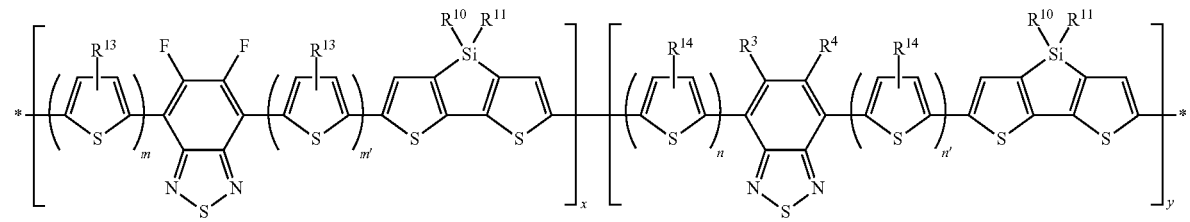

(VIIIb)

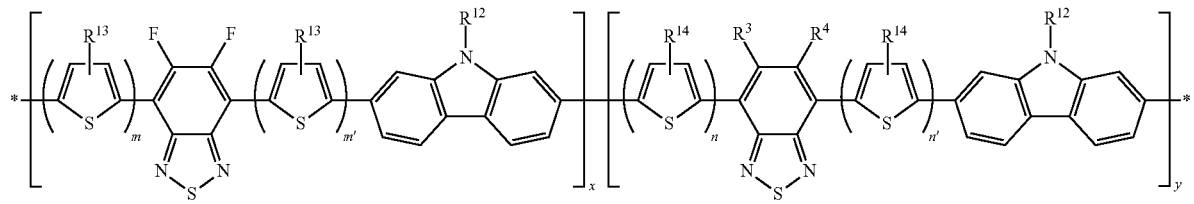

(VIIIc)

wherein:
$R^8$ and $R^9$ independently are H, $R^{15}$, $OR^{15}$, $SR^{15}$ or -Het-$R^{15}$, wherein -Het- is a divalent 5-8 membered aryl or heteroaryl group, provided that at least one of $R^8$ and $R^9$ is not H;

$R^{10}$ and $R^{11}$ independently are selected from a $C_{1-20}$ alkyl group, a $C_{1-20}$ alkenyl group, and a $C_{1-20}$ haloalkyl group;

$R^{12}$, at each occurrence, independently is selected from a $C_{1-20}$ alkyl group, a $C_{1-20}$ alkenyl group, and a $C_{1-20}$ haloalkyl group;

branched $C_{6-20}$ alkyl group, and in formula VIIIc, $R^{12}$ can be a branched $C_{6-20}$ alkyl group. The first unit and the second unit can be different in one of the following ways. In some embodiments, the optionally substituted thienyl groups can be present in only the first unit but not the second unit (i.e., m and m' are 0, and n and n' are 1). In some embodiments, both units can include optionally substituted thienyl groups, as represented by formula (IX):

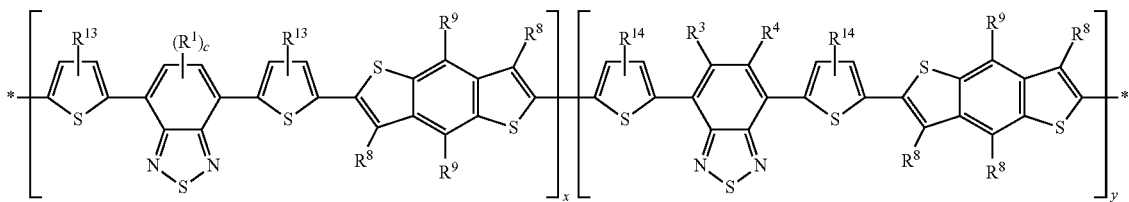

(IX)

where $R^1$, $R^3$, $R^4$, $R^8$, $R^9$, $R^{13}$, $R^{14}$, c, x and y are as defined in herein. In these embodiments, both Ar and Ar' can be identically substituted thienyl groups (i.e., $R^{13}$ and $R^{14}$ are the same), but $R^3$ and $R^4$ can be H. In some embodiments, $R^3$ and $R^4$ can be identical to $R^1$ (e.g., F or Cl). In these embodiments, Ar and Ar' can be differently substituted thienyl groups (e.g., $R^{14}$ can be a $C_{6-20}$ alkyl group and $R^{13}$ can be H).

In any of the formulae provided herein, the first unit and the second unit can be different, and the two units can be repeated in a random manner. The mole fraction of the two units can be between about 0.05 and about 0.95, for example, between about 0.1 and about 0.9, between about 0.2 and about 0.8, between about 0.3 and about 0.7, or between about 0.4 and about 0.6. In certain embodiments, the present polymers can include the same mole fraction of the first unit as the second unit (i.e., x=y=0.5).

Exemplary polymers according to the present teachings include:

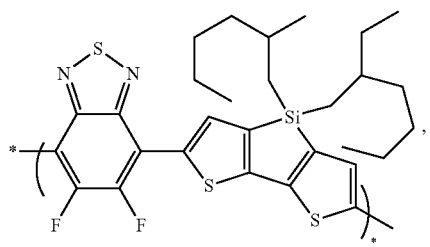

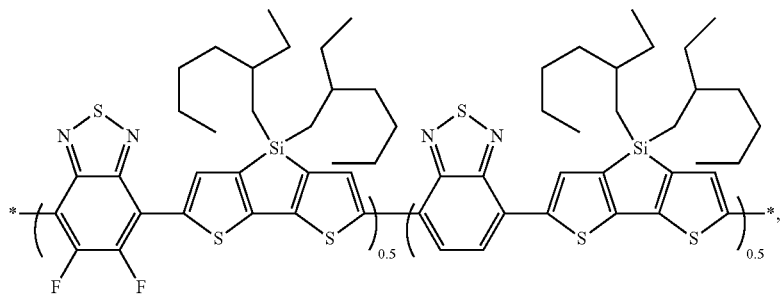

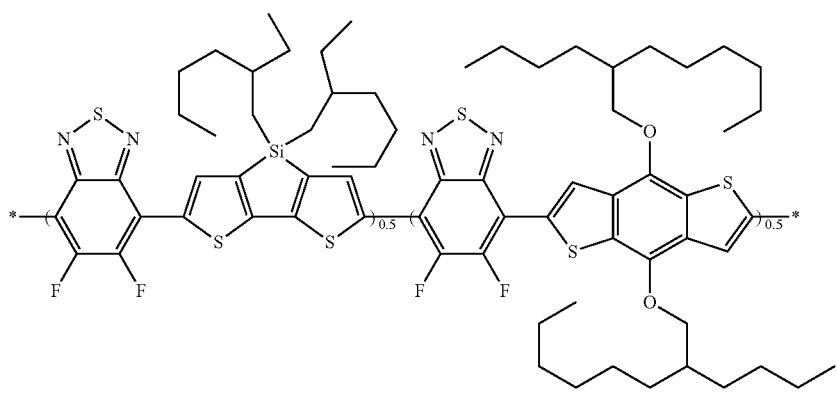

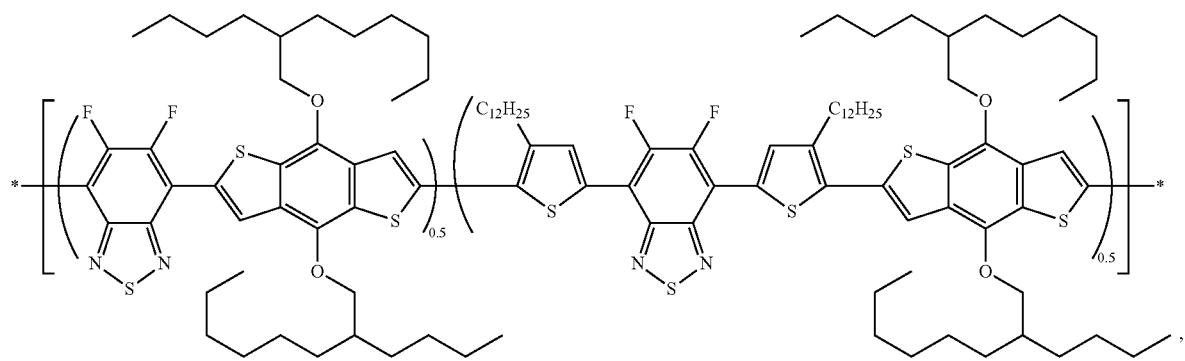
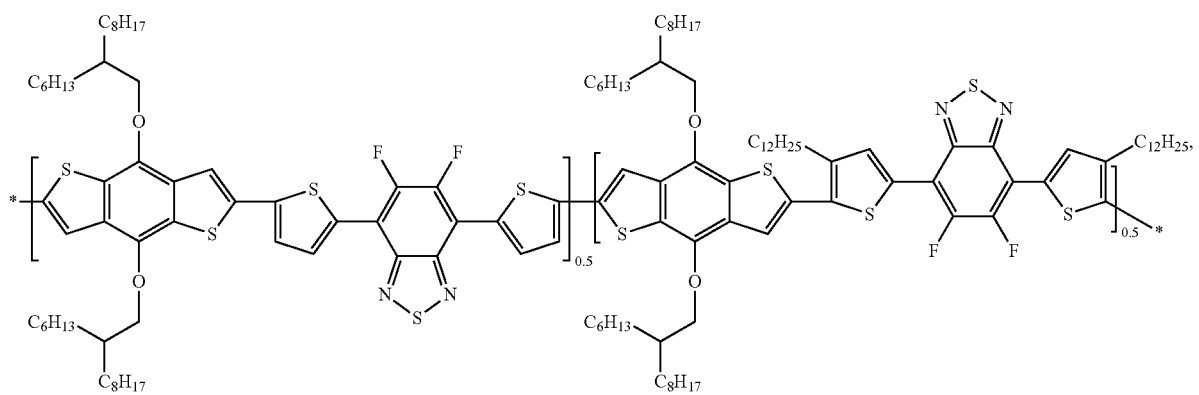
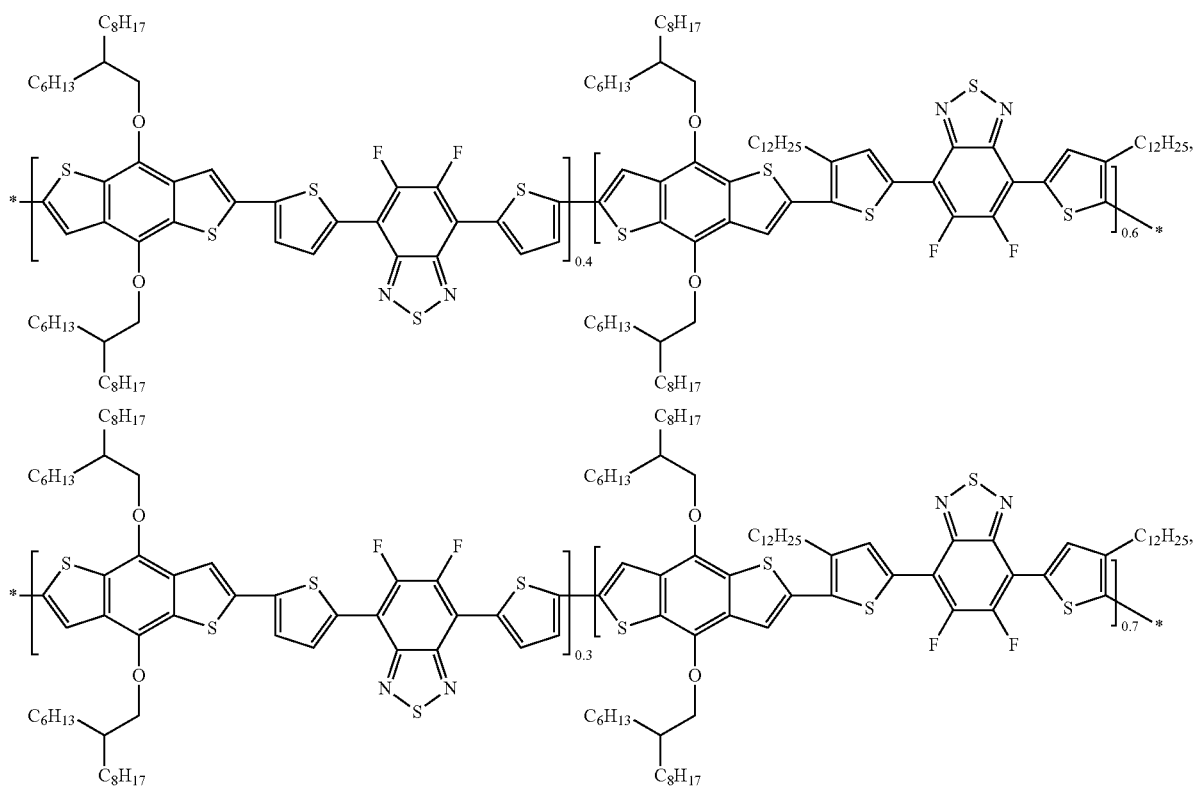

31
32
-continued
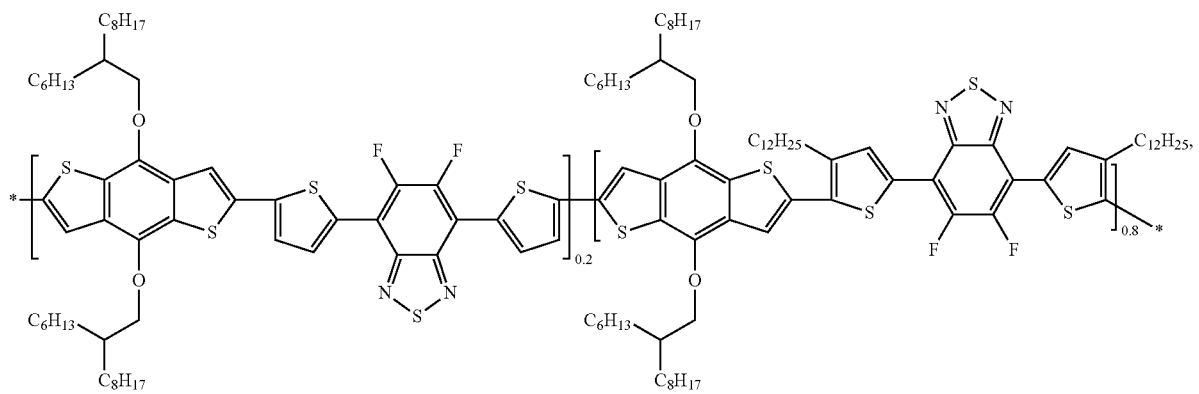
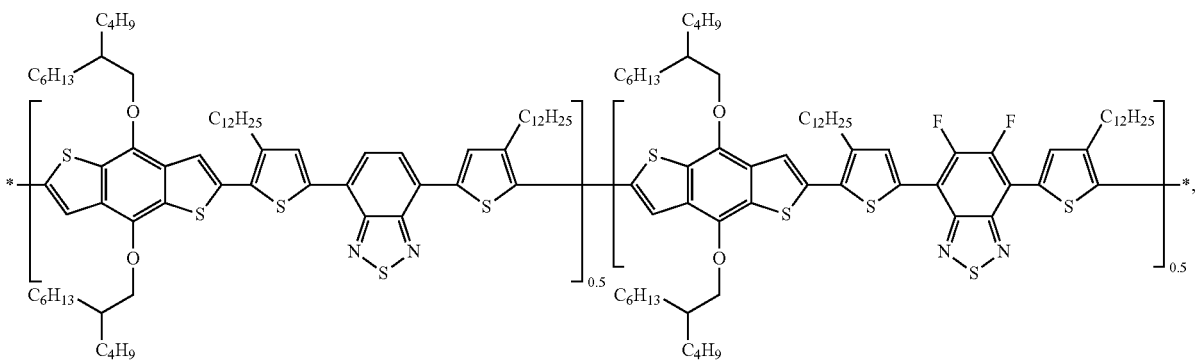
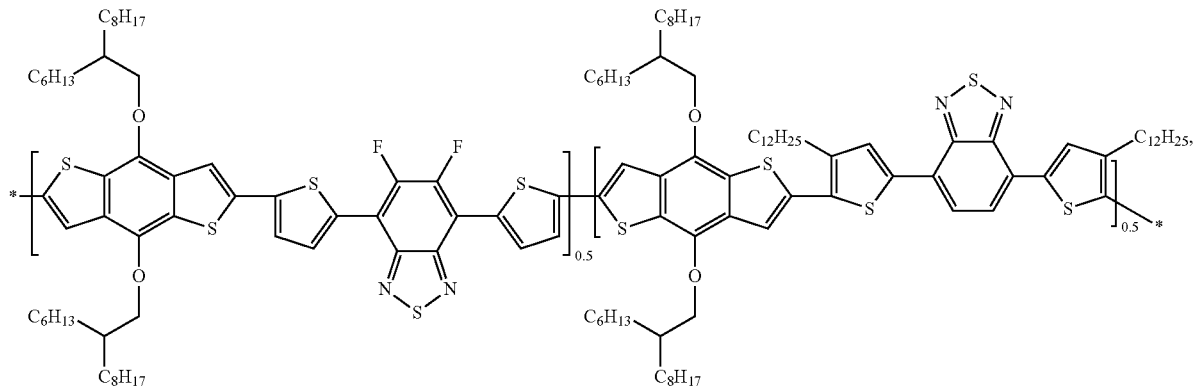
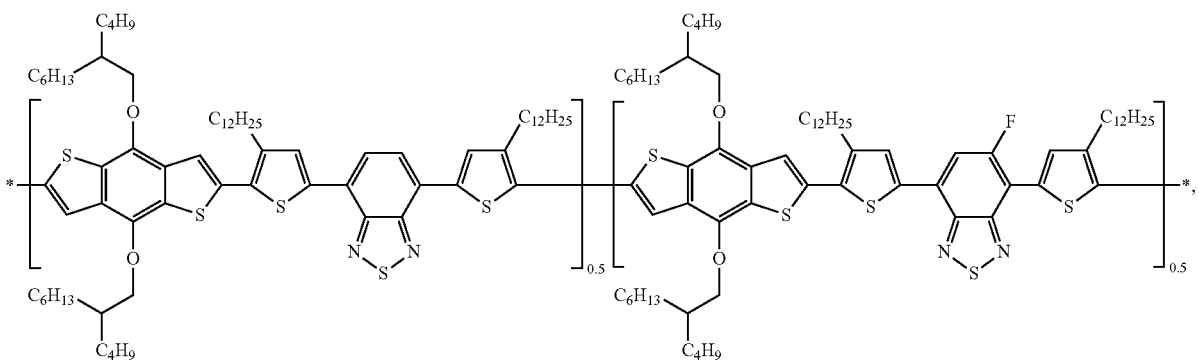

-continued
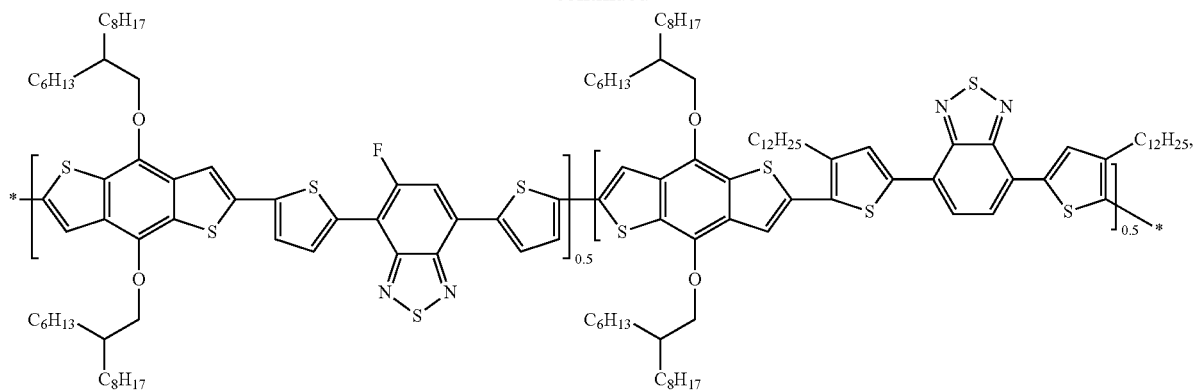
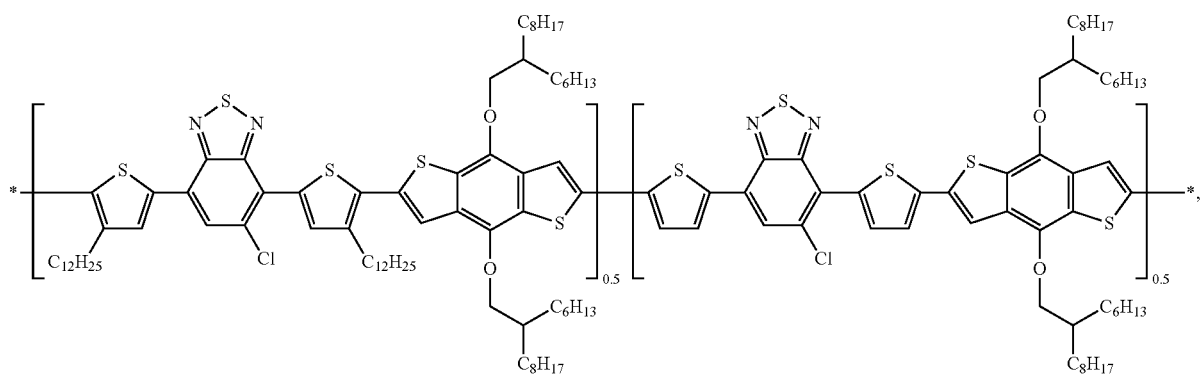
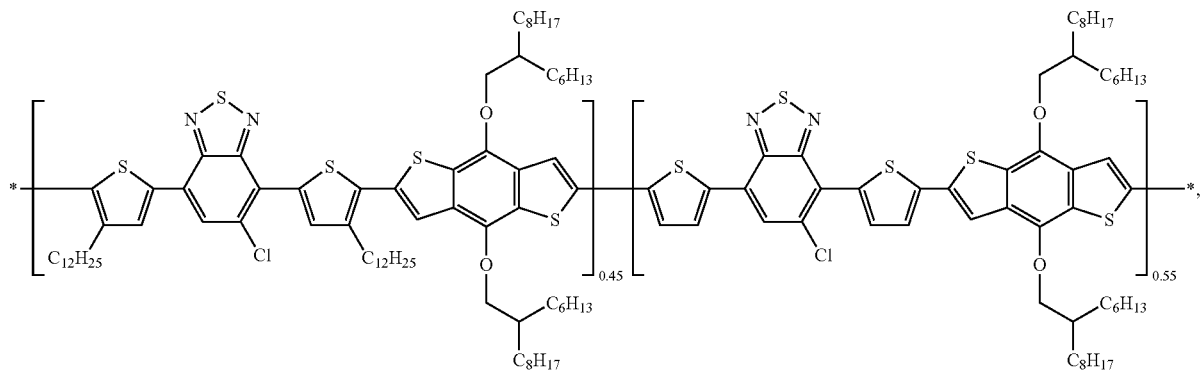
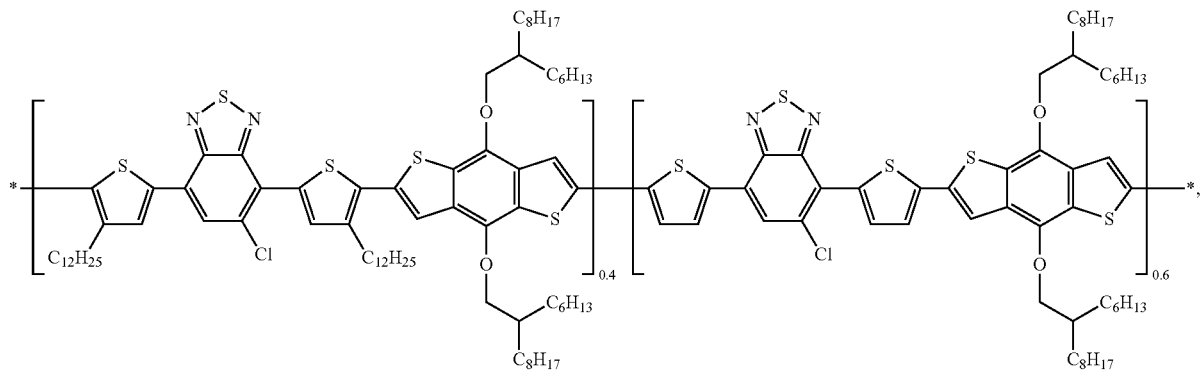

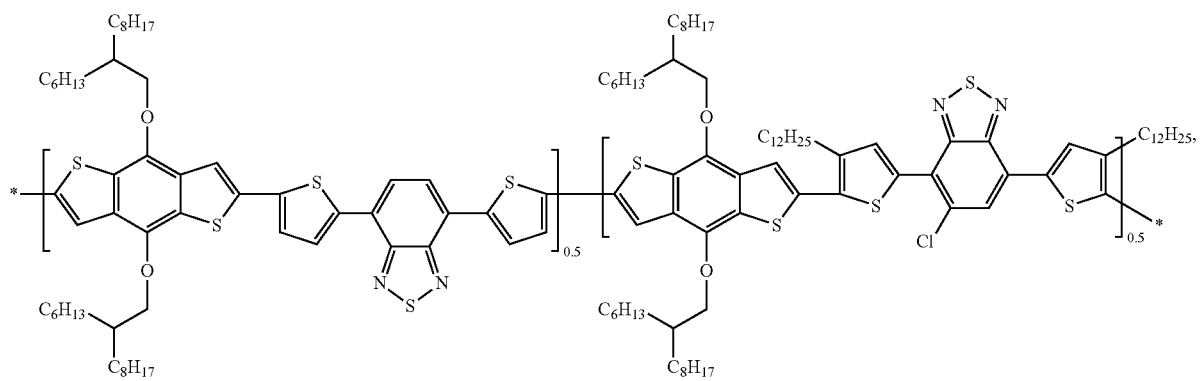
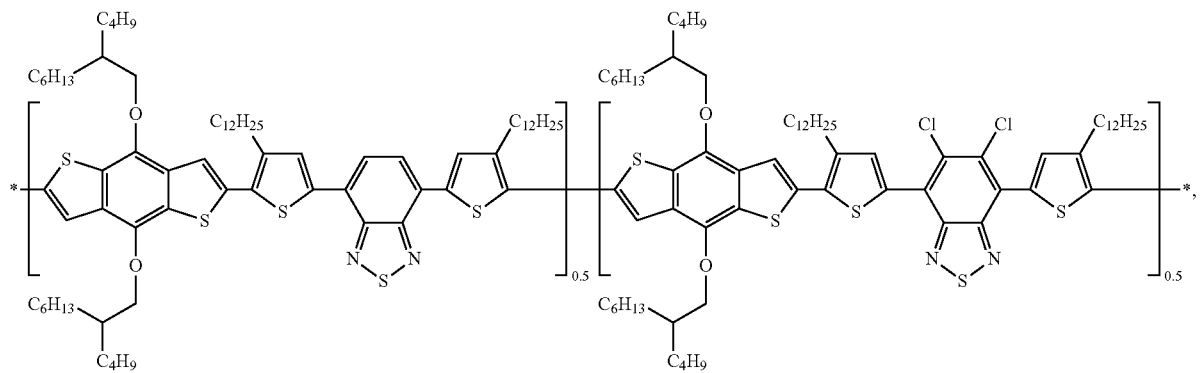
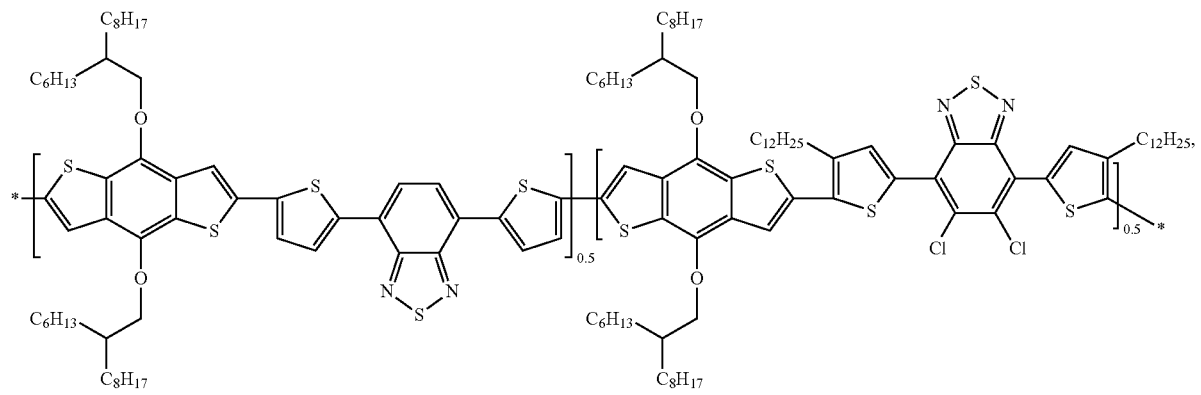
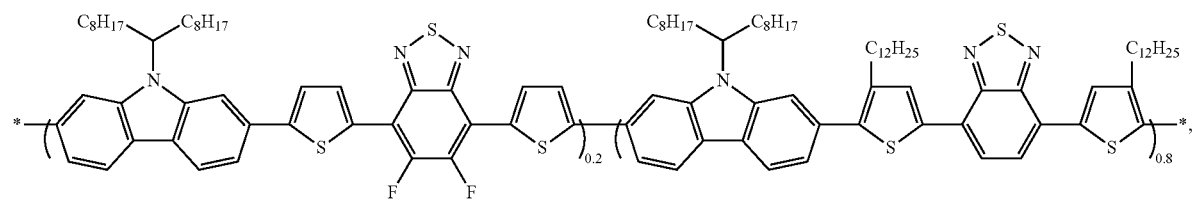

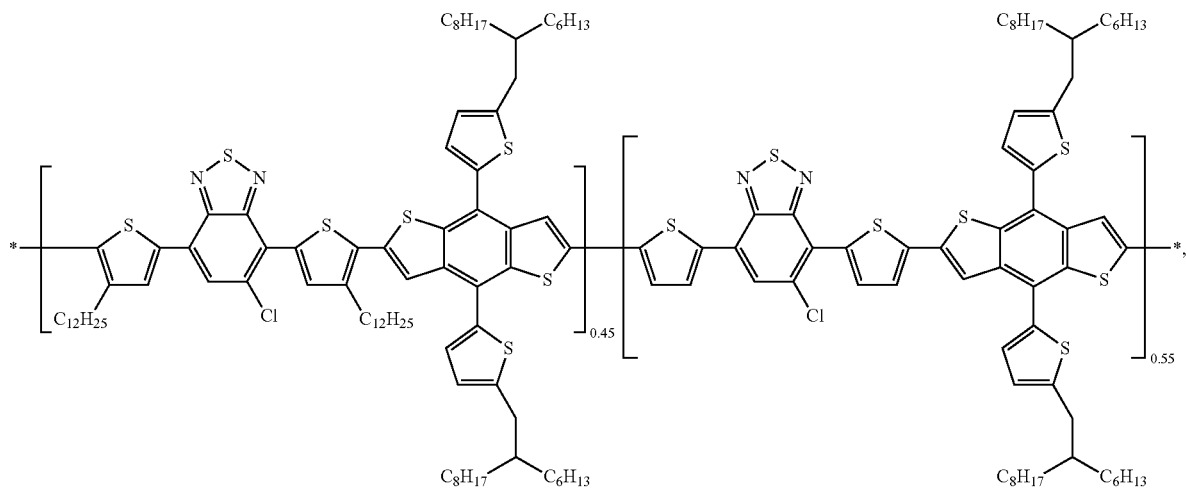
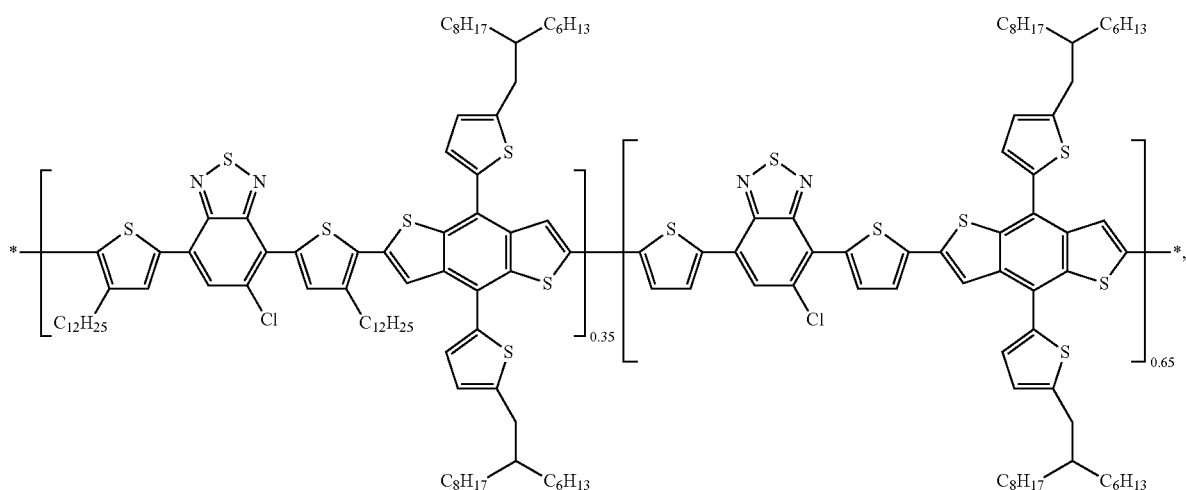
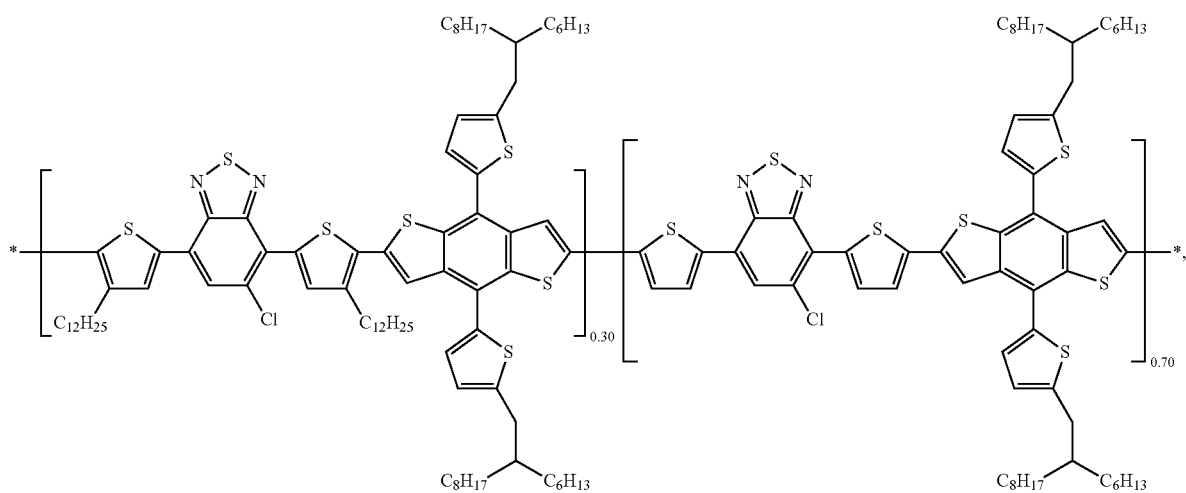

-continued

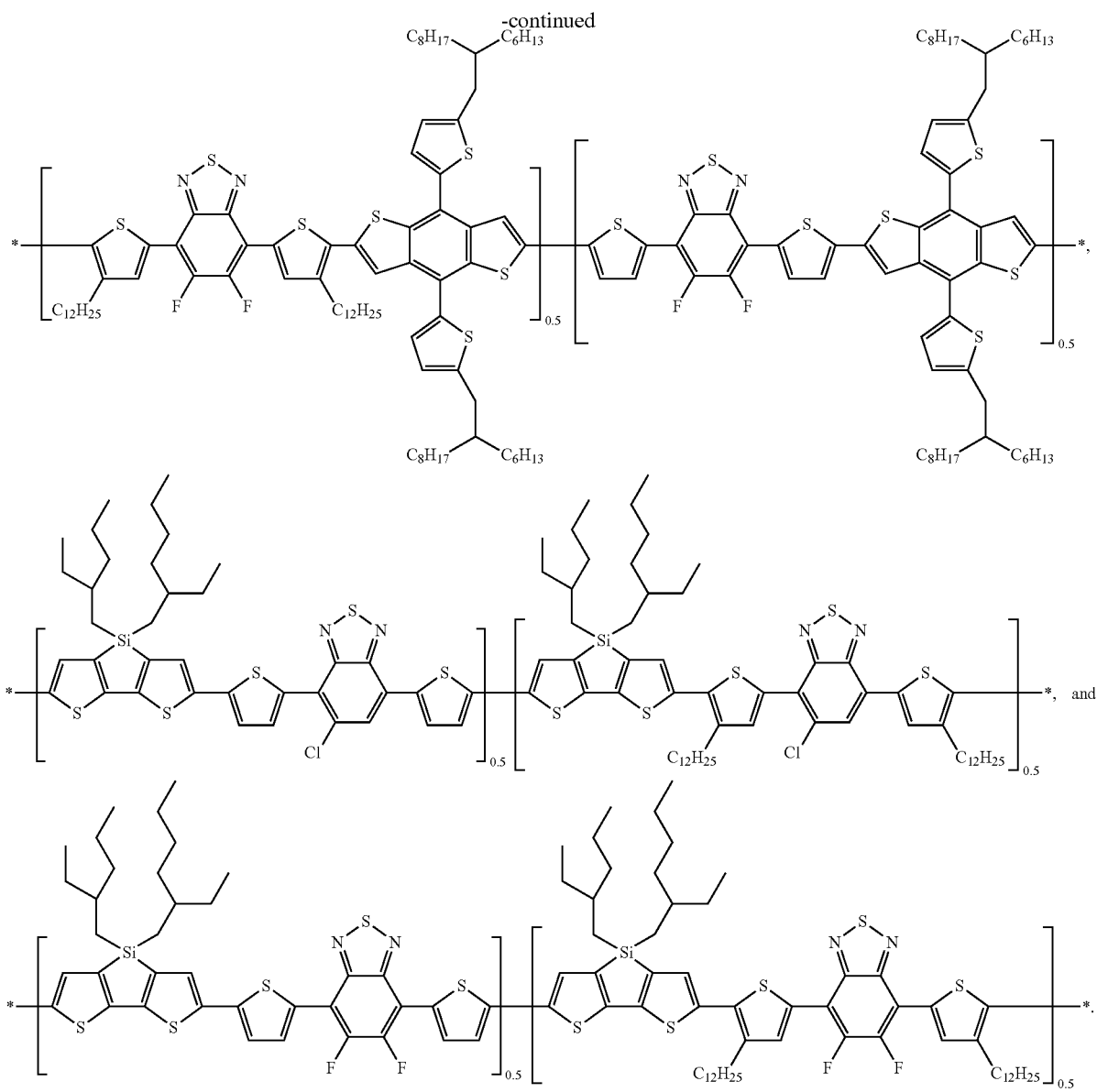

Compounds of the present teachings and monomers leading to the present compounds can be prepared according to procedures analogous to those described in the Examples. In particular, Stille coupling or Suzuki coupling reactions can be used to prepare co-polymeric compounds according to the present teachings with high molecular weights and in high yields (≥75%) and purity, as confirmed by $^1$H NMR spectra, elemental analysis, and/or GPC measurements.

Alternatively, the present compounds can be prepared from commercially available starting materials, compounds known in the literature, or via other readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), optical absorption/emission spectroscopy (e.g., UV-visible), mass spectrometry (MS), or by chromatography such as high pressure liquid chromatography (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Certain embodiments disclosed herein can be stable in ambient conditions ("ambient stable") and soluble in common solvents. As used herein, a compound can be considered electrically "ambient stable" or "stable at ambient conditions" when a transistor incorporating the compound as its semiconducting material exhibits a carrier mobility that is maintained at about its initial measurement when the compound is exposed to ambient conditions, for example, air, ambient temperature, and humidity, over a period of time. For example, a compound according to the present teachings can be described as ambient stable if a transistor incorporating the compound shows a carrier mobility that does not vary more than 20% or more than 10% from its initial value after exposure to ambient conditions, including, air, humidity and temperature, over a 3 day, 5 day, or 10 day period. In addition, a compound can be considered ambient stable if the optical absorption of the corresponding film does not vary more than 20% (preferably, does not vary more than 10%) from its initial value after exposure to ambient conditions, including air, humidity and temperature, over a 3 day, 5 day, or 10 day period.

As used herein, a compound can be considered soluble in a solvent when at least 0.1 mg of the compound can be dissolved in 1 mL of the solvent. Examples of common organic solvents include petroleum ethers; acetonitrile; aromatic hydrocarbons such as benzene, toluene, xylene, and mesitylene; ketones such as acetone, and methyl ethyl ketone; ethers such as tetrahydrofuran, dioxane, bis(2-methoxyethyl)ether, diethyl ether, di-isopropyl ether, and t-butyl methyl ether; alcohols such as methanol, ethanol, butanol, and isopropyl alcohol; aliphatic hydrocarbons such as hexanes; esters such as methyl acetate, ethyl acetate, methyl formate, ethyl formate, isopropyl acetate, and butyl acetate; amides such as dimethylformamide and dimethylacetamide; sulfoxides such as dimethylsulfoxide; halogenated aliphatic and aromatic hydrocarbons such as dichloromethane, chloroform, ethylene chloride, chlorobenzene, dichlorobenzene, and trichlorobenzene; and cyclic solvents such as cyclopentanone, cyclohexanone, and 2-methypyrrolidone.

The present compounds can be fabricated into various articles of manufacture using solution processing techniques in addition to other more expensive processes such as vapor deposition. Various solution processing techniques have been used with organic electronics. Common solution processing techniques include, for example, spin coating, drop-casting, zone casting, dip coating, blade coating, or spraying. Another example of solution processing technique is printing. As used herein, "printing" includes a noncontact process such as inkjet printing, microdispensing and the like, and a contact process such as screen-printing, gravure printing, offset printing, flexographic printing, lithographic printing, pad printing, microcontact printing and the like.

Compounds of the present teachings can be used alone or in combination with other compounds to prepare semiconductor materials (e.g., compositions and composites), which in turn can be used to fabricate various articles of manufacture, structures, and devices. In some embodiments, semiconductor materials incorporating one or more compounds of the present teachings can exhibit p-type semiconductor activity, ambipolar activity, light absorption, and/or light emission.

The present teachings, therefore, further provide methods of preparing a semiconductor material. The methods can include preparing a composition (e.g., a solution or dispersion) that includes one or more compounds disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a photoactive layer) that includes a compound disclosed herein. In various embodiments, the liquid medium can be an organic solvent, an inorganic solvent such as water, or combinations thereof. In some embodiments, the composition can further include one or more additives independently selected from viscosity modulators, detergents, dispersants, binding agents, compatibilizing agents, curing agents, initiators, humectants, antifoaming agents, wetting agents, pH modifiers, biocides, and bacteriostats. For example, surfactants and/or polymers (e.g., polystyrene, polyethylene, poly-alpha-methylstyrene, polyisobutene, polypropylene, polymethylmethacrylate, and the like) can be included as a dispersant, a binding agent, a compatibilizing agent, and/or an antifoaming agent. In some embodiments, the depositing step can be carried out by printing, including inkjet printing and various contact printing techniques (e.g., screen-printing, gravure printing, offset printing, pad printing, lithographic printing, flexographic printing, and microcontact printing). In other embodiments, the depositing step can be carried out by spin coating, drop-casting, zone casting, dip coating, blade coating, or spraying.

Various articles of manufacture including optical devices, optoelectronic devices, and electronic devices such as thin film semiconductors, photovoltaic devices, photodetectors, organic light emitting devices such as organic light emitting transistors (OLETs), that make use of the compounds disclosed herein are within the scope of the present teachings as are methods of making the same. The present compounds can offer processing and operation advantages in the fabrication and/or the use of these devices.

For example, articles of manufacture such as the various devices described herein can be an optical or optoelectronic device including a first electrode, a second electrode, and a photoactive component disposed between the first electrode and the second electrode, where the photoactive component includes a compound of the present teachings.

In various embodiments, the optical or optoelectronic device can be configured as a solar cell, in particular, a bulk heterojunction solar cell. Compounds of the present teachings can exhibit broad optical absorption and/or a tuned redox properties and bulk carrier mobilities, making them desirable for such applications. In various embodiments, the bulk heterojunction solar cells according to the present teachings can incorporate a blend material (e.g., a blended film) including a compound of the present teachings as the donor material and an acceptor material as the photoactive layer. While in most state-of-the-art devices, the thickness of the blended film often is limited to about 100 nm or less (to obtain good device performance), the inventors have observed comparable performance with films prepared from the copolymers described herein in a broad thickness range, specifically, with thin films having a thickness of about 100 nm or less, as well as films having a thickness greater than about 200 nm.

Typical acceptor materials include fullerene-based compounds. Fullerenes useful in the present teachings can have a broad range of sizes (number of carbon atoms per molecule). The term fullerene as used herein includes various cage-like molecules of pure carbon, including Buckministerfullerene ($C_{60}$) "bucky ball" and the related "spherical" fullerenes as well as carbon nanotubes. Fullerenes can be selected from those known in the art ranging from, for example, C20-C1000. In certain embodiments, the fullerene can be selected from the range of C60 to C96. In particular embodiments, the fullerene can be C60 or C70, such as C60-[6,6]-phenyl-$C_{61}$-butyric acid methyl ester (C60-PCBM) or C70-PCBM. In some embodiments, chemically modified fullerenes can be used, provided that the modified fullerene retains acceptor-type and electron mobility characteristics. Other acceptor materials can be used in place of fullerenes, provided that they have the required acceptor-type and electron mobility characteristics. For example, the acceptor material can be various organic small molecules, polymers, carbon nanotubes, or inorganic particles (quantum dots, quantum rods, quantum tripods, $TiO_2$, ZnO etc.).

A photoactive component according to the present teachings can be prepared as a blended film deposited from a solution or dispersion containing a mixture of one or more of the present compounds and an acceptor compound such as fullerene (e.g., PCBM). The ratio of the present polymer to the acceptor compound can range from about 10:1 to about 1:10 by weight; for example, from about 5:1 to about 1:5 by weight, from about 3:1 to about 1:3 by weight, or from about 2:1 to about 1:2 by weight. The photoactive layer also can contain a polymeric binder, which can be present from about 5 to about 95% by weight. The polymeric binder, for example, can be a semicrystalline polymer selected from polystyrene (PS), high density polyethylene (HDPE), polypropylene (PP) and polymethylmethacrylate (PMMA).

FIG. 1 illustrates a representative structure of a bulk-heterojunction organic solar cell which can incorporate one or more compounds of the present teachings as the donor and/or acceptor materials. As shown, a representative solar cell generally includes a substrate 20, an anode 22, a cathode 26, and a photoactive layer 24 between the anode and the cathode that can incorporate one or more compounds of the present teachings as the electron donor (p-channel) and/or electron acceptor (n-channel) materials. In some embodiments, an optional smoothing layer can be present between the anode and the photoactive layer.

The substrate can be, for example, glass or a flexible substrate (e.g., plastic). The electrodes can be composed of metals or transparent conducting oxides such as indium tin oxide (ITO), gallium indium tin oxide (GITO), and zinc indium tin oxide (ZITO). For example, the cathode can be composed of aluminum or calcium, while the anode can be composed of ITO.

In various embodiments, an optional smoothing layer can be present between the anode and the photoactive layer. For example, the smoothing layer can include a film of 3,4-polyethylenedioxythiophene (PEDOT), or 3,4-polyethylenedioxythiophene:polystyrene-sulfonate (PEDOT:PSS).

In certain embodiments, a solar cell according to the present teachings can include a transparent glass substrate onto which an electrode layer (anode) made of indium tin oxide (ITO) is applied. This electrode layer can have a relatively rough surface, and a smoothing layer made of a polymer, typically PEDOT:PSS made electrically conductive through doping, can be applied on top of the electrode layer to enhance its surface morphology. Other similar interlayers can be optionally present between the anode and the photoactive layer for improving mechanical, chemical, and/or electronic properties of the device. The photoactive layer generally is made of two components as described above, and can have a layer thickness of, e.g., about 100 nm to a few μm. Before a counter electrode is applied (cathode), an electrically insulating transition layer can be applied onto the photoactive layer. This transition layer can be made of an alkali halogenide, e.g., LiF, and can be vapor-deposited in vacuum. Again, similar to the anode, other similar interlayers can be optionally present between the photoactive layer and the cathode for improving mechanical, chemical, and/or electronic properties of the device.

Another aspect of the present teachings relates to methods of fabricating an organic light-emitting transistor or an organic light-emitting diode (OLED) that incorporates one or more semiconductor materials of the present teachings. For example, in an OLED, one or more compounds of the present teachings can be used as electron-transporting and/or emissive and/or hole-transporting materials. An OLED generally includes a substrate, a transparent anode (e.g., ITO), a cathode (e.g., metal), and one or more organic layers which can incorporate one or more compounds of the present teachings as hole-transporting (p-channel) and/or emissive and/or electron-transporting (n-channel) materials. In embodiments where the present compounds only have one or two of the properties of hole transport, electron transport, and emission, the present compounds can be blended with one or more further organic compounds having the remaining required property or properties.

In other embodiments, the article of manufacture can be an electronic or optoelectronic device (e.g., an organic light-emitting transistor) including a first electrode, a second electrode, and a semiconducting component in contact with the first electrode and the second electrode, where the semiconducting component includes a compound of the present teachings. These devices can include a composite having a semiconducting component (or semiconductor material) of the present teachings and a substrate component and/or a dielectric component. The substrate component can be selected from doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., polycarbonate, polyester, polystyrene, polyhaloethylene, polyacrylate), and self-assembled superlattice/self-assembled nanodielectric (SAS/SAND) materials (e.g., as described in Yoon, M-H. et al., *PNAS*, 102 (13): 4678-4682 (2005), the entire disclosure of which is incorporated by reference herein), as well as hybrid organic/inorganic dielectric materials (e.g., described in U.S. patent application Ser. No. 11/642,504, the entire disclosure of which is incorporated by reference herein). In some embodiments, the dielectric component can include the crosslinked polymer blends described in U.S. patent application Ser. Nos. 11/315,076, 60/816,952, and 60/861,308, the entire disclosure of each of which is incorporated by reference herein. The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3,4-ethylenedioxythiophene)poly(styrenesulfonate) (PEDOT:PSS), polyaniline (PANI), polypyrrole (PPy)). One or more of the composites described herein can be embodied within various organic electronic, optical, and optoelectronic devices such as organic photovoltaics (OPV) and organic light-emitting transistors (OLETs) as described above.

The following examples are provided to illustrate further and to facilitate the understanding of the present teachings and are not in any way intended to limit the invention.

All reagents were purchased from commercial sources and used without further purification unless otherwise noted. Specifically, dioxane, dichlorobenzene (DCB), chloroform (CHCl$_3$), and other chlorinated hydrocarbons (CHCs) used for dielectric and semiconductor formulations were purchased from Sigma Aldrich and distilled before use. Anhydrous tetrahydrofuran (THF) was distilled from Na/benzophenone. Conventional Schlenk techniques were used and reactions were carried out under N$_2$ unless otherwise noted. 4,7-Bis(4-dodecyl-2-thienyl)-2,1,3-benzothiadiazole (Yue et al., *Macromolecules*, 42: 6510-6518 (2009)) and 4,7-bis(5-bromo-2-thienyl)-2,1,3-benzothiadiazole (Moule et al., *Chem. Mater,* 20: 4045-4050 (2008)) were prepared according to literature procedure.

Characterization data are provided in some cases by $^1$H-NMR, $^{13}$C-NMR, and/or elemental analysis. NMR spectra were recorded on an Inova 500 NMR spectrometer ($^1$H, 500 MHz). Elemental analyses were performed by Midwest Microlab, LLC. Polymer molecular weights were determined on a Waters GPC system (Waters Pump 510) in THF at room temperature versus polystyrene standards.

Example 1

Synthesis of Monomers

Example 1

Synthesis of Monomers

Example 1A

Preparation of 4,7-dibromo-5,6-difluorobenzo[1,2,5]thiadiazole

Step 1: 5,6-Difluorobenzo[1,2,5]thiadiazole

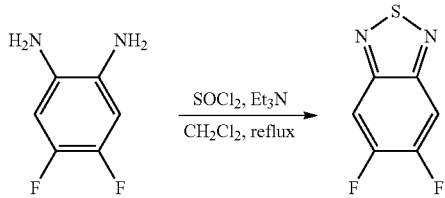 [SMILES: Nc1cc(F)c(F)cc1N ; Fc1cc2nsnc2cc1F]

To a solution of 4,5-difluorobenzene-1,2-diamine (2.0 g, 0.014 mol) and triethylamine (7.8 mL, 0.056 mol) in dichloromethane (80 mL) was added SOCl$_2$ (4.04 mL, 0.055 mol) dropwise at room temperature. The resulting reaction mixture was heated to reflux overnight. The reaction mixture was then allowed to cool to room temperature, and quenched with water carefully. The resulting mixture was extracted with dichloromethane, dried over Na$_2$SO$_4$ and concentrated on a rotary evaporator to give a white solid as the crude compound. The crude product was purified by flash column chromatography (silica gel, hexanes) to afford 5,6-difluorobenzo[1,2,5]thiadiazole as a white crystalline solid (1.4 g, 58% yield). $^1$H NMR (CDCl$_3$ 500 MHz): δ: 7.76 (t, 2H, J=8.5 Hz). $^{13}$C NMR (CDCl$_3$, 500 MHz): δ 154.94, 154.78, 152.86, 152.70, 150.89, 150.85, 150.81, 106.26, 106.21, 106.14, 106.09.

Anal. calcd. for (C$_6$H$_2$F$_2$N$_2$S): C, 41.86; H, 1.17; N, 16.27. Found: C, 41.41; H, 1.22; H, 15.87. m.p: 64-65° C.

Step 2: 4,7-Dibromo-5,6-difluorobenzo[1,2,5]thiadiazole

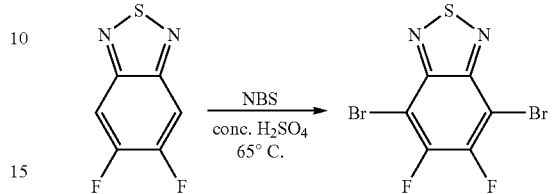

To a solution of 5,6-difluorobenzo[1,2,5]thiadiazole (500 mg, 2.9 mmol) in concentrated H$_2$SO$_4$ (30 mL) was added NBS (2.07 g, 11.62 mmol) portionwise at room temperature. The resulting solution was heated to 55° C. for 2 h. The reaction mixture was then allowed to cool to room temperature, and then added to an ice-water mixture and filtered to give a white solid as the crude product. The crude product was purified by flash column chromatography (silica gel, chloroform) to afford 4,7-dibromo-5,6-difluorobenzo[1,2,5]thiadiazole as a white solid (0.35 g, 36% yield). $^1$H NMR (CDCl$_3$ 500 MHz): No peaks observed. $^{13}$C NMR (CDCl$_3$, 500 MHz): δ 152.95, 152.78, 150.87, 150.69, 148.88, 148.86, 99.49, 99.43, 99.37, 99.30, 99.20 Anal. calcd. for (C$_6$Br$_2$F$_2$N$_2$S): C, 21.84; H, 0.00; N, 8.49; Br, 48.43. Found: C, 22.01; H, 0.20; N, 8.26; Br, 48.69. m.p: 148-149° C.

Example 1B

Preparation of 4,7-bis-(5-bromo-thiophen-2-yl)-5,6-difluoro-benzo[1,2,5]thiadiazole Step 1: 5,6-Difluoro-4,7-di-thiophen-2-yl-benzo[1,2,5]thiadiazole

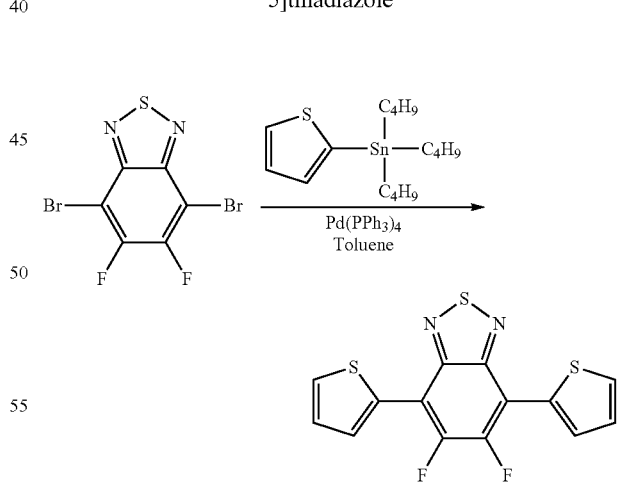

4,7-Dibromo-5,6-difluoro-benzo[1,2,5]thiadiazole (0.29 g, 1 mmol), tributyl-thiophen-2-yl-stannane (0.86 g, 2.3 mmol), and Pd(PPh$_3$)$_4$ (20 mg) were combined into a 50-mL Schlenk flask. The system was vacuumed and backfilled with argon for three cycles before 20 mL anhydrous toluene was added. The mixture was heated at 105° C. for 4 days. After the reaction was cooled down, the solvent was removed by rotary evaporation. The product was further purified by silica gel column with toluene/hexane (v/v, 1/2) as the eluent and recrystallization from a hexane/iso-propoanol mixture. The final product (0.276 g, 93.0% yield) was obtained as red needle crystals after being dried in vacuo. $^1$H NMR (CDCl$_3$, 500 MHz): δ 8.33 (d×d, 2H, J=4.0 Hz×1.0 Hz), δ 7.66 (d×d, 2H, J=5.5 Hz×1.0 Hz), δ 7.30 (d×d, 2H, J=5.5 Hz×4.0 Hz)

Step 2: 4,7-Bis-(5-bromo-thiophen-2-yl)-5,6-difluoro-benzo[1,2,5]thiadiazole

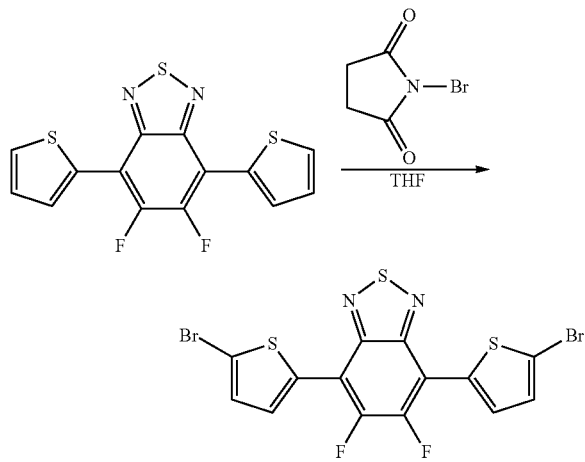

To a 100 mL Schlenk flask, 5,6-difluoro-4,7-di-thiophen-2-yl-benzo[1,2,5]thiadiazole (0.276 g, 0.820 mmol) was added. The system was flushed with argon for 5 minutes before 25 mL of anhydrous THF was added. NBS (0.292 g, 1.641 mmol) was added in portions in the absence of light and the resulting mixture was stirred at room temperature overnight. Dichloromethane (100 mL) was added and the organic layer was washed with brine 3 times before drying with anhydrous Na$_2$SO$_4$. The product (0.15 g, 36.5% yield) was obtained after removal of the solvent and recrystallization from a toluene/iso-propanol mixture. $^1$H NMR (CDCl$_3$, 500 MHz): δ 8.06 (d, 2H, J=4.0 Hz), δ 7.25 (d, 2H, J=4.0 Hz).

Example 1C

Preparation of 4,7-bis-(5-bromo-4-dodecyl-thiophen-2-yl)-5,6-difluoro-benzo[1,2,5]thiadiazole Step 1: 4,7-Bis-(4-dodecyl-thiophen-2-yl)-5,6-difluoro-benzo[1,2,5]thiadiazole

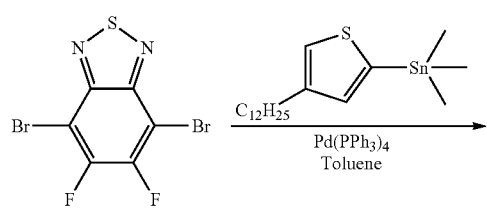

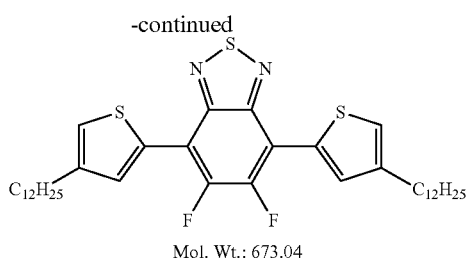

Mol. Wt.: 673.04

4,7-Dibromo-5,6-difluoro-benzo[1,2,5]thiadiazole (0.33 g, 1 mmol), (4-dodecyl-thiophen-2-yl)-trimethyl-stannane (1.04 g, 2.5 mmol), and Pd(PPh$_3$)$_4$ (20 mg) were combined in a 50-mL Schlenk flask. The system was vacuumed and backfilled with argon for three cycles before 20 mL of anhydrous toluene was added. The mixture was heated at 105° C. for 3 days. After the reaction was cooled down, the solvent was removed by rotary evaporation. The product was further purified by silica gel column with toluene/hexane (v/v, 1/4) as the eluent and recrystallization from a hexane/iso-propoanol mixture. The final product (0.60 g, 89.5% yield) was obtained as red needle crystals after drying in vacuo. $^1$H NMR (CDCl$_3$, 500 MHz): δ 8.15 (d, 2H, J=1.0 Hz), δ 7.23 (d, 2H, J=1.0 Hz), δ 2.74 (t, 4H, J=7.5 Hz), δ 1.73 (m, 4H), δ 1.29 (m, 18H), δ 0.90 (t, 6H, 7.0 Hz). $^{13}$C NMR (CDCl$_3$, 500 MHz): δ 150.8, 148.9, 143.7, 132.3, 131.2, 124.0, 111.7, 31.97, 30.60. 30.52, 29.74, 29.72, 29.70, 29.67, 29.53, 29.42, 29.39, 22.75, 14.19.

Step 2: 4,7-Bis-(5-bromo-4-dodecyl-thiophen-2-yl)-5,6-difluoro-benzo[1,2,5]thiadiazole

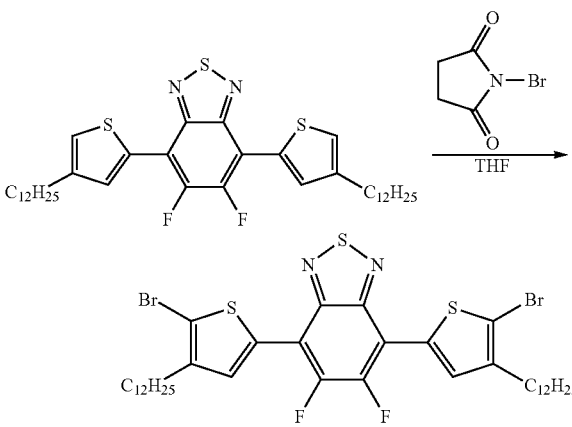

To a 100-mL Schlenk flask, 5,6-difluoro-4,7-di-thiophen-2-yl-benzo[1,2,5]thiadiazole (0.361 g, 0.536 mmol) was added. The system was flushed with argon for 5 minutes before 30 mL of anhydrous THF was added. NBS (0.196 g, 1.18 mmol) was added in portions in the absence of light and the resulting mixture was stirred at room temperature overnight. Dichloromethane (100 mL) was added and the organic layer was washed with brine 3 times before drying with anhydrous Na$_2$SO$_4$. The product (0.15 g, 36.5% yield) was further purified by silica gel column with hexane as the eluent and the final product (0.30 g, 67.4% yield) was obtained after removal of the solvent and recrystallization from a toluene/iso-propanol mixture. $^1$H NMR (CDCl$_3$, 500

MHz): δ 7.99 (s, 2H), δ 2.69 (t, 4H, J=7.5 Hz), δ 1.69 (m, 4H), δ 1.28 (m, 18H), δ 0.90 (t, 6H, 7.0 Hz).

Example 1D

Preparation of 4,7-dibromo-5-fluoro-benzo[1,2,5]thiadiazole

Step 1: 5-Fluoro-benzo[1,2,5]thiadiazole

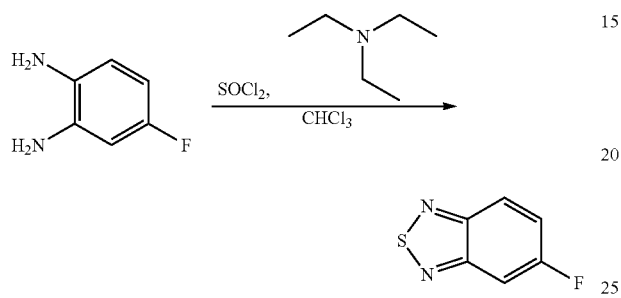

4-Fluoro-benzene-1,2-diamine (2.5 g, 19.8 mmol) was added into a 50-mL Schlenk flask. The system was flushed with argon before 200 mL of chloroform was added and followed by addition of triethylamine (11.05 mL, 79.3 mmol). A clear solution was observed after stirring at room temperature for 10 minutes. Thionyl chloride (5.18 g, 43.6 mmol) was added dropwise. The mixture was heated to reflux for 5 hours before being cooled down to room temperature. The organic layer was washed with brine (100 mL) and further dried over anhydrous MgSO$_4$. After removal of the solvent, the product was purified by silica gel column with hexane/dichloromethane (v/v, 1/2) as the eluent. Removal of the solvent offered a colorless oil (1.35 g, 44.3% yield) after being dried in vacuo. $^1$H NMR (CDCl$_3$, 500 MHz): δ 7.93 (d×d, 1H, J=9.0 Hz×5.0 Hz), δ 7.56 (d×d, 1H, J=9 Hz×2.5 Hz), δ 7.38 (m, 1H).

Step 2: 4,7-Dibromo-5-fluoro-benzo[1,2,5]thiadiazole

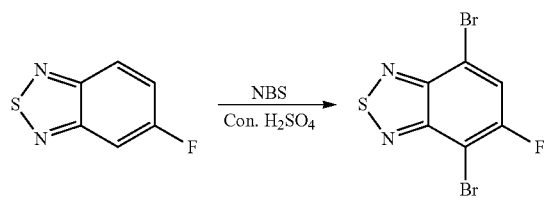 [SMILES: Fc1ccc2nsnc2c1 ; "NBS" ; Fc1cc(Br)c2nsnc2c1Br]

5-Fluoro-benzo[1,2,5]thiadiazole (1.35 g, 8.75 mmol) was added into a 50-mL Schlenk flask. The system was flushed with argon before 60 mL of concentrated H$_2$SO$_4$ was added and a clear solution was observed. NBS (6.23 g, 35.0 mmol) was added in portions in the absence of light. The mixture was heated to 65° C. for 2 hours. The reaction was terminated by pouring the mixture into crashed ice. The product was extracted by ethyl acetate and washed with saturated NaHSO$_3$ and then purified by silica gel column with hexane/dichloromethane (v/v, 2/3) as the eluent. Recrystallization from a hexane/iso-propanol mixture offered 0.82 g of white needle crystals as the final product (29.7% yield). $^{13}$C NMR (CDCl$_3$, 500 MHz): δ 161.16, 159.13, 152.80, 150.34, 123.80, 114.07, 98.33.

Example 1E

Preparation of 4,7-bis-(5-bromo-4-dodecyl-thiophen-2-yl)-5-fluoro-benzo[1,2,5]thiadiazole Step 1: 4,7-Bis-(4-dodecyl-thiophen-2-yl)-5-fluoro-benzo[1,2,5]thiadiazole

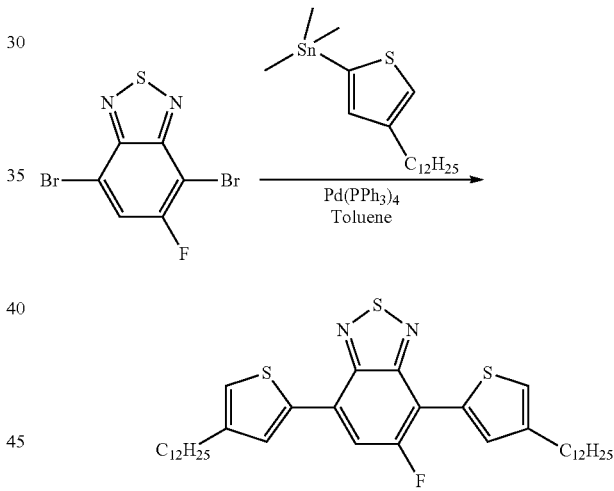

4,7-Dibromo-5-fluoro-benzo[1,2,5]thiadiazole (0.82 g, 2.63 mmol), (4-dodecyl-thiophen-2-yl)-trimethyl-stannane (2.72 g, 6.57 mmol), and Pd(PPh$_3$)$_4$ (50 mg) were combined into a 100-mL Schlenk flask. The system was vacuumed and backfilled with argon for three cycles before 50 mL of anhydrous toluene was added. The mixture was heated at 105° C. for 3 days. After the reaction was cooled down, the solvent was removed by rotary evaporation. The product was further purified by silica gel column with dichloromethane/hexane (v/v, 1/4) as the eluent. Removal of the solvent offered the final product (0.81 g, 47.0% yield) as a red powder after being dried in vacuo. $^1$H NMR (CDCl$_3$, 500 MHz): δ 8.03 (d, 1H, J=1.0 Hz), δ 7.92 (d, 1H, J=1.0 Hz), δ 7.67 (d, 1H, J=15.0 Hz), δ 7.08 (d, 1H, J=1.0 Hz), δ 7.02 (d, 1H, J=1.0 Hz), δ 2.63 (m, 4H), δ 1.63 (m, 4H), δ 1.26 (m, 18H), δ 0.81 (t, 6H, 7.0 Hz).

Step 2: 4,7-Bis-(5-bromo-4-dodecyl-thiophen-2-yl)-5-fluoro-benzo[1,2,5]thiadiazole

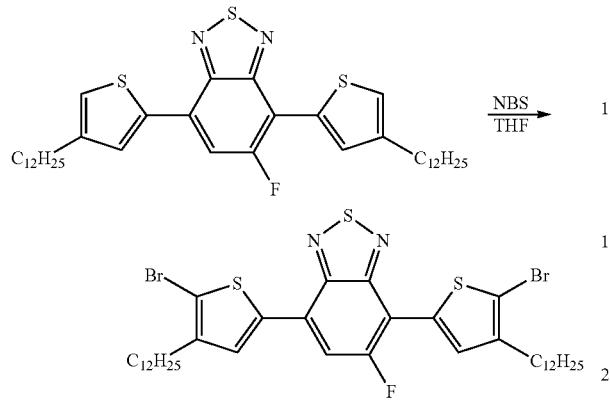

To a 100-mL Schlenk flask, 4,7-bis-(4-dodecyl-thiophen-2-yl)-5-fluoro-benzo[1,2,5]thiadiazole (0.81 g, 0.536 mmol) was added. The system was flushed with argon for 5 minutes before 40 mL of anhydrous THF was added. NBS (0.451 g, 2.53 mmol) was added in portions in the absence of light and the resulting mixture was stirred at room temperature overnight. After removal of the solvent, the product was further purified by silica gel column with hexane as the eluent. The final product (0.87 g, 87.0% yield) was obtained as red needles after removal of the solvent and recrystallization from a dichloromethane/ethanol mixture. $^1$H NMR (CDCl$_3$, 500 MHz): δ 7.99 (s, 1H), δ 7.79 (s, 1H), δ 7.69 (d, 1H, J=12.5 Hz), δ 2.67 (m, 4H), δ 1.69 (m, 4H), δ 1.28 (m, 18H), δ 0.90 (m, 6H).

Example 1F

Preparation of 4,7-dibromo-5-chloro-2,1,3-benzothiadiazole

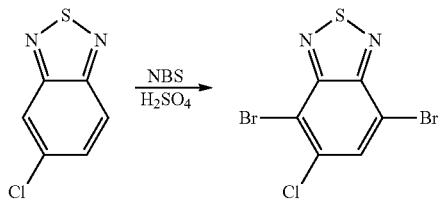

5-Chloro-2,1,3-benzothiadiazole (0.50 g, 2.93 mmol) was dissolved in concentrated sulfuric acid (15 mL). N-bromosuccinimide (1.56 g, 8.79 mmol) was added. The reaction mixture was stirred at room temperature for 18 hours and then heated to 50° C. for 1 hour. The reaction was cooled to room temperature and poured into ice water (100 mL). The mixture was extracted with chloroform, and the organic layer was separated and dried over MgSO$_4$. The solvent was removed and the residue was purified by chromatography (chloroform) to yield 4,7-dibromo-5-chloro-2,1,3-benzothiadiazole (658 mg, 68%). $^1$H NMR (CDCl$_3$, 500 MHz) δ: 7.95 (s, 1H).

Example 1G

Preparation of 4,7-bis(5-bromo-2-thienyl)-5-chloro-2,1,3-benzothiadiazole

Step 1: 4,7-Bis(2-thienyl)-5-chloro-2,1,3-benzothiadiazole

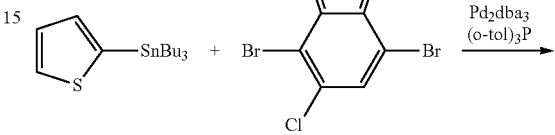

4,7-Dibromo-5-chloro-2,1,3-benzothiadiazole (300 mg, 0.193 mmol), 2-(tributylstannyl)thiophene (852 mg, 2.28 mmol), Pd$_2$dba$_3$ (10.5 mg, 0.0114 mmol), and P(o-tol)$_3$ (27.8 mg, 0.0913 mmol) were placed in a Schlenk flask. The flask was degassed and backfilled with argon three times. Dry toluene (30 mL) was added and the reaction was heated to 130° C. for 18 hr. The reaction was cooled to room temperature and the solvent was removed. The residue was purified by chromatography (1/5, CH$_2$Cl$_2$/hexanes) to afford 4,7-bis(2-thienyl)-2,1,3-benzothiadiazole (107 mg, 35%). $^1$H NMR (CDCl$_3$, 500 MHz) δ: 8.14 (dd, J=3.7, 1.1 Hz, 1H), 7.98 (s, 1H), 7.77 (dd, J=3.7, 1.1 Hz, 1H), 7.61 (dd, J=5.1, 1.2 Hz, 1H), 7.52 (dd, J=5.1, 1.1 Hz, 1H), 7.25 (m, 2H).

Step 2: 4,7-Bis(5-bromo-2-thienyl)-5-chloro-2,1,3-benzothiadiazole

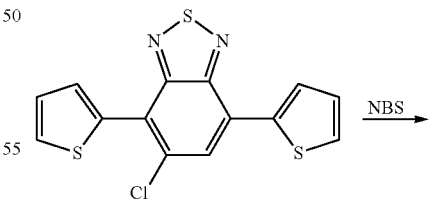

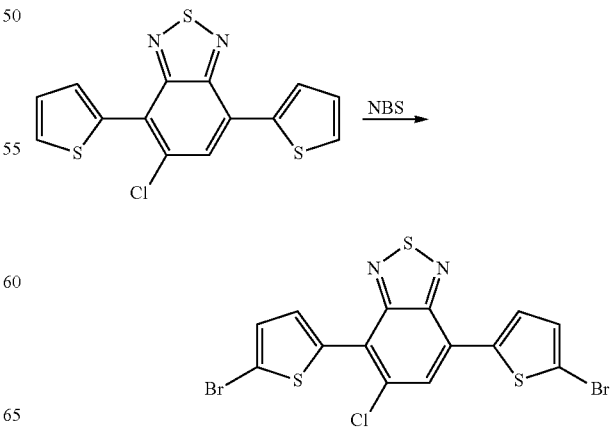

4,7-Bis(2-thienyl)-5-chloro-2,1,3-benzothiadiazole (104 mg, 0.311 mmol) was dissolved in chloroform (50 mL). Acetic acid (20 mL) and N-bromosuccinimide (110.6 mg, 0.621 mmol) were added. The reaction mixture was stirred at room temperature overnight. The solvent was removed and the residue was washed with water, then dried. The crude product was dissolved in chloroform and passed through a short silica gel column. The solvent was removed and the residue was crystallized from chloroform/ethanol to afford 4,7-bis(5-bromo-2-thienyl)-5-chloro-2,1,3-benzothiadiazole (110 mg, 72%). $^1$H NMR (CDCl$_3$, 500 MHz) δ: 7.88 (s, 1H), 7.82 (d, J=4.0 Hz, 1H), 7.64 (d, J=4.0 Hz, 1H), 7.20 (d, J=4.0 Hz, 1H), 7.18 (d, J=4.0 Hz, 1H).

Example 1H

Preparation of 4,7-bis(5-bromo-4-dodecyl-2-thienyl)-5-chloro-2,1,3-benzothiadiazole Step 1: 4,7-Bis(4-dodecyl-2-thienyl)-5-chloro-2,1,3-benzothiadiazole

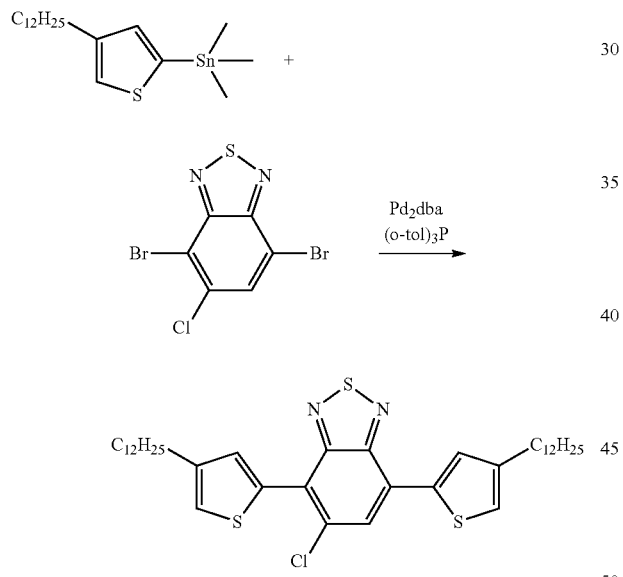

4,7-Dibromo-5-chloro-2,1,3-benzothiadiazole (300 mg, 0.193 mmol), 2-(trimethylstannyl)-4-dodecyl-thiophene (1.14 g, 2.74 mmol), Pd$_2$dba$_3$ (12.5 mg, 0.0137 mmol), and P(o-tol)$_3$ (33.37 mg, 0.110 mmol) were placed in a Schlenk flask. The flask was degassed and backfilled with argon three times. Dry toluene (30 mL) was added and the reaction was heated to 130° C. for 18 hr. The reaction was cooled to room temperature and the solvent was removed. The residue was purified by chromatography (1/10, CH$_2$Cl$_2$/hexanes) to afford 4,7-bis(4-dodecyl-2-thienyl)-2,1,3-benzothiadiazole (107 mg, 17%). $^1$H NMR (CDCl$_3$, 500 MHz) δ: 7.98 (d, J=1.2 Hz, 1H), 7.93 (s, 1H), 7.60 (d, J=1.3 Hz, 1H), 7.18 (s, 1H), 7.10 (s, 1H), 2.70 (q, J=7.9, 4H), 1.70 (m, 4H), 1.34 (m, 36H), 0.88 (t, J=7.9, 6H).

Step 2: 4,7-Bis(5-bromo-4-dodecyl-2-thienyl)-5-chloro-2,1,3-benzothiadiazole

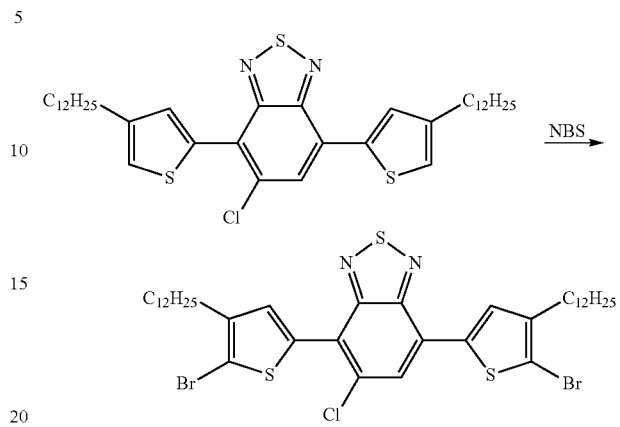

4,7-Bis(4-dodecyl-2-thienyl)-5-chloro-2,1,3-benzothiadiazole (105.5 mg, 0.157 mmol) was dissolved in chloroform (50 mL). Acetic acid (50 mL) and N-bromosuccinimide (55.9 mg, 0.314 mmol) were added. The reaction mixture was stirred at room temperature overnight. Water (100 mL) was added and the mixture was extracted with chloroform. The organic layer was separated, washed with 10% NaOH aqueous solution then water, and dried over MgSO$_4$. The solvent was removed under vacuum, and the residue was purified by chromatography using 1:20 dichloromethane/hexanes as the eluent to afford 4,7-bis(5-bromo-4-dodecyl-2-thienyl)-5-chloro-2,1,3-benzothiadiazole (102 mg, 78%). $^1$H NMR (CDCl$_3$, 500 MHz) δ: 7.85 (s, 1H), 7.76 (s, 1H), 7.26 (s, 1H), 2.65 (q, J=7.9, 4H), 1.66 (m, 4H), 1.34 (m, 36H), 0.87 (t, J=7.9, 6H).

Example 1I

Preparation of 4,7-dibromo-5,6-dichlorobenzo[1,2,5]thiadiazole

Step 1: 5,6-Dichlorobenzo[1,2,5]thiadiazole

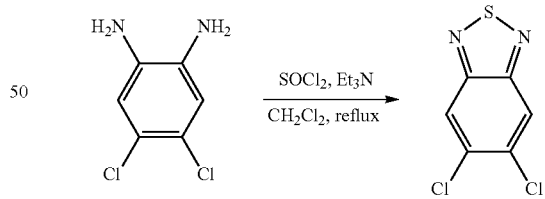

To a solution of 4,5-dichlorobenzene-1,2-diamine (3.0 g, 0.017 mol) and triethylamine (9.45 mL, 0.068 mol) in dichloromethane (120 mL) was added SOCl$_2$ (4.92 mL, 0.068 mol) dropwise at room temperature. The resulting reaction mixture was heated to reflux for 20 h. The reaction mixture was then allowed to cool to room temperature, and quenched with water carefully. The resulting mixture was extracted with dichloromethane, dried over Na$_2$SO$_4$ and concentrated on a rotary evaporator to give a dark solid as the crude compound. The crude compound was purified by flash column chromatography (silica gel, CHCl$_3$) to afford 5,6-dichlorobenzo[1,2,5]thiadiazole as an off-white crystalline solid (2.35 g, 68% yield). ¹H NMR (CDCl₃ 500 MHz): δ: 8.19 (t, 2H, J=8.5 Hz). ¹³C NMR (CDCl₃, 500 MHz): δ 153.07, 135.28, 121.51. Anal. calcd. for (C₆H₂Cl₂N₂S): C, 35.14; H, 0.98; N, 13.66. Found: C, 35.08; H, 1.01; H, 13.56. m.p: 108-110° C.

Step 2: 4,7-Dibromo-5,6-dichlorobenzo[1,2,5]thiadiazole

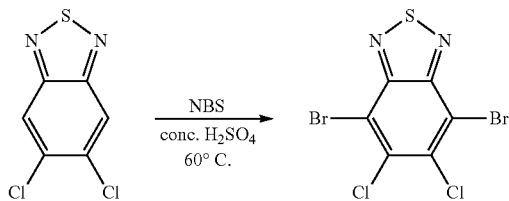

To a solution of 5,6-dichlorobenzo[1,2,5]thiadiazole (1.0 g, 4.88 mmol) in concentrated H₂SO₄ (60 mL) was added NBS (3.47 g, 19.5 mmol) portionwise at room temperature. The resulting solution was heated to 60° C. for 7 h. The reaction mixture was then allowed to cool to room temperature, and then added to an ice-water mixture and filtered to give a white solid as the crude product. The crude product was purified by flash column chromatography (silica gel, chloroform) to afford 4,7-dibromo-5,6-chlorobenzo[1,2,5]thiadiazole as a white solid (0.95 g, 54% yield). ¹H NMR (CDCl₃ 500 MHz): No peaks observed. ¹³C NMR (CDCl₃, 500 MHz): δ 151.29, 136.39, 114.94. Anal. calcd. for (C₆Br₂Cl₂N₂S): C, 19.86; H, 0.00; N, 7.72. Found: C, 20.33; H, 0.20; N, 7.67. m.p: 190-191° C.

Example 1J

Preparation of 4,7-bis-(5-bromo-4-dodecyl-thiophen-2-yl)-5,6-dichloro-benzo[1,2,5]thiadiazole Step 1: 4-(4-Dodecyl-thiophen-2-yl)-5,6-dichloro-7-bromo-benzo[1,2,5]thiadiazole

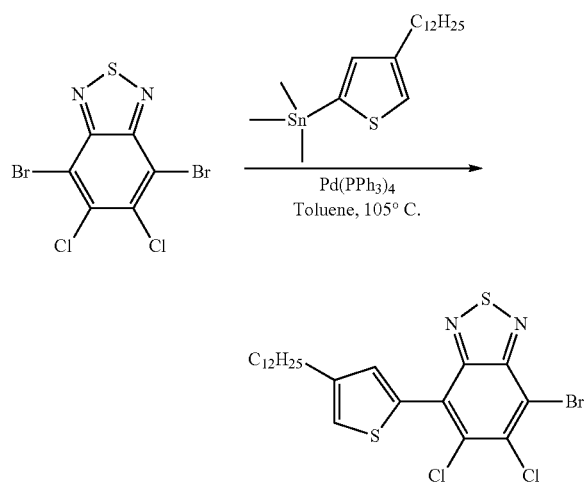

4,7-Dibromo-5,6-dichloro-benzo[1,2,5]thiadiazole (0.86 g, 2.37 mmol), (4-dodecyl-thiophen-2-yl)-trimethyl-stannane (2.26 g, 5.45 mmol), and Pd(PPh₃)₄ (54.8 mg) were placed in a 100 mL Schlenk flask. The system was subjected to three quick vacuum-nitrogen cycles and 40 mL anhydrous toluene was added. The mixture was heated at 105° C. for 2 days. After 2 days, 1.2 g more of (4-dodecyl-thiophen-2-yl)-trimethyl-stannane and 50 mg more of Pd(PPh₃)₄ were added, and the reaction mixture was stirred at 105° C. for another 2 days. After the reaction was cooled down, the solvent was removed by rotary evaporation. The product was purified by silica gel column with chloroform/hexane (v/v, 1/1) as the eluent. The final product (530 mg, yield 42%) was obtained as a yellow solid after being dried in vacuo. The compound was used directly in the next step without any further purification and characterization. ¹H NMR (CDCl₃, 500 MHz): δ 7.47 (d, 1H, J=1.0 Hz), 7.22 (d, 1H, J=1.0 Hz), 2.71 (t, 2H, J=8.0 Hz), 1.70 (m, 2H), 1.26 (m, 18H), 0.89 (t, 3H, 7.0 Hz).

Step 2: 4,7-Bis-(4-dodecyl-thiophen-2-yl)-5,6-dichloro-benzo[1,2,5]thiadiazole

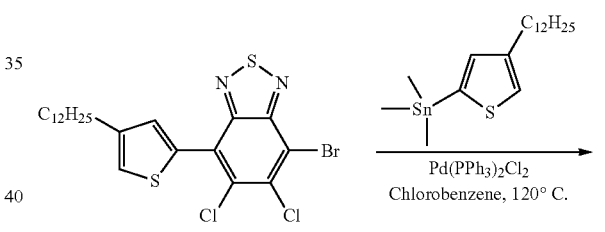

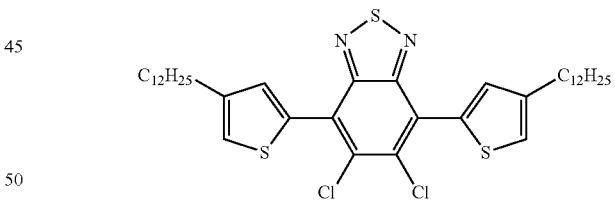

4-(4-Dodecyl-thiophen-2-yl)-5,6-dichloro-7-bromo-benzo[1,2,5]thiadiazole (0.530 g, 0.99 mmol), (4-dodecyl-thiophen-2-yl)-trimethyl-stannane (0.577 g, 1.39 mmol), and Pd(PPh₃)₂Cl₂ (34.8 mg) were placed in a 100-mL Schlenk flask. The system was subjected to three quick vacuum-nitrogen cycles and 40 mL of anhydrous chlorobenzene was added. The mixture was heated at 120° C. for 17 hours. After the reaction was cooled down, the solvent was removed by rotary evaporation. The product was purified by silica gel column with chloroform/hexane (v/v, 1/1) as the eluent. The final product (650 mg, 92.8% yield) was obtained as an orange solid after being dried in vacuo. $^1$H NMR (CDCl$_3$, 500 MHz): δ 7.49 (d, 2H, J=1.0 Hz), 7.22 (d, 2H, J=1.0 Hz), 2.72 (t, 4H, J=8.0 Hz), 1.71 (m, 4H), 1.27 (m, 36H), 0.89 (t, 6H, 7.0 Hz). $^{13}$C NMR (CDCl$_3$, 500 MHz): δ 152.71, 143.12, 134.32, 134.23, 132.64, 126.42, 123.09, 31.97, 30.53, 30.46, 29.74, 29.72, 29.70, 29.67, 29.54, 29.42, 22.75, 14.19. Anal. calcd. for (C$_{38}$H$_{54}$Cl$_2$N$_2$S$_3$): C, 64.65; H, 7.71; N, 3.97. Found: C, 64.72; H, 7.65; N, 3.98. m.p: 79-80° C.

Step 3: 4,7-Bis-(5-bromo-4-dodecyl-thiophen-2-yl)-5,6-dichloro-benzo[1,2,5]thiadiazole

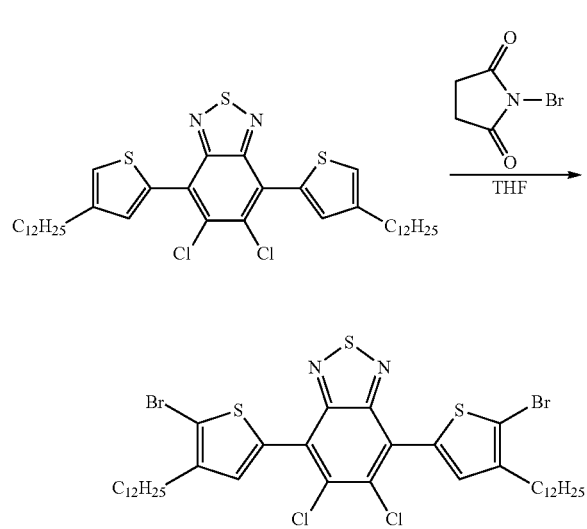

To a solution of 4,7-bis-(4-dodecyl-thiophen-2-yl)-5,6-dichloro-benzo[1,2,5]thiadiazole (200 mg, 0.283 mmol) in anhydrous THF (20 mL) was added NBS (111 mg, 0.623 mmol) in one portion under nitrogen, and the resulting mixture was stirred at room temperature overnight. Then, 100 mL of dichloromethane was added and the organic layer was washed with brine 3 times, dried with anhydrous Na$_2$SO$_4$, and concentrated on a rotary evaporator to give a red oil as the crude product. The crude product was purified by silica gel column with dichloromethane/hexane (v/v, 1/100) as the eluent to afford 4,7-bis-(5-bromo-4-dodecyl-thiophen-2-yl)-5,6-dichloro-benzo[1,2,5]thiadiazole as an orange solid (70 mg, 28.6% yield). $^1$H NMR (CDCl$_3$, 500 MHz): δ 7.47 (s, 2H), 2.67 (t, 4H, J=7.5 Hz), 1.67 (m, 4H), 1.27 (m, 36H), 0.89 (t, 6H, 7.0 Hz). $^{13}$C NMR (CDCl$_3$, 500 MHz): δ 152.26, 141.99, 134.10, 134.02, 132.75, 125.50, 113.17, 31.97, 31.64, 29.73, 29.70, 29.64, 29.61, 29.47, 29.41, 29.28, 29.10, 22.71, 14.18. m.p.: 60-61° C.

Example 1K

Preparation of 5-cyano-2,1,3-benzothiadiazole

Step 1: 5-Bromo-2,1,3-benzothiadiazole

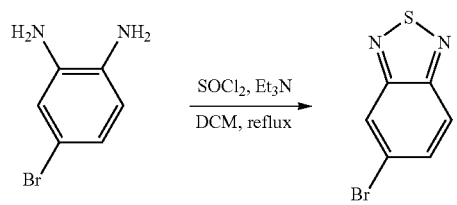 [SMILES: Nc1ccc(Br)cc1N ; Brc1ccc2nsnc2c1]

To a solution of 4-bromobenzene-1,2-diamine (5.236 g, 28.0 mmol) and Hunig's base (19.5 mL, 112 mmol) in dichloromethane (160 mL) was added SOCl$_2$ (4.08 mL, 56 mmol) dropwise at room temperature. The resulting reaction mixture was heated to reflux overnight. The reaction mixture was then allowed to cool to room temperature, and quenched with 10% HCl until pH=2. The resulting mixture was extracted with dichloromethane (200 mL×4), dried over Na$_2$SO$_4$ and concentrated. The crude compound was purified by flash column chromatography (silica gel, chloroform) to afford 5-bromobenzo[1,2,5]thiadiazole as a brown solid which was used directly in the next step. $^1$H NMR (CDCl$_3$ 500 MHz): δ: 8.21 (d, 1H, J=1.5 Hz), 7.87 (d, 1H, J=8.5 Hz), 7.69 (dd, 1H, J=8.5, 1.5 Hz).

Step 2: 5-Cyano-2,1,3-benzothiadiazole

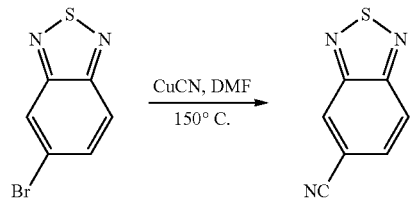 [SMILES: Brc1ccc2nsnc2c1 ; N#Cc1ccc2nsnc2c1]

5-Bromobenzo[1,2,5]thiadiazole from Step 1 was dissolved in anhydrous DMF (160 mL) under nitrogen. Then, CuCN (7.27 g, 81 mmol) was added and the mixture was heated to 150° C. overnight. After cooling down, a solution of FeCl$_3$ (19.7 g) in concentrated HCl (7 mL) and water (40 mL) was added dropwise and the mixture was stirred at 70° C. for minutes. After extraction with DCM (200 ml×2), the combined organic phases were extracted with HCl (6M, 100 mL×3), water (100 mL), and brine (100 mL), and dried over MgSO$_4$. Concentration gave a brown solid which was purified by column chromatography with DCM as the eluent.

Finally, a white solid was obtained (2.95 g, 65% yield for two steps). $^1$H NMR (CDCl$_3$ 500 MHz): δ: 8.48 (d, 1H, J=1.5 Hz), 8.16 (d, 1H, J=9.0 Hz), 7.75 (dd, 1H, J=9.0, 1.5 Hz).

Example 1L

Preparation of 4,8-bis-[5-(2-hexyl-decyl)-thiophen-2-yl]-2,6-bis-trimethylstannanyl-1,5-dithia-s-indacene Step 1: 4,8-Bis[5-(2-hexyl-decyl)-thiophen-2-yl]-1,5-dithia-s-indacene

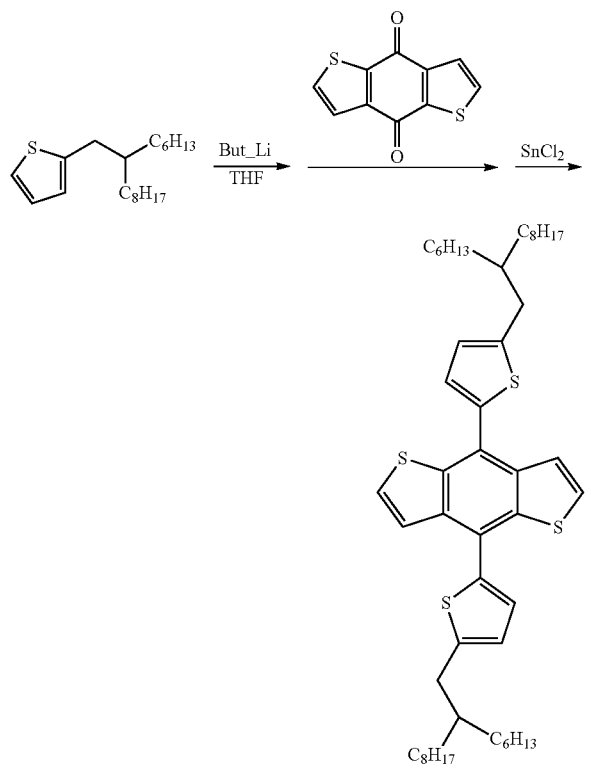

2-(2-Hexyl-decyl)-thiophene (7.12 g, 0.013 mol) was added into a 500-mL flask. The system was vacuumed and backfilled with argon three times before 250 mL of anhydrous THF was added. n-Butyl lithium (2.5 M in hexane, 0.022 mol, 8.8 mL) was added dropwise after the system was cooled to 0° C. for 30 minutes. The resulting mixture was stirred at room temperature for 1.5 hours before 1,5-dithia-s-indacene-4,8-dione (2.2 g, 0.01 mol) was added in the flow of argon. The mixture was heated at 60° C. for 2 hours before cooling to room temperature. A solution of SnCl$_2$ (9.5 g) in 150 mL of 30% HCl was added slowly into the reaction system. The mixture was heated at 60° C. for another 3 hours before cooling to room temperature. Hexane (500 mL) was added, and the mixture was washed with saturated Na$_2$CO$_3$ solution until no white solid was observed, followed by drying with MgSO$_4$. After removal of the solvent, the final product (5.0 g, 62.2% yield) was obtained by purification with chromatography using hexane as the eluent. $^1$H NMR (CDCl$_3$, 500 MHz): δ 7.67 (d, 2H, J=5.5 Hz), δ 7.48 (d, 2H, J=5.5 Hz), δ 7.32 (d, 2H, J=3.5 Hz), δ 6.91 (d, 2H, J=3.5 Hz), δ 2.88 (d, 4H, J=6.5 Hz), δ 1.76 (s, 2H), δ 1.38~1.32 (m, 48H), δ 0.91 (m, 12H).

Step 2: 4,8-Bis-[5-(2-hexyl-decyl)-thiophen-2-yl]-2,6-bis-trimethylstannanyl-1,5-dithia-s-indacene

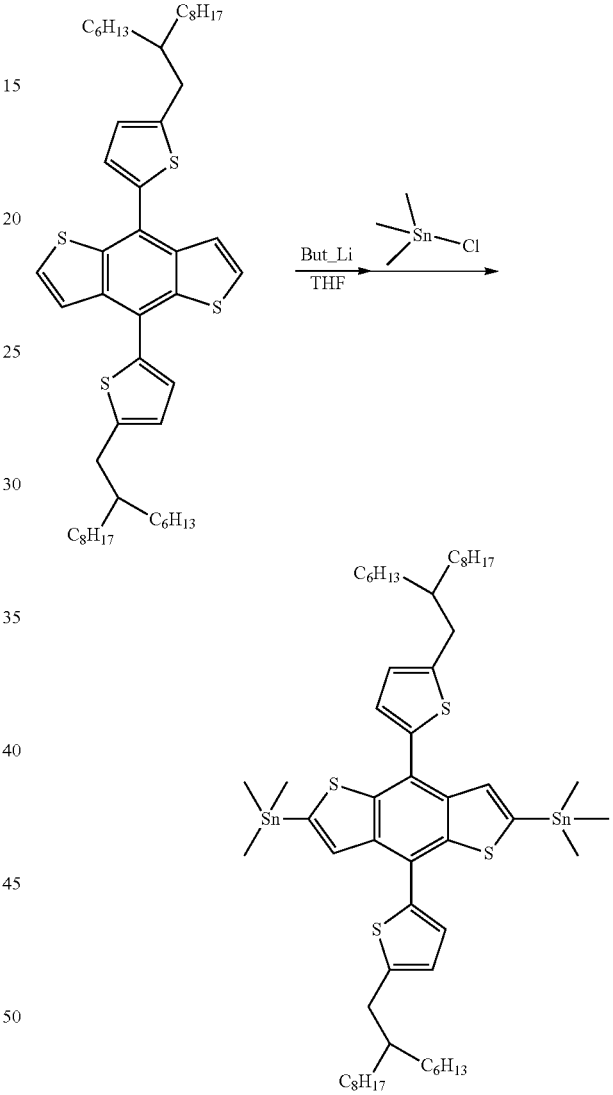

4,8-Bis-[5-(2-hexyl-decyl)-thiophen-2-yl]-1,5-dithia-s-indacene (2.06 g, 2.56 mmol) was added into a 200-mL flask. The system was vacuumed and backfilled with argon 3 times before 80 mL of anhydrous THF was injected. n-Butyl lithium (2.5 M in hexane, 2.3 mL, 5.6 mmol) was added after the mixture was cooled to −78° C. The mixture was stirred at −78° C. for 30 minutes and then at room temperature for one more hour. The system was cooled down to −78° C. again before trimethyltin chloride (0.5 g, 2.5 mmol) was added in portions. Stirring was continued overnight at room temperature. Hexane (200 mL) was added and the organic layer was washed with 150 mL of water. The aqueous layer was extracted with 100 mL of hexane twice. The combined organic layer was dried over anhydrous $Na_2SO_4$. Removal of the solvent under vacuum yielded a yellow liquid (2.2 g, 76.0% yield) as the final product after drying in vacuo overnight. $^1$H NMR (CDCl$_3$, 500 MHz): δ 7.57 (s, 2H), δ 7.21 (d, 2H, J=3.0 Hz), δ 6.78 (d, 2H, J=3.5 Hz), δ 2.76 (d, 4H, J=6.5 Hz), δ 1.62 (s, 2H), δ 1.26~1.19 (m, 48H), δ 0.76 (m, 12H), δ 0.29 (m, 18H).
Example 2
Polymer Synthesis
Example 2A
Preparation of Polymer 1A
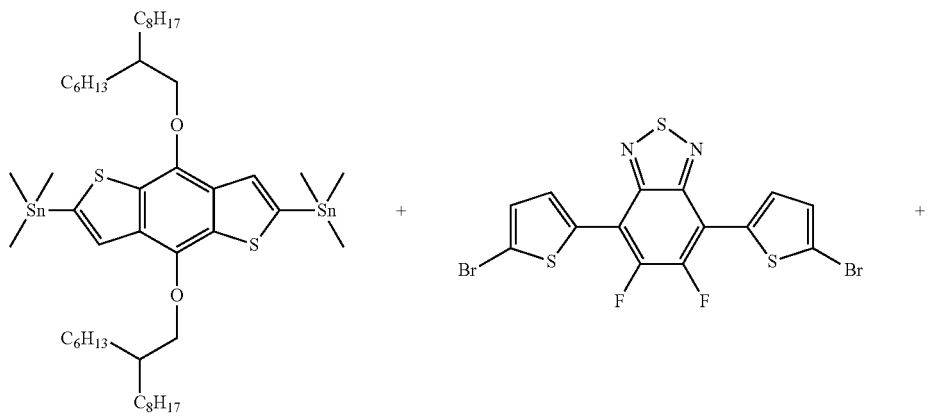
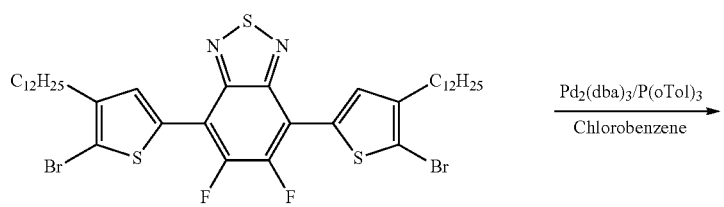
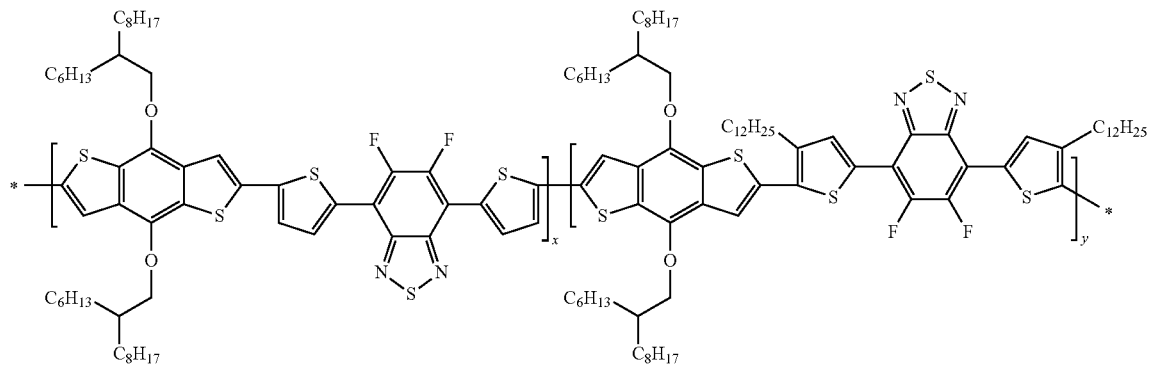
x = 0.5, y = 0.5

4,7-Bis-(5-bromo-4-dodecyl-thiophen-2-yl)-5,6-difluoro-benzo[1,2,5]thiadiazole (20.77 mg, 0.025 mmol), 4,7-bis-(5-bromo-thiophen-2-yl)-5,6-difluoro-benzo[1,2,5]thiadiazole (12.35 mg, 0.025 mmol), 4,8-bis-(2-hexyl-decyloxy)-2,6-bis-trimethylstannanyl-benzo[1,2-b:4,5-b]dithiophene (52.3 mg, 0.055 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 130° C. for 18 hours. After cooling down to room temperature, the polymer was precipitated out from methanol and further purified using Soxhlet extraction with methanol, ethyl acetate, and dichloromethane. The product was extracted with chloroform and weighed 16.0 mg (27.5% yield) after removal of the solvent and being dried in vacuo.

Example 2B

Preparation of Polymer 1B 4,7-Bis-(5-bromo-4-dodecyl-thiophen-2-yl)-5,6-difluoro-benzo[1,2,5]thiadiazole (24.92 mg, 0.03 mmol), 4,7-bis-(5-bromo-thiophen-2-yl)-5,6-difluoro-benzo[1,2,5]thiadiazole (9.88 mg, 0.02 mmol), 4,8-bis-(2-hexyl-decyl)-2,6-bis-trimethylstannanyl-benzo[1,2-b:4,5-b']dithiophene (52.3 mg, 0.055 mmol), $Pd_2(dba)_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 131° C. for 18 hours. After cooling down to room temperature, the polymer was precipitated out from 150 ml of methanol and further purified by Soxhlet extraction with methanol, acetone, hexane, ethyl acetate, and dichloromethane. The product was extracted with chloroform and weighed 38.0 mg (64.0% yield) after removal of the solvent and being dried in vacuo.

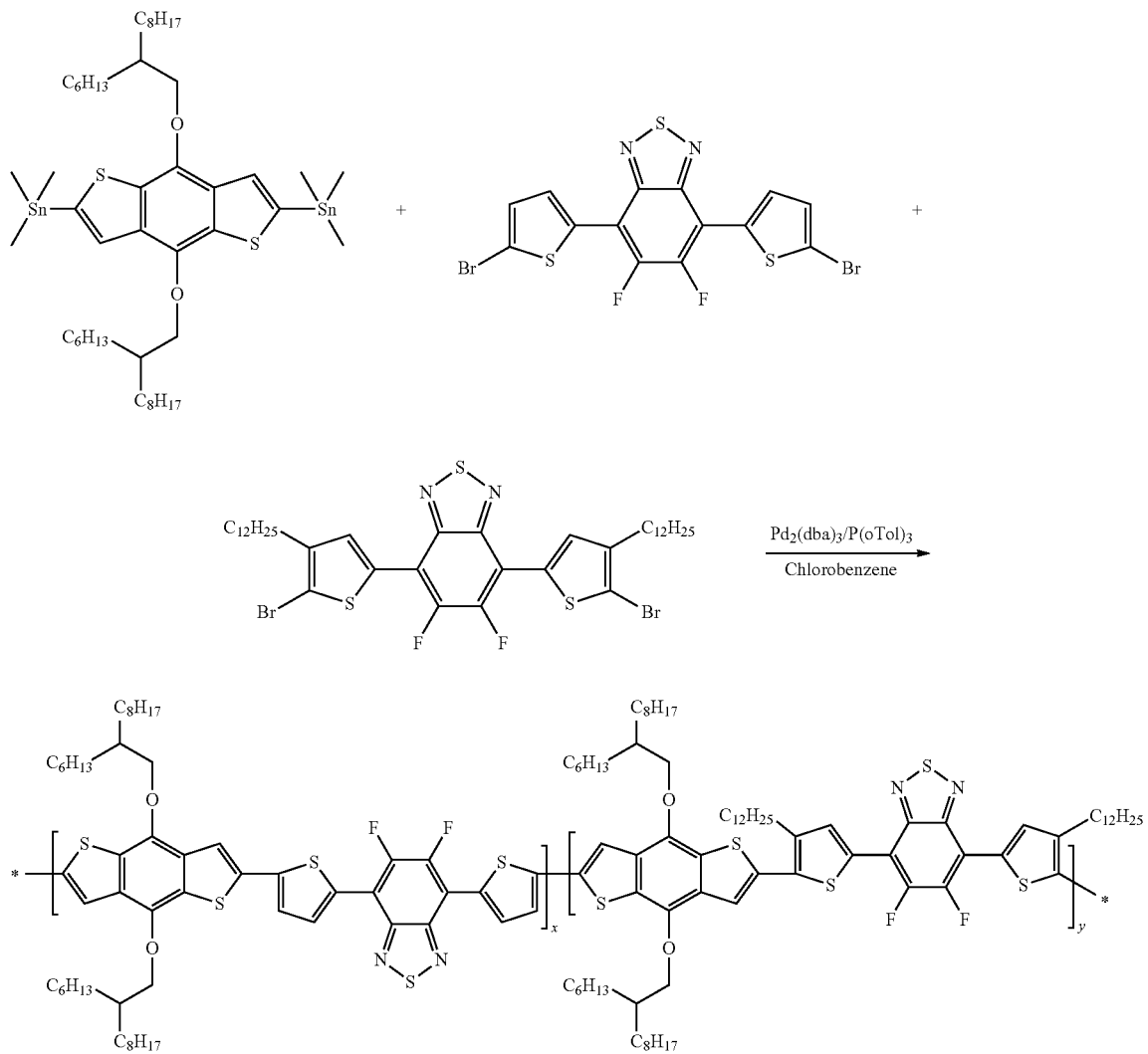

x = 0.4, y = 0.6

Example 2C

Preparation of Polymer 1C

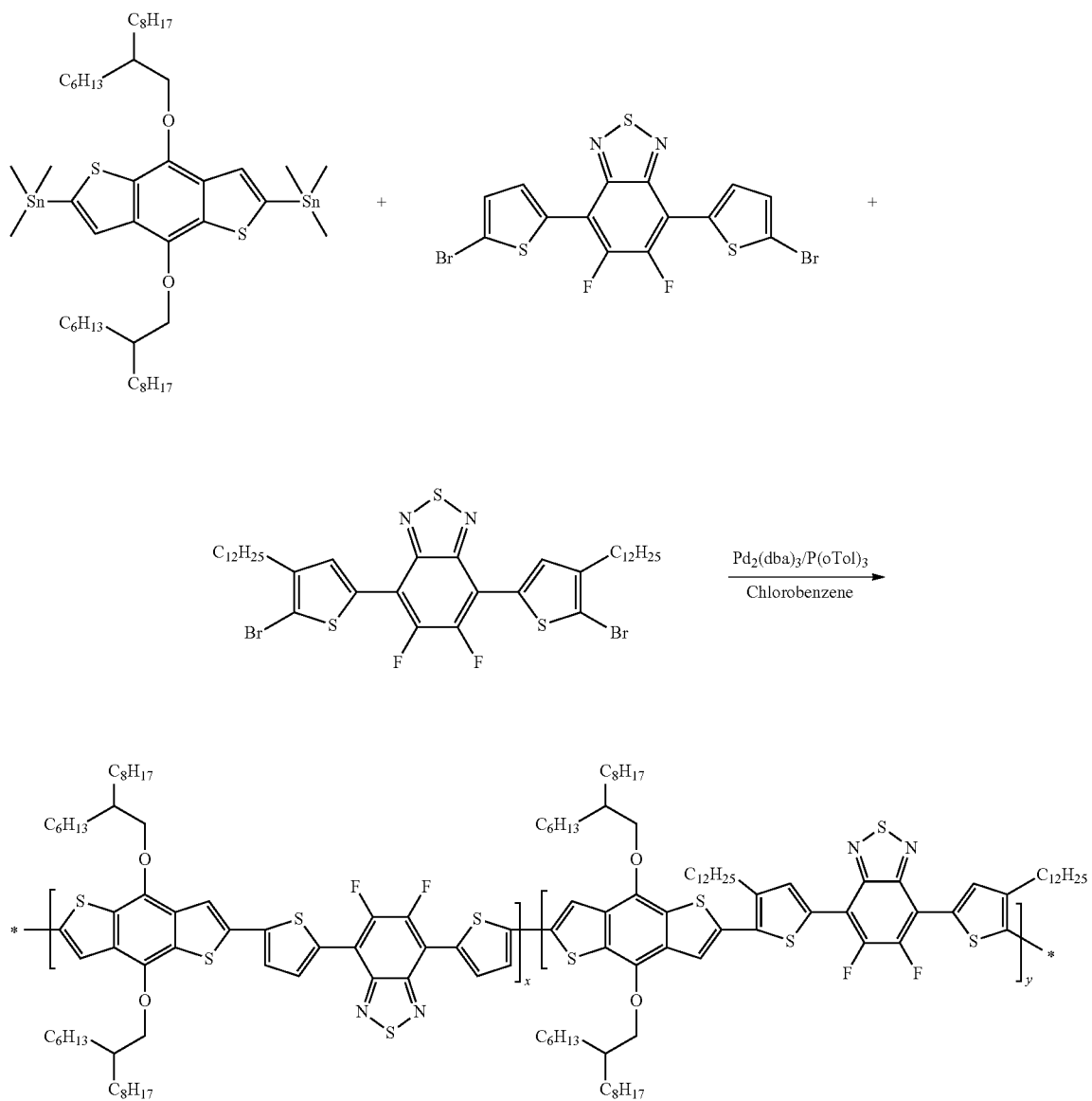

x = 0.3, y = 0.7

4,7-Bis-(5-bromo-4-dodecyl-thiophen-2-yl)-5,6-difluoro-benzo[1,2,5]thiadiazole (29.08 mg, 0.035 mmol), 4,7-bis-(5-bromo-thiophen-2-yl)-5,6-difluoro-benzo[1,2,5]thiadiazole (7.413 mg, 0.015 mmol), 4,8-bis-(2-hexyl-decyloxy)-2,6-bis-trimethylstannanyl-benzo[1,2-b:4,5-b']dithiophene (52.3 mg, 0.055 mmol), $Pd_2(dba)_3$ (1.83 mg, 2.0 μmol), and P(o-Tol)$_3$ (2.43 mg, 8.0 μmol) were combined in a 50-mL flask. The system was purged with argon before 10 mL of anhydrous chlorobenzene was added. The reaction mixture was heated at 135° C. for 18 hours. After cooling down to room temperature, the polymer was precipitated out from methanol and further purified using Soxhlet extraction with methanol, ethyl acetate, dichloromethane. The product was extracted with chloroform and weighed 48.0 mg (77.5% yield) after removal of the solvent and being dried in vacuo.

Example 2D

Preparation of Polymer 1D

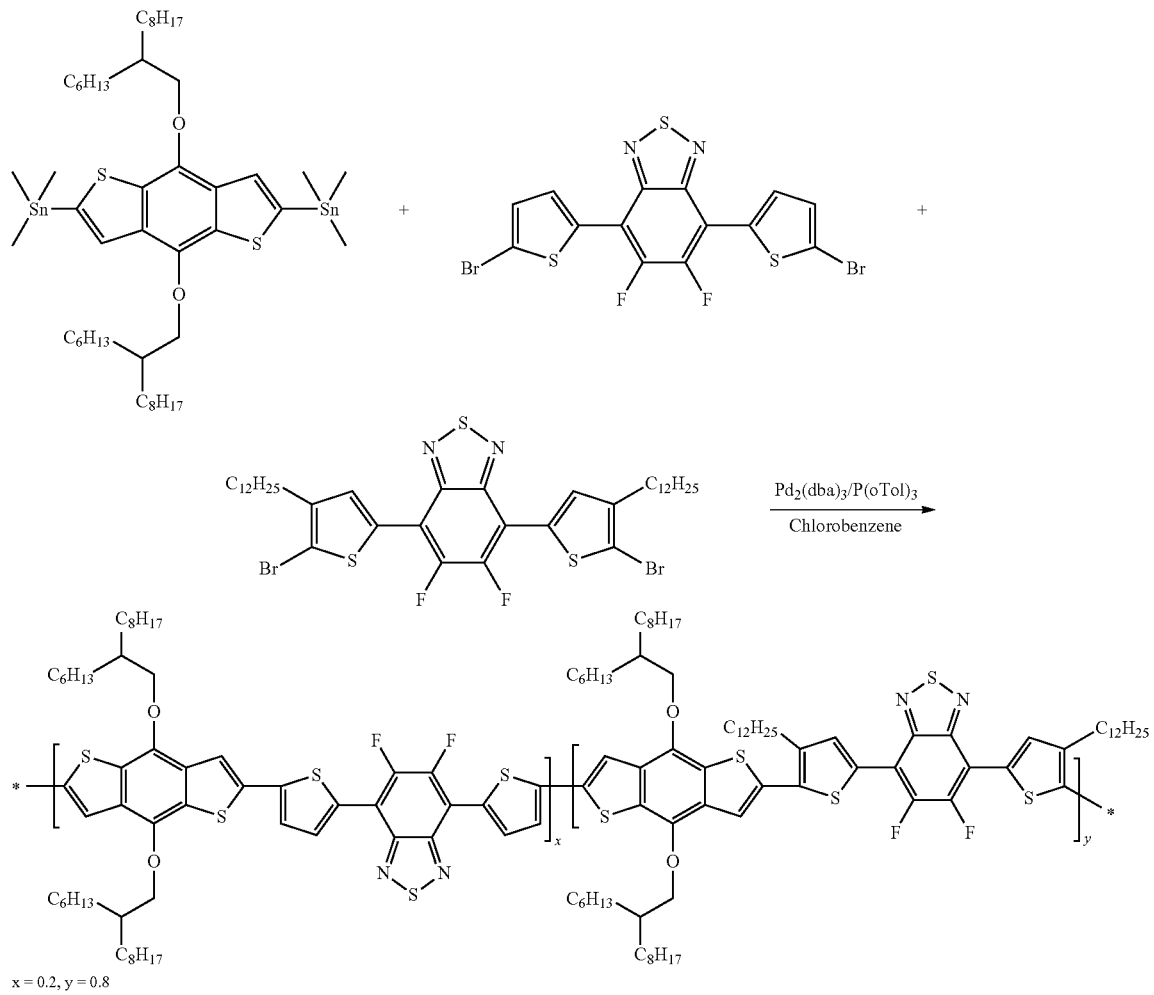

x = 0.2, y = 0.8

4,7-Bis-(5-bromo-4-dodecyl-thiophen-2-yl)-5,6-difluoro-benzo[1,2,5]thiadiazole (33.23 mg, 0.04 mmol), 4,7-bis-(5-bromo-thiophen-2-yl)-5,6-difluoro-benzo[1,2,5]thiadiazole (4.94 mg, 0.01 mmol), 4,8-bis-(2-hexyl-decyloxy)-2,6-bis-trimethylstannanyl-benzo[1,2-b:4,5-b']dithiophene (52.3 mg, 0.055 mmol), Pd$_2$(dba)$_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 135° C. for 18 hours. After cooling down to room temperature, the polymer was precipitated out from methanol and further purified using Soxhlet extraction with methanol, acetone, hexane, ethyl acetate, and dichloromethane. The product was extracted with chloroform and weighed 36.0 mg (60% yield) after removal of the solvent and being dried in vacuo.

Example 2E

Preparation of Polymer 2

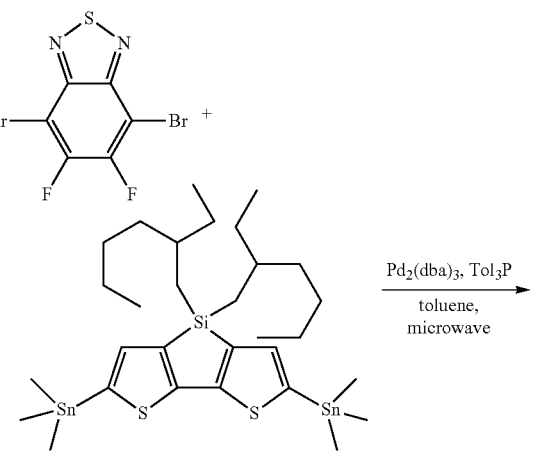

-continued

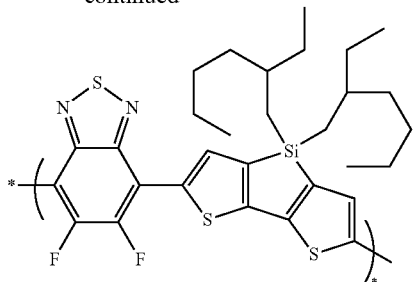

To a 10 mL microwave tube, 3,3'-(bis(2-ethylhexyl))silylene-5,5'-bis(trimethylstannyl)-2,2'-bithiophene (64.4 mg, 88.4 μmol), 4,7-dibromo-5,6-difluoro-benzo[1,2,5]thiadiazole (29.1 mg, 88.2 μmol), Pd$_2$(dba)$_3$ (4.0 mg, 5 mol %) and tri(o-tolyl)phosphine (5.4 mg, 20 mol %) were mixed in anhydrous toluene (2 mL) under argon. Then the tube was heated to 180° C. in 30 minutes and kept at this temperature for 270 minutes by the CEM Discover Microwave reactor. After cooling down, it was poured into MeOH (50 mL), filtered and Soxhlet extracted with MeOH, hexane, chloroform and chlorobenzene, successively. The chloroform extract was poured into MeOH (50 mL) and the solid was collected to give a maroon solid (18 mg, yield 35%), while the chlorobenzene extract was poured in MeOH (50 mL) to give another portion of the maroon solid (7 mg, 14% yield).

Example 2F

Preparation of Polymer 3

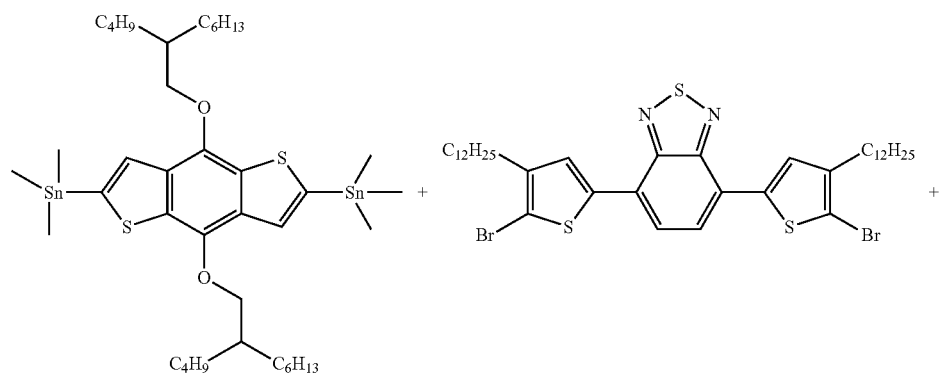

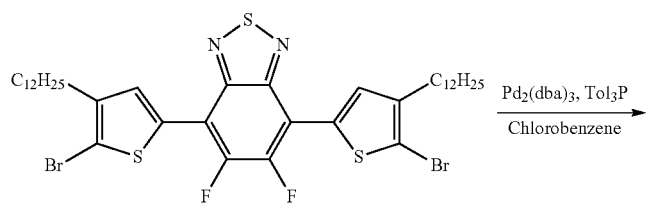

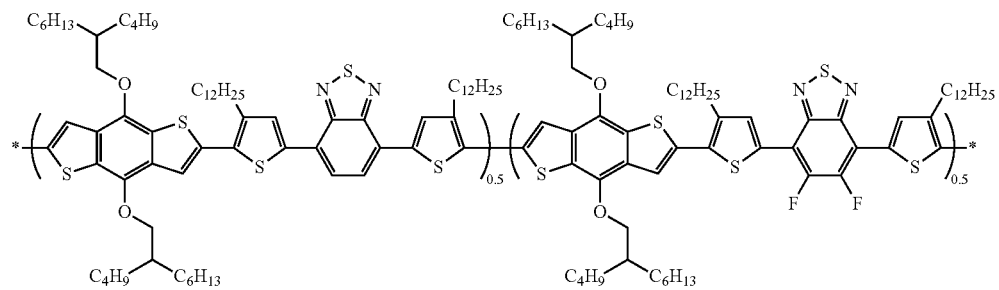

The reagents 4,8-bis-(2-butyloctyloxy)-2,6-bis-trimethyl-stannanyl-benzo[1,2-b:4,5-b']dithiophene (70 mg, 0.08 mmol), 4,7-bis-(5-bromo-4-dodecyl-thiophen-2-yl)-5,6-difluoro-benzo[1,2,5]thiadiazole (33.87 mg, 0.04 mmol), 4,7-bis-(5-bromo-4-dodecyl-thiophen-2-yl)-benzo[1,2,5]thiadiazole (31.45 mg, 0.04 mmol), Pd$_2$(dba)$_3$ (2.9 mg, 0.0032 mmol), and P(o-tolyl)$_3$ (3.85 mg, 0.0127 mmol) in anhydrous chlorobenzene (10 mL) were heated at 135° C. for 16 h under nitrogen in a sealed flask. After cooling to room temperature, the dark purple viscous reaction mixture was poured into methanol (100 mL). The final precipitated polymer was collected by vacuum filtration and dried in a vacuum oven to afford the polymer as a black solid (83.3 mg, 87% yield).

99.1 μmol), 4,7-dibromo-5,6-difluoro-benzo[1,2,5]thiadiazole (16.3 mg, 49.5 μmol), 4,7-dibromo-benzo[1,2,5]thiadiazole (14.6 mg, 49.5 μmol), Pd$_2$(dba)$_3$ (4.0 mg, 5 mol %) and tri(o-tolyl)phosphine (5.4 mg, 20 mol %) were mixed in anhydrous toluene (2 mL) under argon. Then the tube was kept at 140° C. for 2 minutes, 160° C. for 2 minutes, and then 180° C. for 120 minutes by the CEM Discover Microwave reactor. After cooling down, it was poured into MeOH (30 mL) and filtered. After drying under vacuum, a black solid was collected (47.3 mg, 84% yield).

Example 2G

Preparation of Polymer 4

Example 2H

Preparation of Polymer 5

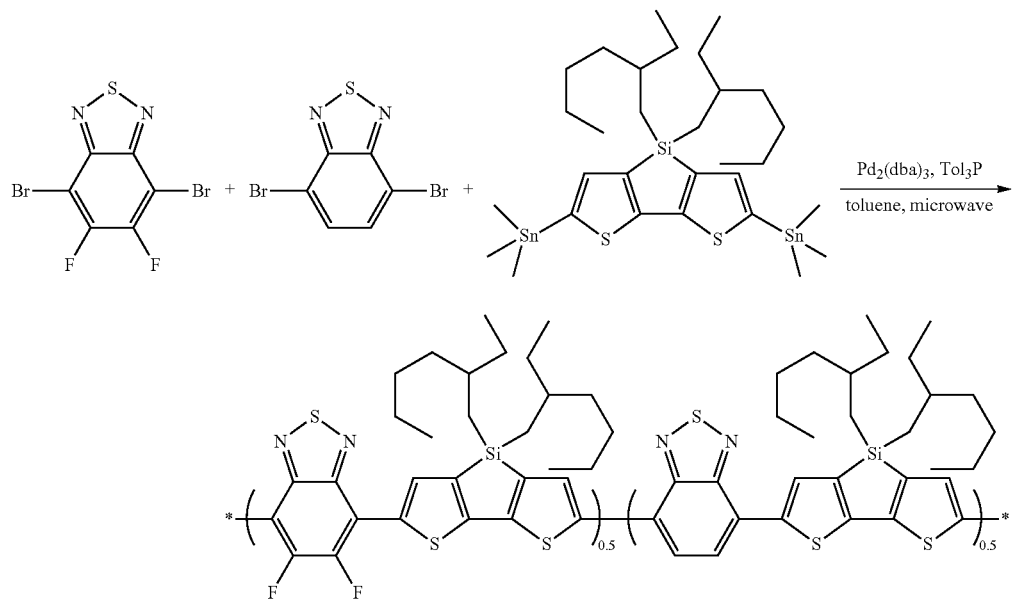

To a 10 mL microwave tube, 3,3'-(bis(2-ethylhexyl))silylene-5,5'-bis(trimethylstannyl)-2,2'-bithiophene (72.2 mg,

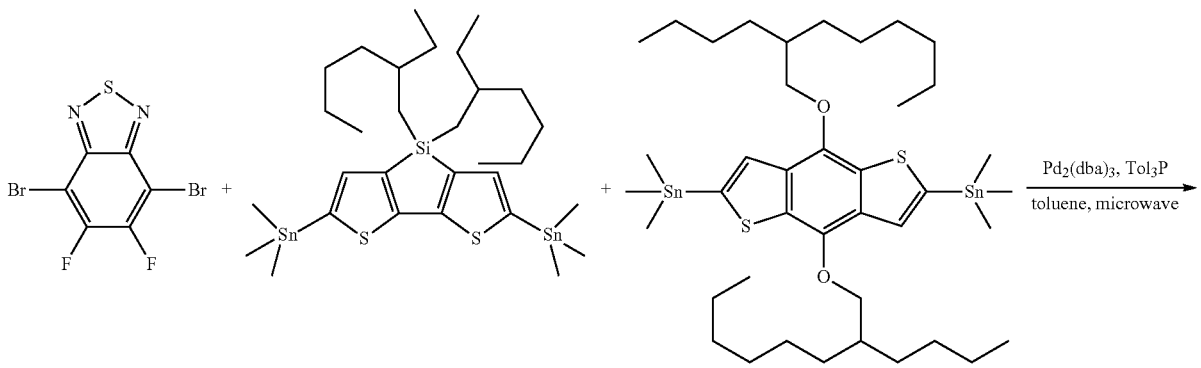

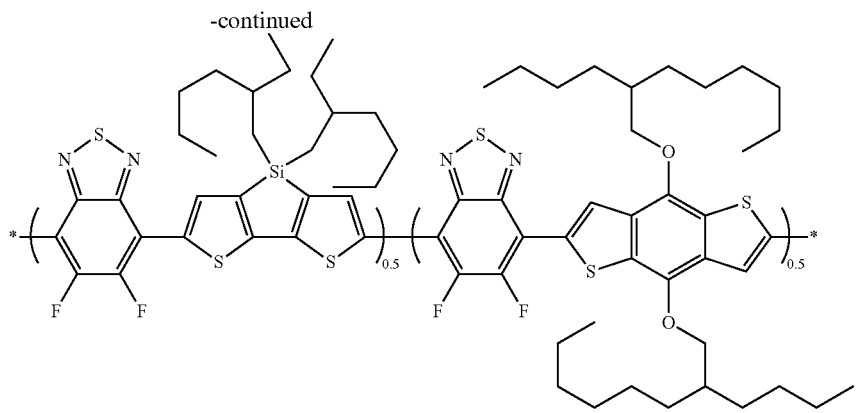

To a 10 mL microwave tube, 3,3'-(bis(2-ethylhexyl))si-lylene-5,5'-bis(trimethylstannyl)-2,2'-bithiophene (36.8 mg, 50.5 μmol), 4,7-dibromo-5,6-difluoro-benzo[1,2,5]thiadiazole (33.3 mg, 101 μmol), 4,8-bis(2-butyloctyloxy)-2,6-bis(trimethylstannyl)benzo[1,2-b:4,5-b']dithiophene (44.7 mg, 50.5 μmol), $Pd_2(dba)_3$ (4.6 mg, 5 mol %) and tri(o-tolyl)phosphine (6.1 mg, 20 mol %) were mixed in anhydrous toluene (2.5 mL) under argon. Then the tube was kept at 140° C. for 2 minutes, 160° C. for 2 minutes, and then 180° C. for 120 minutes by the CEM Discover Microwave reactor. After cooling down, it was poured into MeOH (30 mL) and filtered. After drying under vacuum, a maroon solid was collected (62.4 mg, 94% yield).

Example 21

Preparation of Polymer 6A

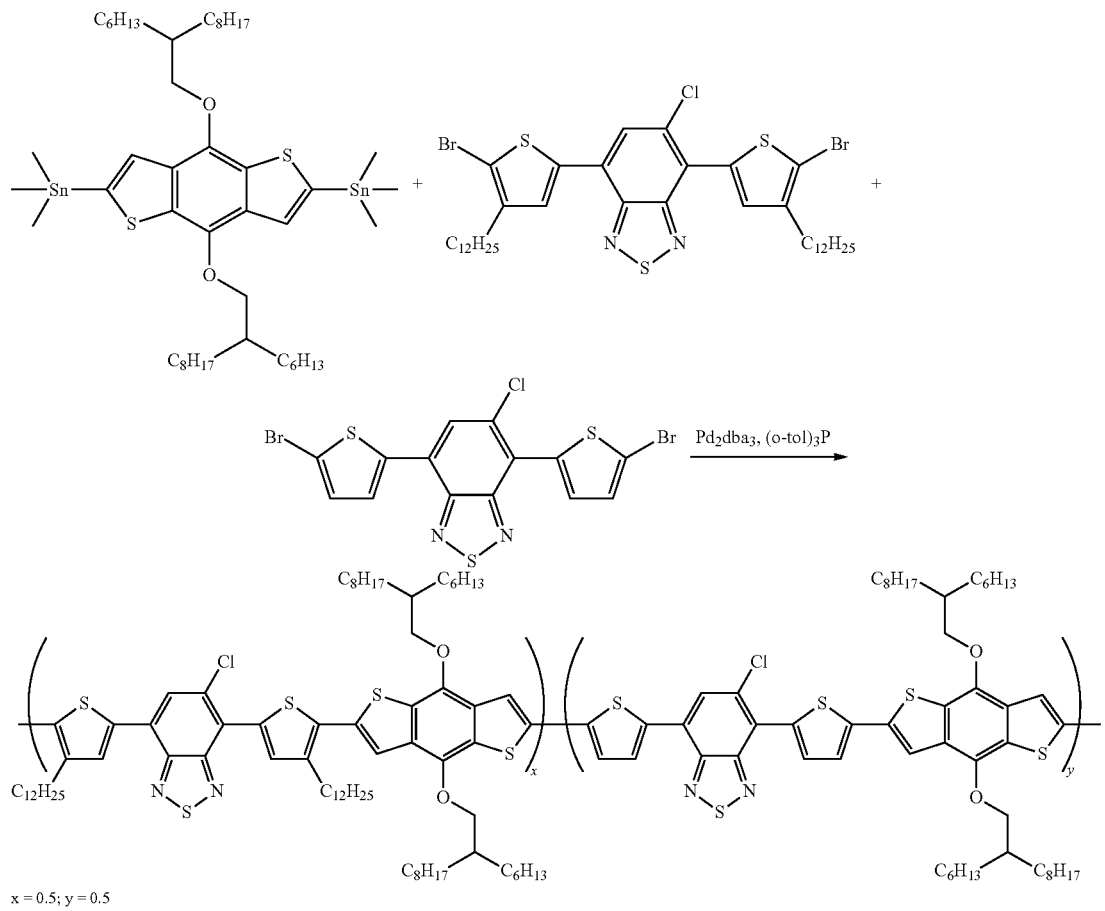

4,8-Bis[(2-hexyldecyl)oxy]-2,6-bis(1,1,1-trimethyl-stannanyl)benzo[1,2-b:4,5-b']dithiophene (110 mg, 0.110 mmol), 4,7-bis(5-bromo-2-thienyl)-5-chloro-2,1,3-benzothiadiazole (27.18 mg, 0.0552 mmol), 4,7-bis(5-bromo-4- dodecyl-2-thienyl)-5-chloro-2,1,3-benzothiadiazole (43.93 mg, 0.053 mmol), Pd$_2$ dba$_3$ (4.04 mg, 0.00441 mmol), and P(o-tol)$_3$ (10.75 mg, 0.0353 mmol) were placed in a Schlenk flask. The flask was degassed and backfilled with argon three times. Dry chlorobenzene (10 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally the polymer was extracted into chloroform. The chloroform solution was poured into methanol, and the precipitates were again collected by filtration, dried under vacuum to afford the polymer (94 mg, 72% yield).

Example 2J

Preparation of Polymer 6B 4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (27.10 mg, 0.055 mmol), 4,7-bis(5-bromo-4-dodecyl-2-thienyl)-5-chloro-2,1,3-benzothiadiazole (37.32 mg, 0.045 mmol), Pd$_2$ dba$_3$ (3.66 mg, 0.0042 mmol), and P(o-tol)$_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally the polymer was extracted into chloroform. The chloroform solution was poured into methanol, and the precipitates again were collected by filtration, then dried under vacuum to afford the polymer (102 mg, 86.4% yield).

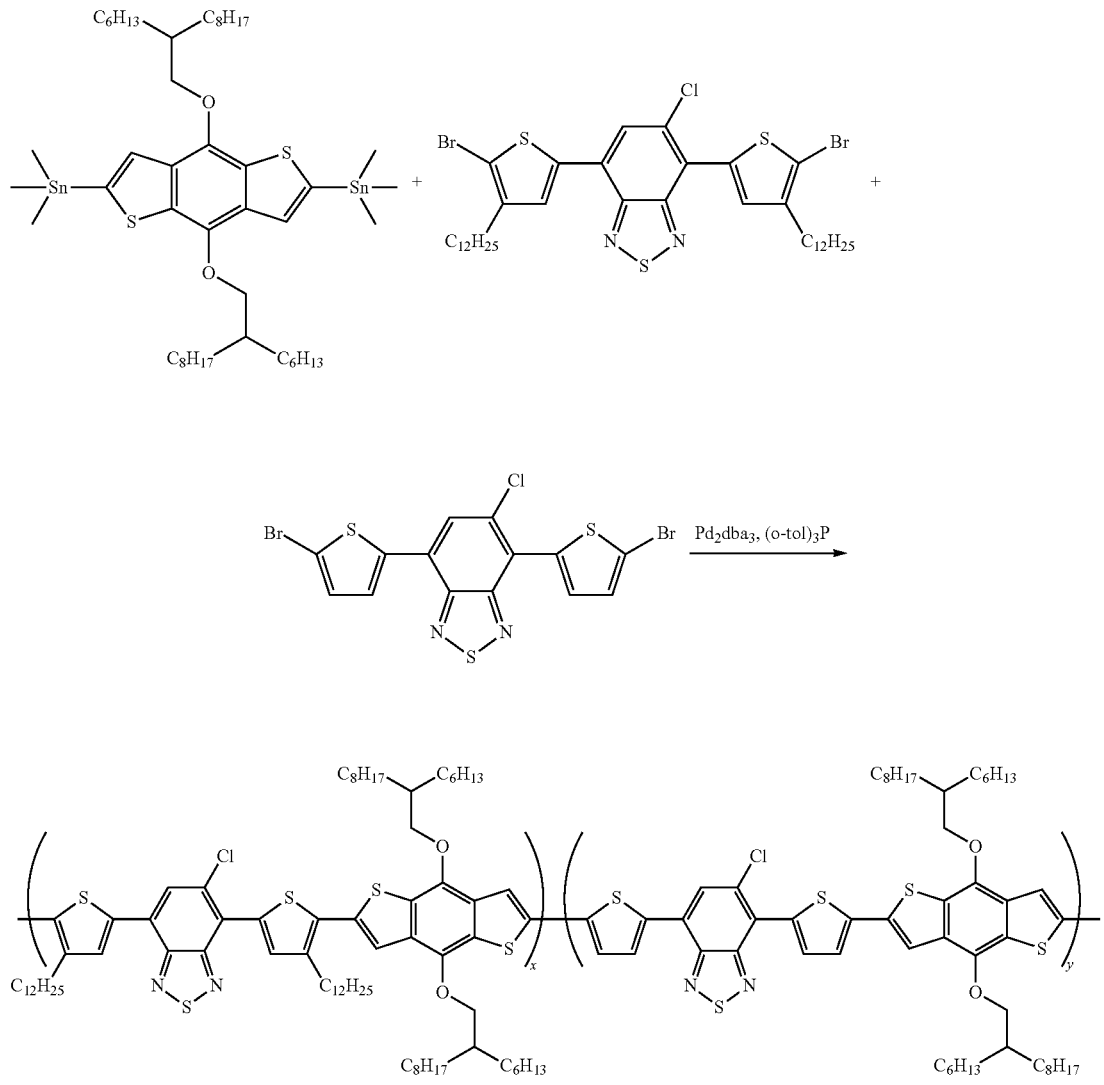

x = 0.45; y = 0.55

Example 2K

Preparation of Polymer 6C

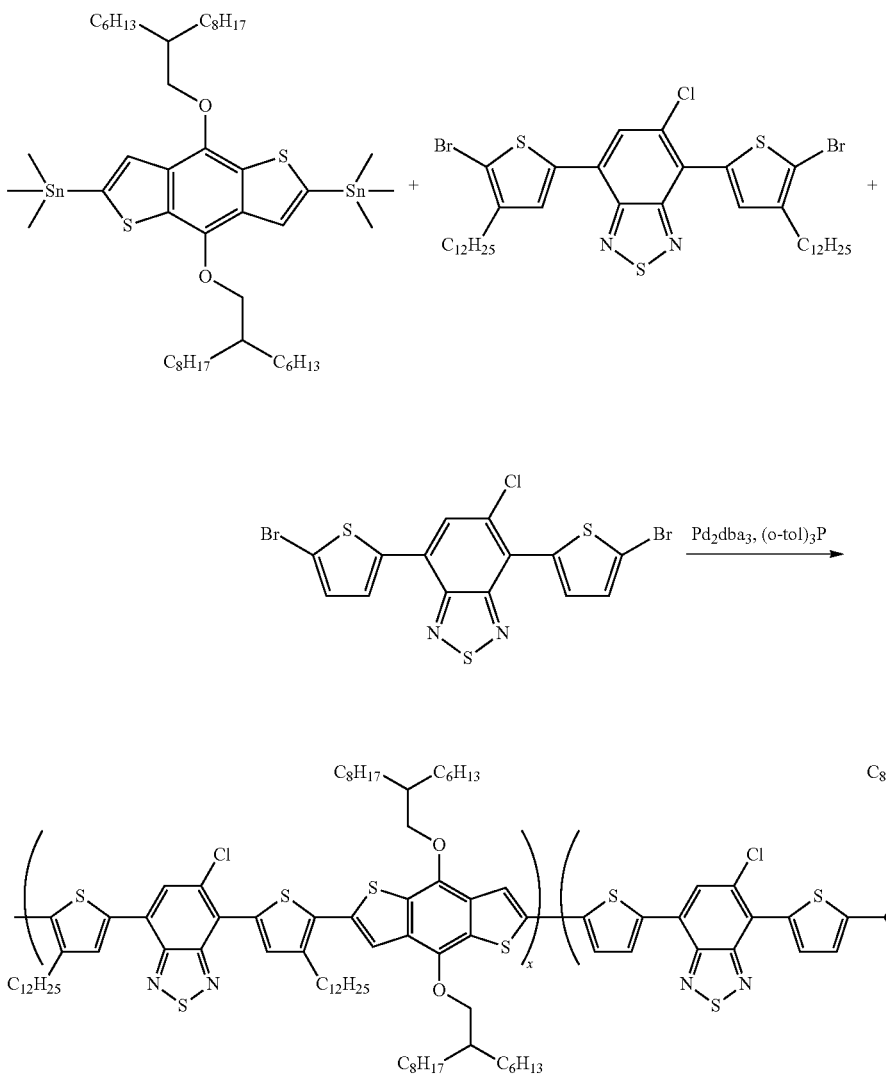

x = 0.40; y = 0.60

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (29.56 mg, 0.06 mmol), 4,7-bis(5-bromo-4-dodecyl-2-thienyl)-5-chloro-2,1,3-benzothiadiazole (33.17 mg, 0.04 mmol), $Pd_2 dba_3$ (3.66 mg, 0.0042 mmol), and $P(o-tol)_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally the polymer was extracted into chlorobenzene. The chlorobenzene solution was poured into methanol, and the precipitates again were collected by filtration, then dried under vacuum to afford the polymer (81.7 mg, 76.3% yield).

Example 2L

Preparation of Polymer 7

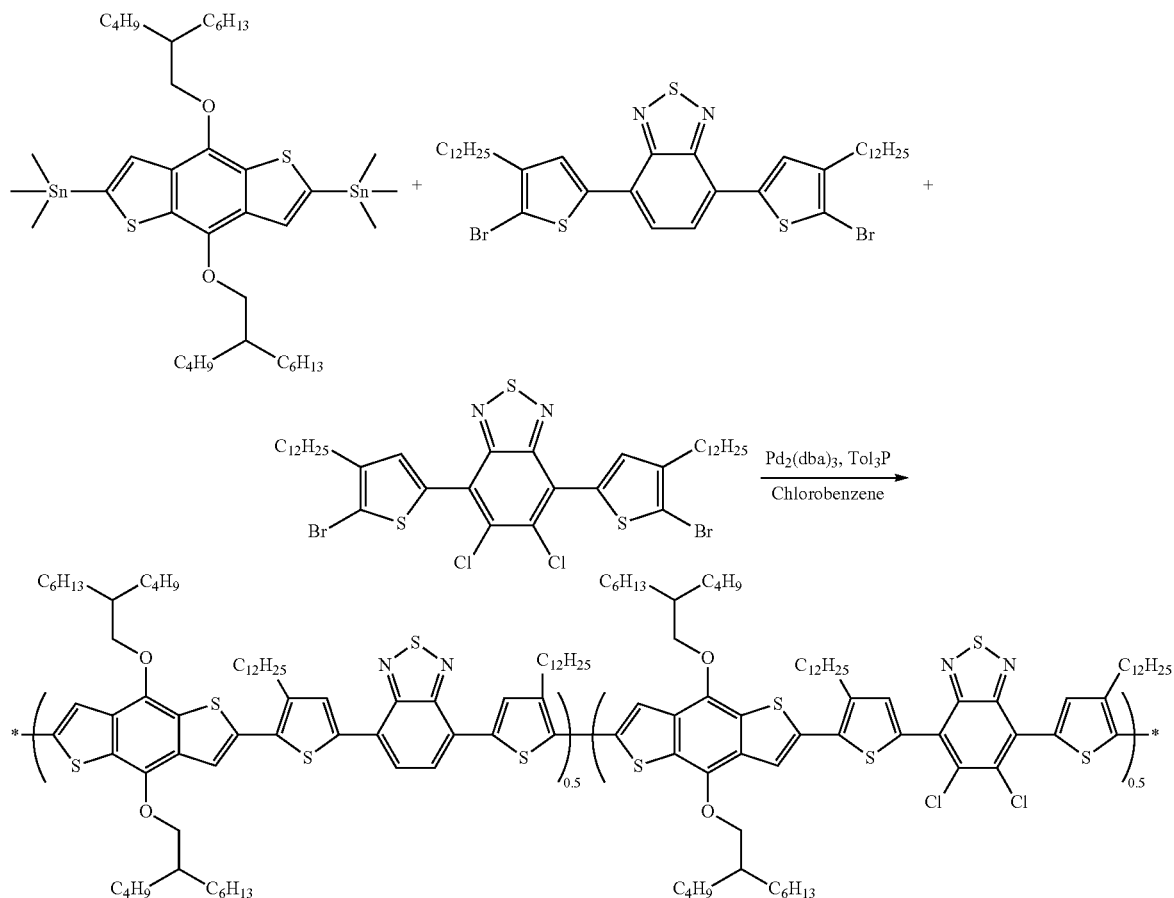

The reagents 4,8-bis-(2-butyloctyloxy)-2,6-bis-trimethylstannanyl-benzo[1,2-b:4,5-b']dithiophene (60.0 mg, 0.068 mmol), 4,7-bis-(5-bromo-4-dodecyl-thiophen-2-yl)-5,6-dichloro-benzo[1,2,5]thiadiazole (29.3 mg, 0.034 mmol), 4,7-bis-(5-bromo-4-dodecyl-thiophen-2-yl)-benzo[1,2,5]thiadiazole (26.9 mg, 0.034 mmol), $Pd_2(dba)_3$ (2.5 mg, 0.0027 mmol), and P(o-tolyl)$_3$ (3.3 mg, 0.011 mmol) in anhydrous chlorobenzene (10 mL) were heated at 135° C. for 16 hr under nitrogen in a sealed flask. After cooling to room temperature, the dark purple viscous reaction mixture was poured into methanol (100 mL). The final precipitated polymer was collected by vacuum filtration and dried in a vacuum oven to afford the polymer as a black solid (78 mg, 93.8% yield).

Example 2M

Preparation of Polymer 8

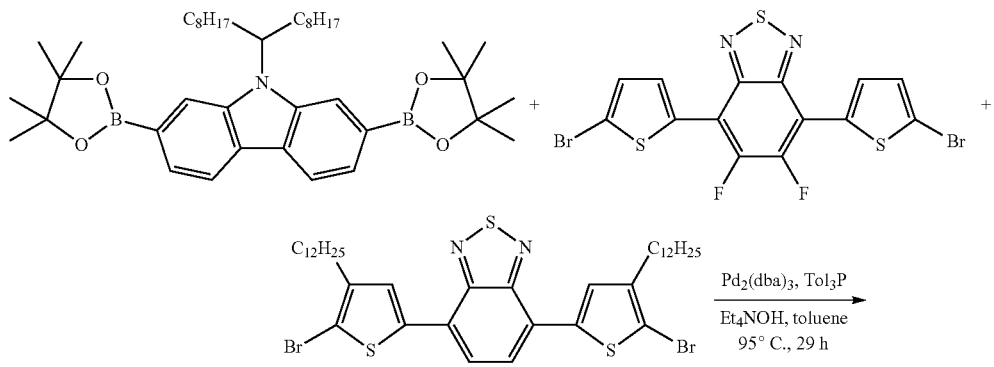

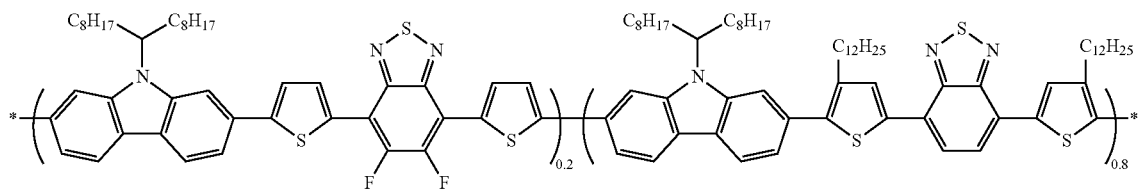

To a round bottom flask, 9-(1-octyl-nonyl)-2,7-bis-(4,4,5,5-tetramethyl-[1,3,2]dioxaborolan-2-yl)-9H-carbazole (65.8 mg, 0.1 mmol), 4,7-bis-(5-bromo-thiophen-2-yl)-5,6-difluoro-benzo[1,2,5]thiadiazole (9.9 mg, 0.02 mmol), 4,7-bis-(5-bromo-4-dodecyl-thiophen-2-yl)-benzo[1,2,5]thiadiazole (63.6 mg, 0.08 mmol), tetraethylammonium hydroxide solution (20% in $H_2O$) (0.6 mL), $Pd_2(dba)_3$ (4.6 mg, 5 mol %) and tri(o-tolyl)phosphine (6.1 mg, 20 mol %) were mixed in anhydrous toluene (4 mL) under argon. Then the mixture was stirred at 95° C. for 29 hours. After cooling down, it was poured into MeOH (30 mL) and filtered. After drying under vacuum, a reddish brown solid was collected (98 mg, quantitative yield).

Example 2N

Preparation of Polymer 9

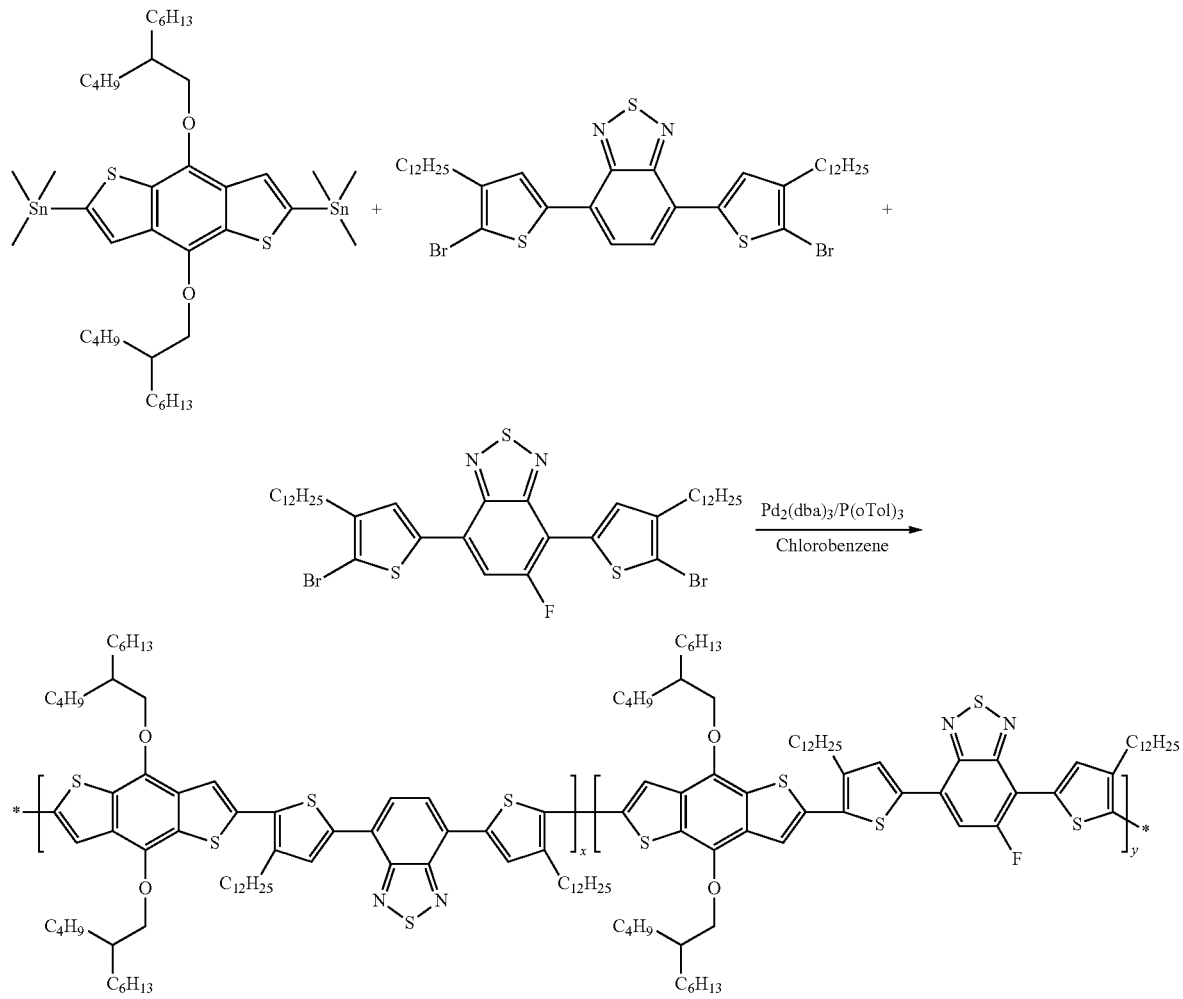

x = 0.5, y = 0.5

4,7-Bis-(5-bromo-4-dodecyl-thiophen-2-yl)-5-fluoro-benzo[1,2,5]thiadiazole (20.32 mg, 0.025 mmol), 4,7-bis-(5-bromo-4-dodecyl-thiophen-2-yl)-benzo[1,2,5]thiadiazole (19.87 mg, 0.025 mmol), 4,8-bis-(2-butyl-octyl)-2,6-bis-trimethylstannanyl-benzo[1,2-b:4,5-b']dithiophene (44.23 mg, 0.050 mmol), Pd$_2$(dba)$_3$ (1.83 mg, 2.0 µmol), and P(o-Tol)$_3$ (2.43 mg, 8.0 µmol) were combined in a 50-mL flask. The system was purged with argon before 10 mL of anhydrous chlorobenzene was added. The reaction mixture was heated at 132° C. for 22 hours. After cooling down to room temperature, the polymer was precipitated out from methanol and further purified by Soxhlet extraction with methanol, ethyl acetate, hexane, and dichloromethane. The product was extracted with dichloromethane and weighed 43 mg (71.6% yield) after removal of the solvent and drying in vacuo.

Example 2O

Preparation of Polymer 10A

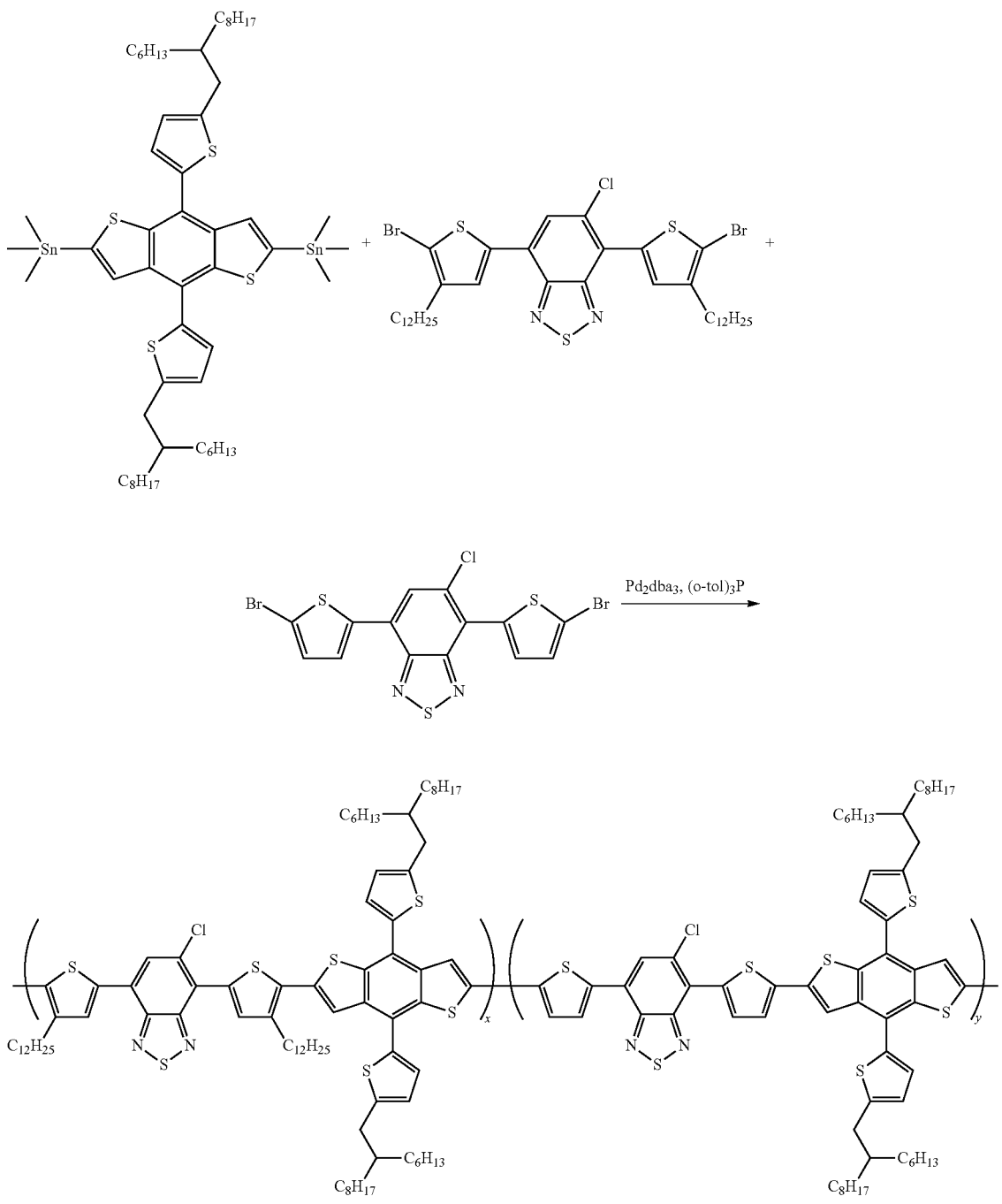

x = 0.45; y = 0.55

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (27.10 mg, 0.055 mmol), 4,7-bis(5-bromo-4-dodecyl-2-thienyl)-5-chloro-2,1,3-benzothiadiazole (37.32 mg, 0.045 mmol), Pd$_2$dba$_3$ (3.66 mg, 0.0042 mmol), and P(o-tol)$_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally, the polymer was extracted into chloroform. The chloroform solution was poured into methanol, and the precipitates again were collected by filtration, then dried under vacuum to afford the polymer (102 mg, 86.4% yield).

Example 2P

Preparation of Polymer 10B

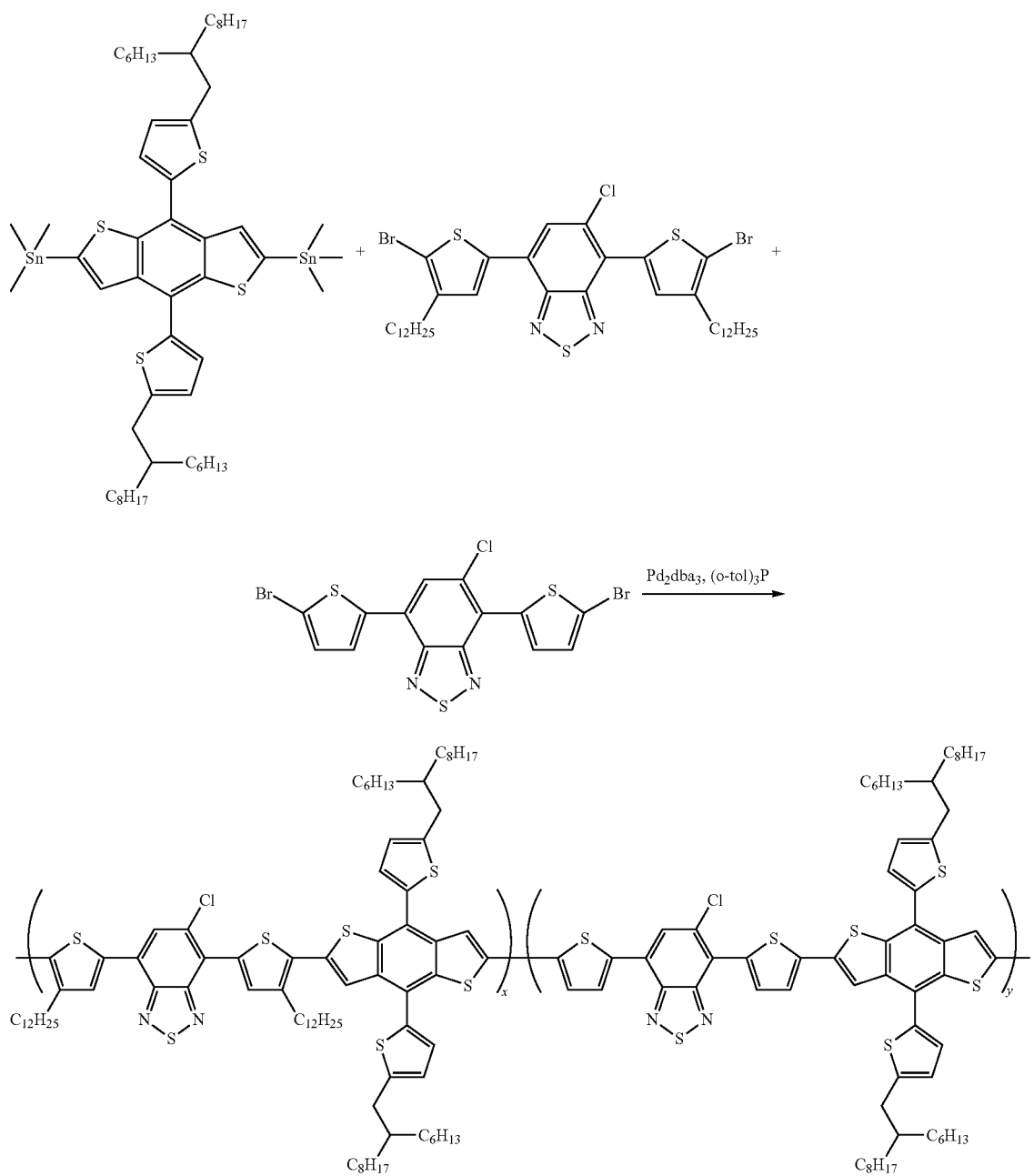

x = 0.35; y = 0.65

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (27.10 mg, 0.055 mmol), 4,7-bis(5-bromo-4-dodecyl-2-thienyl)-5-chloro-2,1,3-benzothiadiazole (37.32 mg, 0.045 mmol), $Pd_2$ $dba_3$ (3.66 mg, 0.0042 mmol), and P(o-tol)$_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally, the polymer was extracted into chloroform. The chloroform solution was poured into methanol, and the precipitates again were collected by filtration, then dried under vacuum to afford the polymer (102 mg, 86.4% yield).

Example 2Q

Preparation of Polymer 10C

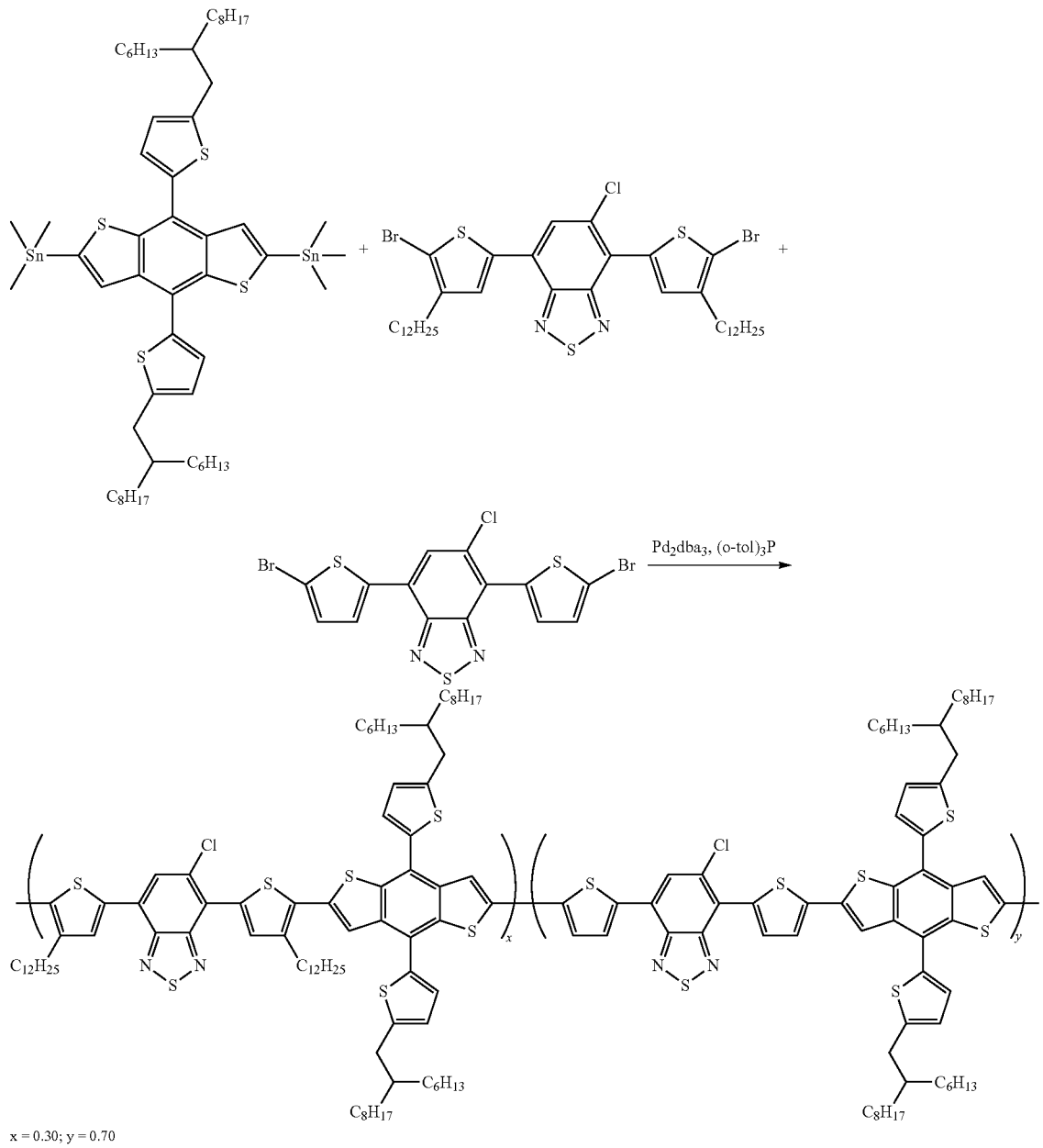

x = 0.30; y = 0.70

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5-chloro-2,1,3-benzothiadiazole (34.49 mg, 0.07 mmol), 4,7-bis(5-bromo-4-dodecyl-2-thienyl)-5-chloro-2,1,3-benzothiadiazole (24.88 mg, 0.03 mmol), $Pd_2$ $dba_3$ (3.66 mg, 0.0042 mmol), and P(o-tol)$_3$ (4.86 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally the polymer was extracted into chloroform. The chloroform solution was poured into methanol, and the precipitates were again collected by filtration, then dried under vacuum to afford the polymer (70.0 mg, 61.3% yield).

Example 2R

Preparation of Polymer 11

4,8-Bis[(2-hexyldecyl)oxy]-2,6-bis(1,1,1-trimethyl-stannanyl)benzo[1,2-b:4,5-b']dithiophene (104.66 mg, 0.105 mmol), 4,7-bis(5-bromo-2-thienyl)-5,6-difluoro-2,1,3-benzothiadiazole (24.71 mg, 0.050 mmol), 4,7-bis(5-bromo-4-dodecyl-2-thienyl)-5,6-difluoro-2,1,3-benzothiadiazole (41.54 mg, 0.050 mmol), $Pd_2 dba_3$ (3.66 mg, 0.0042 mmol), and $P(o-tol)_3$ (9.76 mg, 0.0336 mmol) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichlo-

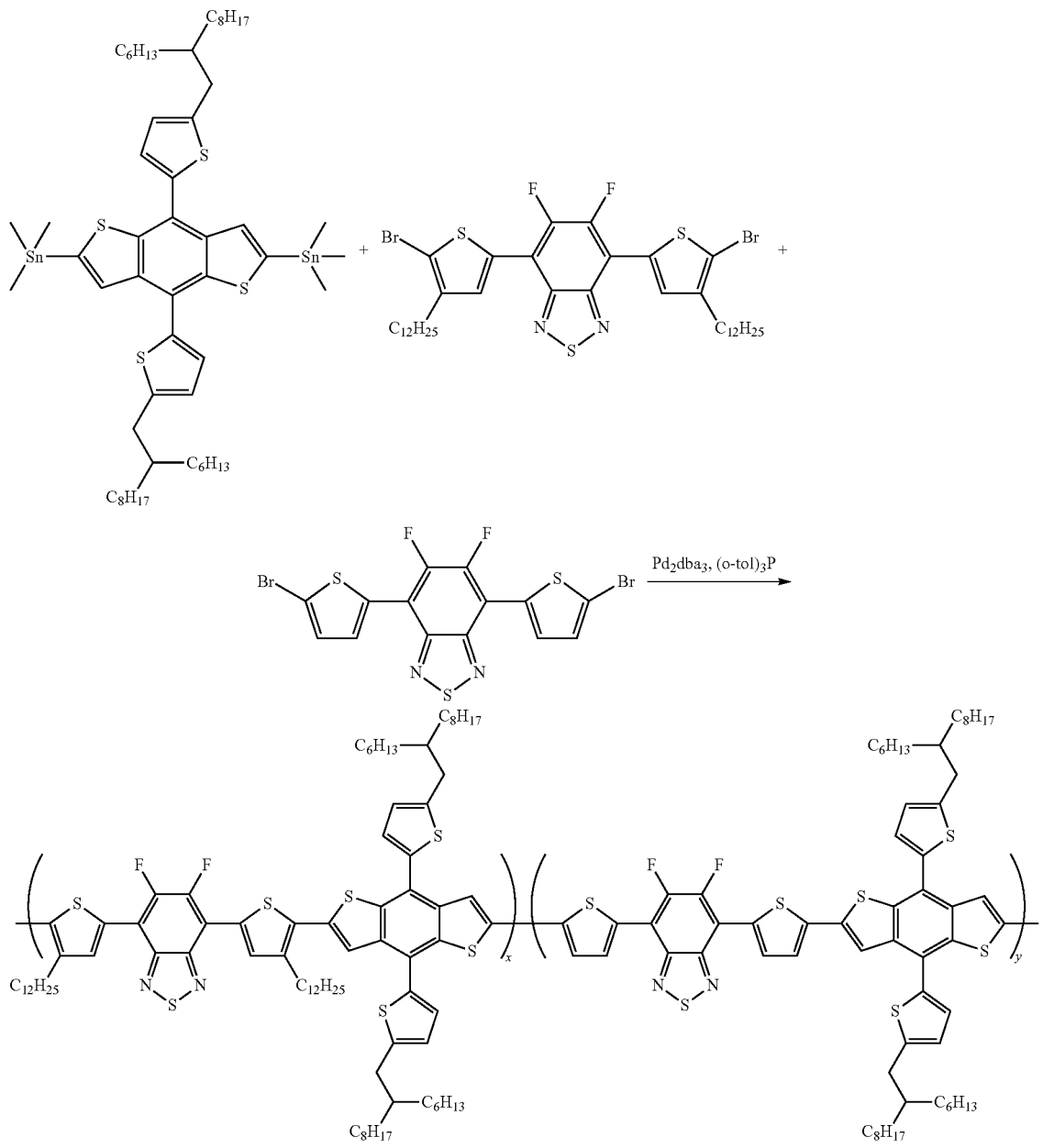

x = 0.50; y = 0.50 romethane for 18 hours. Finally, the polymer was extracted into chloroform. The chloroform solution was poured into methanol, and the precipitates again were collected by filtration, then dried under vacuum to afford the polymer (52 mg, 39.5% yield).

Example 2S

Preparation of Polymer 12

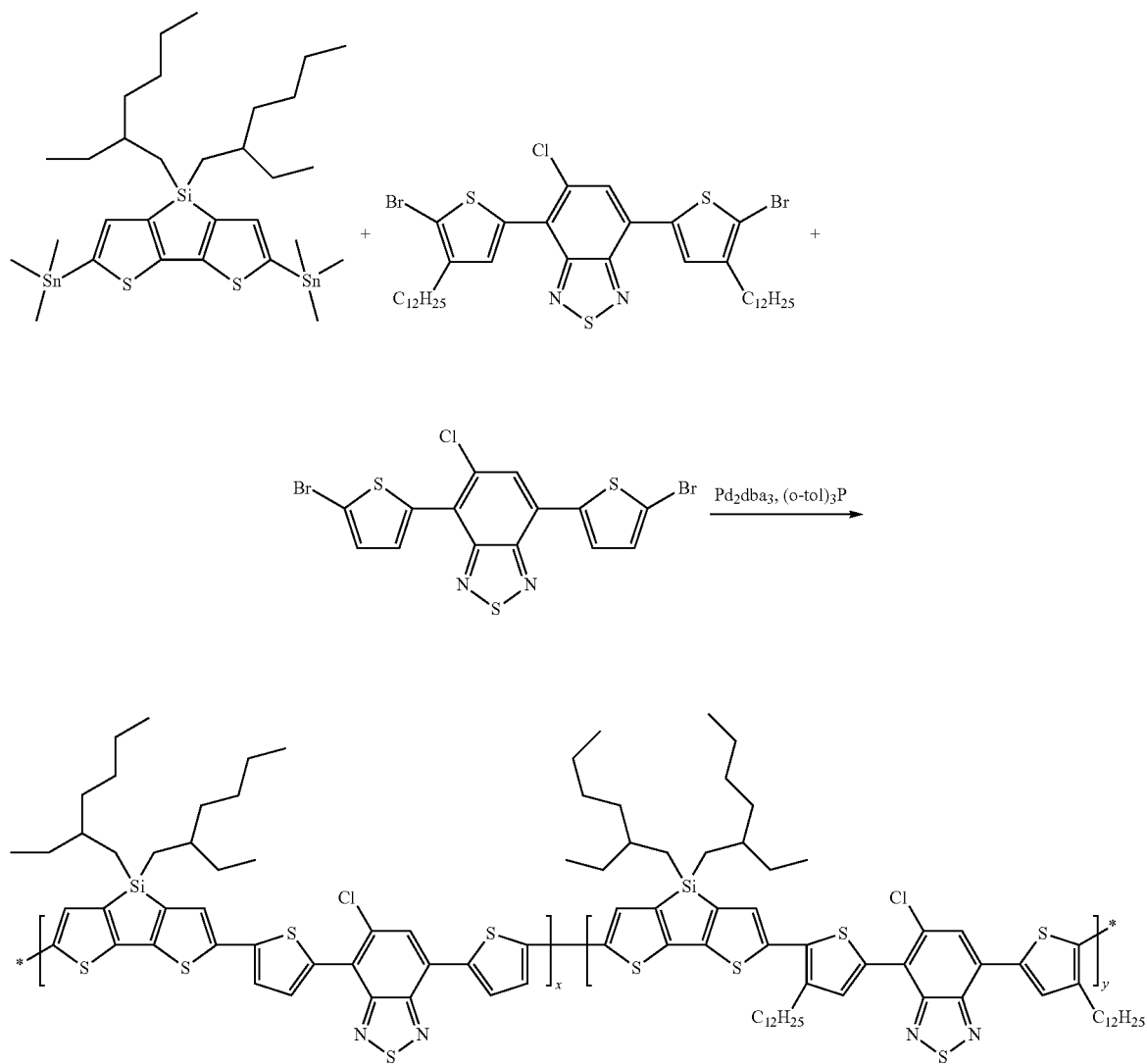

x = 0.5, y = 0.5

7,7-Bis-(2-ethyl-hexyl)-2,5-bis-trimethylstannanyl-7H-3,4-dithia-7-sila-cyclopenta[a]pentalene (83.6 mg, 0.112 mmol), 4,7-bis(5-bromo-2-thienyl)-5-chloro-2,1,3-benzothiadiazole (29.00 mg, 0.059 mmol), 4,7-bis(5-bromo-4-dodecyl-2-thienyl)-5-chloro-2,1,3-benzothiadiazole (39.93 mg, 0.048 mmol), $Pd_2 dba_3$ (3.92 mg), and $P(o\text{-tol})_3$ (5.20 mg) were placed in a Schlenk flask. The flask was degassed and backfilled with argon three times. Dry chlorobenzene (20 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally, the polymer was extracted into chloroform. The chloroform solution was poured into methanol, and the precipitates again were collected by filtration, then dried under vacuum to afford the polymer (75 mg, 72.8%).

Example 2T

Preparation of Polymer 13

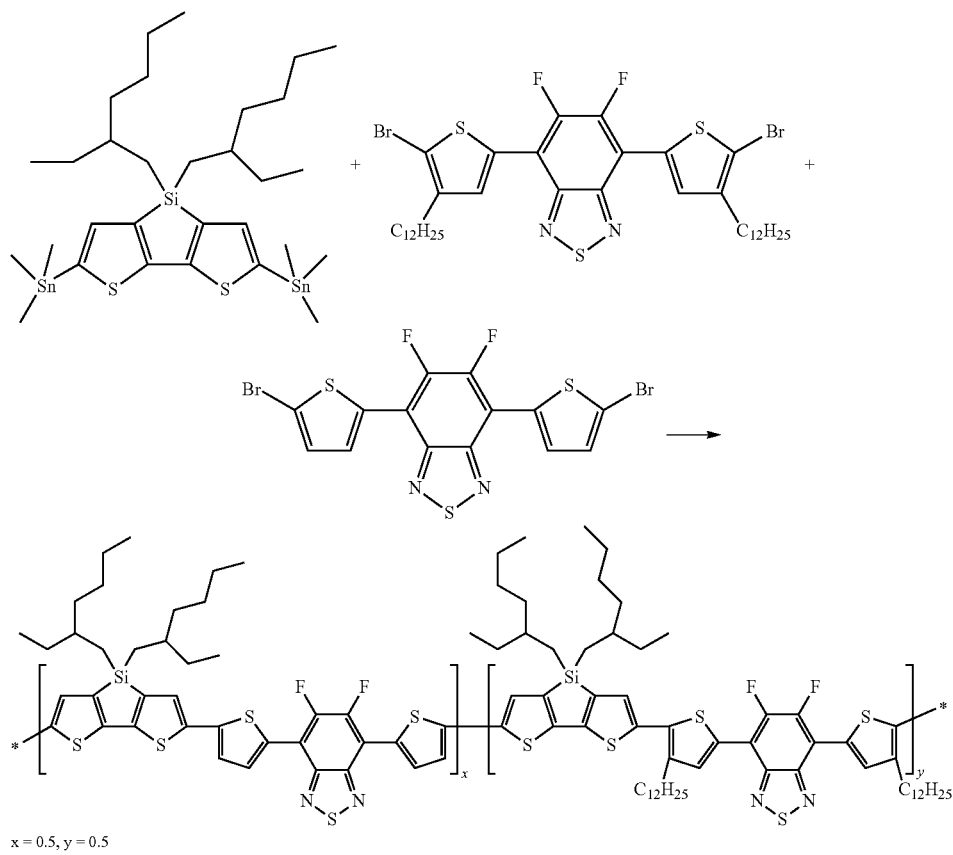

x = 0.5, y = 0.5

7,7-Bis-(2-ethyl-hexyl)-2,5-bis-trimethylstannanyl-7H-3,4-dithia-7-sila-cyclopenta[a]pentalene (59.55 mg, 0.08 mmol), 4,7-bis(5-bromo-2-thienyl)-5,6-difluoro-2,1,3-benzothiadiazole (19.8 mg, 0.04 mmol,), 4,7-bis(5-bromo-4-dodecyl-2-thienyl)-5,6-difluoro-2,1,3-benzothiadiazole (33.2 mg, 0.04 mmol), $Pd_2\,dba_3$ (2.93 mg), and $P(o\text{-tol})_3$ (3.89 mg) were placed in a Schlenk flask. The flask was degassed and backfilled with argon three times. Dry chlorobenzene (16 mL) was injected and the reaction was heated to 130° C. for 18 hr. The reaction was cooled to room temperature and the contents of the flask was poured into methanol (100 mL). The precipitates were collected by filtration and the solids were extracted with methanol for 3 hours, ethyl acetate for 3 hours, then dichloromethane for 18 hours. Finally, the polymer was extracted into chloroform. The chloroform solution was poured into methanol, and the precipitates again were collected by filtration, dried under vacuum to afford the polymer (38 mg, 51.6%).

Example 3

Device Fabrication and Characterization

Photovoltaic devices incorporating conjugated polymers according to the present teachings were fabricated and characterized. Before device fabrication, the patterned ITO-coated glass substrates were cleaned by ultrasonic treatment in detergent, de-ionized water, acetone, and isopropyl alcohol sequentially, and UV-ozone treatment for 15 minutes. A PEDOT:PSS layer of about 40 nm thickness was spin-coated from an aqueous solution (HC Stark, Baytron AI 4083) onto ITO-coated glass substrates, followed by baking at 150° C. for 30 minutes in air. Solutions including both C60-PCBM (purchased from Nano-C) and a polymer according to the present teachings were prepared in various solvents and at various polymer:fullerene ratios. The polymer/PCBM solution was spin-coated on top of the PEDOT:PSS layer. Various layer thicknesses were tested. To complete the device fabrication, a thin layer (about 0.6 nm) of lithium fluoride (LiF) and a thin layer of aluminum (about 100 nm) were successively deposited thermally under vacuum of $\sim 10^{-6}$ Torr. The active area of the device was 0.93 $cm^2$. The devices were then encapsulated with a cover glass using EPO-TEK OG112-6 UV curable epoxy (Epoxy Technology) in the glove box.

The photovoltaic characteristics of the sample devices were tested in air. The current-voltage (I-V) curves were obtained by a Keithley 2400 source-measure unit. The photocurrent was measured under simulated AM1.5G irradiation (100 mW $cm^{-2}$) using a xenon-lamp-based solar simulator (Newport 91160A 300 W Class-A Solar Simulator, 2 inch by 2 inch uniform beam) with an air mass 1.5 global filter. The light intensity was set using a NREL calibrated silicon photodiode with a color filter. External quantum efficiency was measured using Newport's QE setup. Incident light from a xenon lamp (300 W) passing through a monochromator (Newport, Cornerstone 260) was focused on the active area of the cell. The output current was measured using a current pre-amplifier (Newport, 70710QE) and a lock-in amplifier (Newport, 70105 Dual channel Merlin). A calibrated silicon diode (Newport 70356) was used as a reference.

The results are reported in Table 1 below.

TABLE 1

Performance Data of Solar Cells Fabricated with Representative Polymers

| Material | $V_{oc}$ [V] | $J_{sc}$ [mA/cm$^2$] | FF [%] | Eff. [%] |
|---|---|---|---|---|
| Polymer 1B | 0.85 | 10.4 | 68.2 | 6.00 |
| Polymer 2 | 0.81 | 6.1 | 46.1 | 2.3 |
| Polymer 4 | 0.68 | 8 | 47.7 | 2.6 |
| Polymer 6A | 0.82 | 12.03 | 66.0 | 6.51 |
| Polymer 12 | 0.60 | 3.4 | 33.0 | 0.7 |
| Polymer 13 | 0.62 | 9.1 | 64.7 | 3.6 |

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. An electronic, optical or optoelectronic device comprising a polymeric semiconductor component, the polymeric semiconductor component comprising a polymer having the formula:

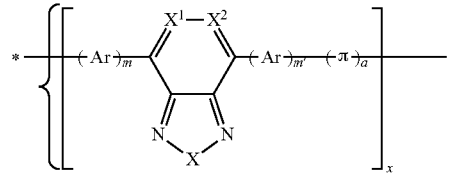

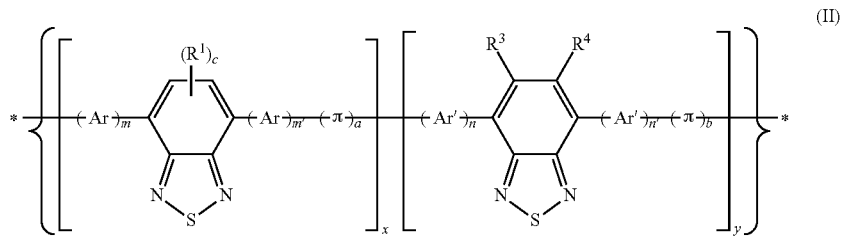

wherein:
Ar and Ar' are identical or different optionally substituted 5-8 membered heteroaryl groups;
π and π' are identical or different optionally substituted 11-24 membered polycyclic aryl or heteroaryl groups;
$X^1$ and $X^2$ independently are selected from the group consisting of N, CH and $CR^1$, provided that one of $X^1$ and $X^2$ is $CR^1$ and the other of $X^1$ and $X^2$ is N or CH;
$X^3$ is N or $CR^3$;
$X^4$ is N or $CR^4$;
$R^1$ is selected from selected from the group consisting of F, Cl, —C(O)$R^5$, —CF$_2R^5$, and CN;
$R^3$ and $R^4$ independently are selected from selected from the group consisting of H, F, Cl, —C(O)$R^5$, CN, $R^5$, O$R^5$, and S$R^5$, wherein $R^5$, at each occurrence, independently is selected from selected from the group consisting of a $C_{1-20}$ alkyl group and a $C_{1-20}$ haloalkyl group;
X is selected from the group consisting of O, S, and N$R^6$, wherein $R^6$ is H or a $C_{1-20}$ alkyl group;
a and b independently are 0 or 1;
m and m' are 0, 1, or 2;
n and n' are 0, 1, or 2, provided that m and m' are 1 and/or n and n' are 1, and/or at least one of a and b is 1;
x and y are real numbers representing mole fractions, wherein 0.05≤x≤0.95, 0.05≤y≤0.95, and the sum of x and y is about 1; and
wherein the polymer has a molecular weight in the range of about 3,000 to about 300,000.

2. The device of claim 1, wherein the polymer is represented by formula (II) or (III):

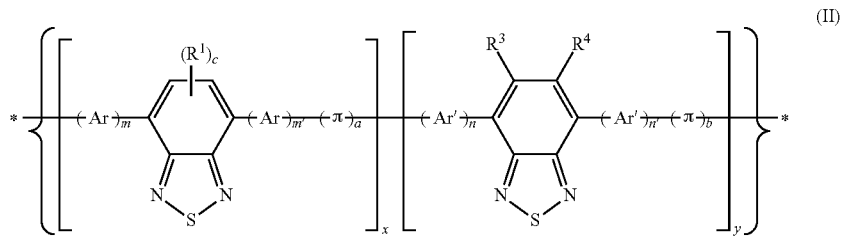

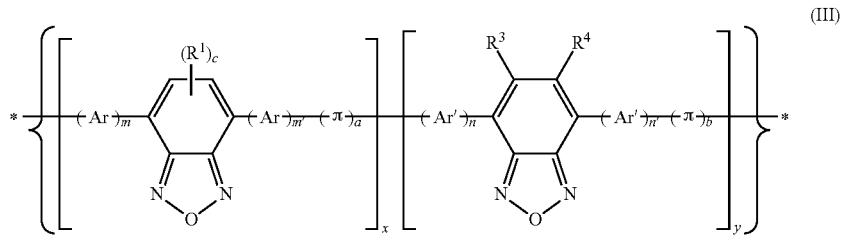

wherein c is 1; and Ar, Ar', π, π', $R^1$, $R^3$, $R^4$, m, m', n, n', a, b, x and y are as defined in claim 1.

3. The device of claim 1, wherein the polymer is represented by formula (Va), (Vb), (Vc), (Vd), (Ve) or (Vf):

4. The device of claim 1, wherein Ar and Ar' if both present are different and/or π and π' are different, and a, b, m, m', n, n', x and y are as defined in claim 1.

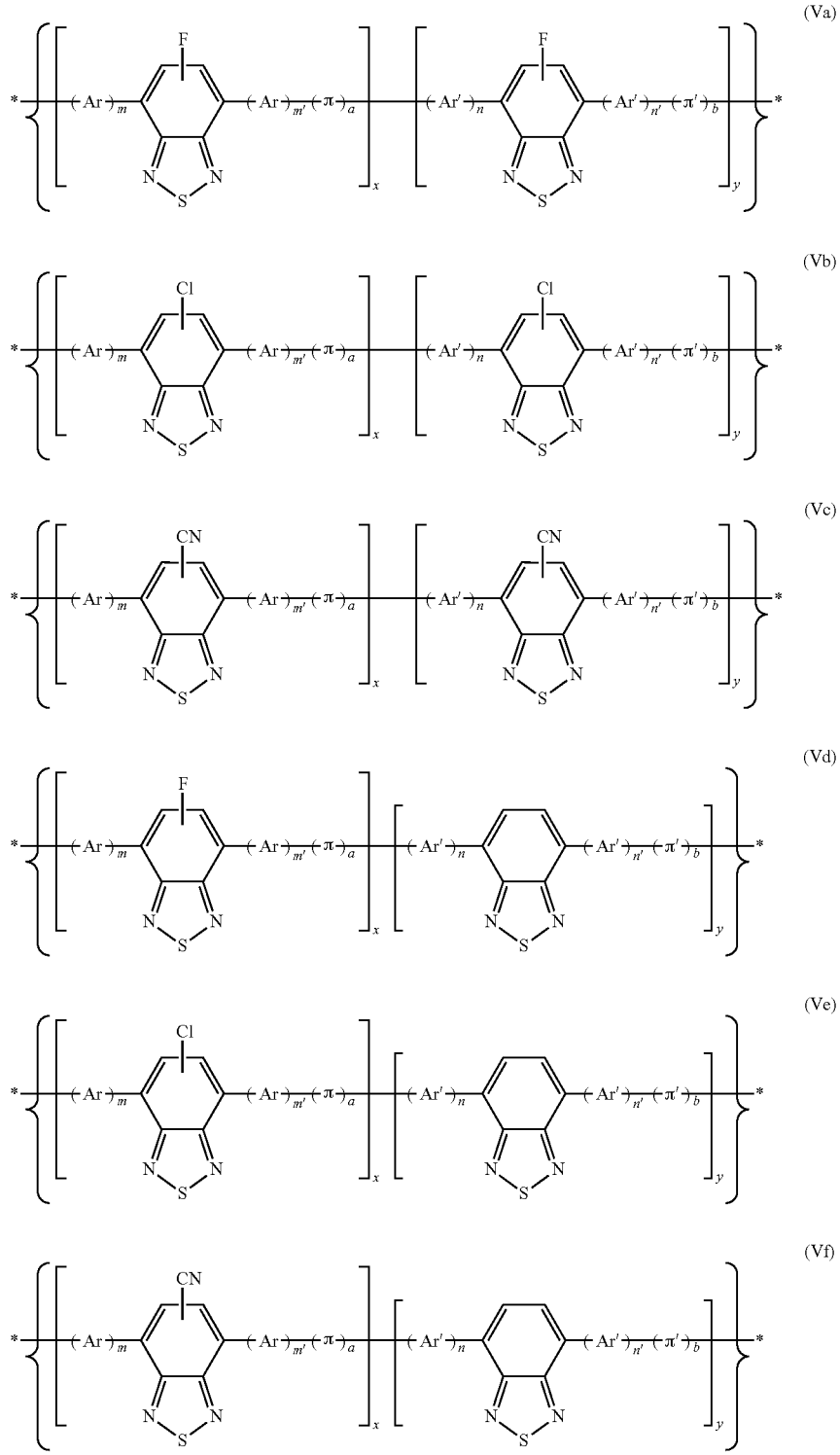

wherein Ar, Ar', π, π', m, m', n, n', a, b, x and y are as defined in claim 1.

5. The device of claim 1, wherein the polymer is represented by formula (VII):

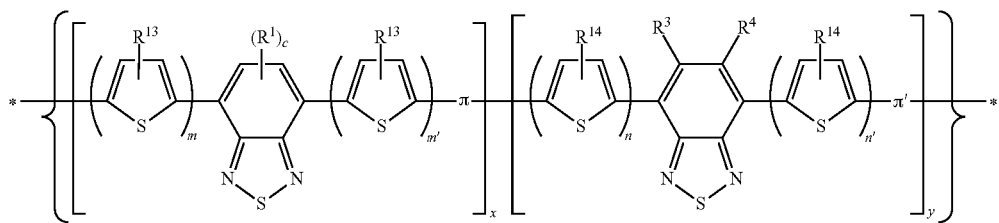

wherein:
R¹³ and R¹⁴ independently are selected from the group consisting of H, R¹⁵, OR¹⁵, and SR¹⁵, wherein R¹⁵, at each occurrence, independently is selected from the group consisting of a $C_{1-20}$ alkyl group, a $C_{1-20}$ alkenyl group, and a $C_{1-20}$ haloalkyl group;
c is 1; and
π, π', R¹, R³, R⁴, m, m', n, n', x and y are as defined in claim 1.

6. The device of claim 1, wherein π and π' are optionally substituted 11-24 membered polycyclic heteroaryl groups having the formula:

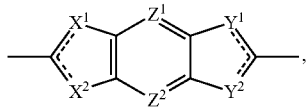

wherein:
X¹ and X² independently are selected from the group consisting of S, O, NR⁷, CH=CH, and CR⁸, provided that one of X¹ and X² is selected from the group consisting of S, O, CH=CH, and NR⁷, and the other X¹ and X² is CR⁸;
Y¹ and Y² independently are selected from the group consisting of S, O, NR⁷, CH=CH, and CR⁸, provided that one of Y¹ and Y² is selected from the group consisting of S, O, CH=CH, and NR⁷, and the other Y¹ and Y² is CR⁸;
Z¹ and Z² independently are selected from the group consisting of CR⁹, SiR¹⁰R¹¹, NR¹², and a covalent bond, provided that at least one of Z¹ and Z² is CR⁹, SiR¹⁰R¹¹, or NR¹²;
R⁷, at each occurrence, independently is selected from H or a $C_{1-20}$ alkyl group;
R⁸ and R⁹ independently are H, R¹², OR¹², SR¹², or -Het-R¹², wherein -Het- is a divalent 5-8 membered aryl or heteroaryl group;
R¹⁰ and R¹¹ independently are selected from the group consisting of a $C_{1-20}$ alkyl group, a $C_{1-20}$ alkenyl group, and a $C_{1-20}$ haloalkyl group; and R¹², at each occurrence, independently is selected from the group consisting of a $C_{1-20}$ alkyl group, a $C_{1-20}$ alkenyl group, and a $C_{1-20}$ haloalkyl group.

7. The device of claim 6, wherein π and π' independently are selected from the group consisting of:

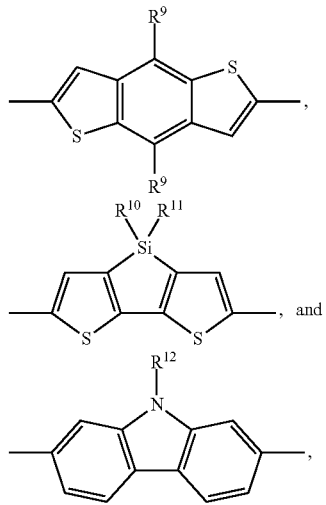

wherein R⁹ is selected from the group consisting of a $C_{6-20}$ alkyl group, a —O—$C_{6-20}$ alkyl group, a —O—$C_{6-20}$ alkenyl group, a —O—$C_{6-20}$ haloalkyl group, a —S—$C_{6-20}$ alkyl group, a —S—$C_{6-20}$ alkenyl group, a —S—$C_{6-20}$ haloalkyl group, a -thienyl-$C_{6-20}$ alkyl group, a -thienyl-$C_{6-20}$ alkenyl group, and a -thienyl-$C_{6-20}$ haloalkyl group; and each of R¹⁰, R¹¹, and R¹² independently is selected from the group consisting of a $C_{6-20}$ alkyl group, a $C_{6-20}$ alkenyl group, and a $C_{6-20}$ haloalkyl group.

8. The device of claim 1, wherein the polymer is represented by formula (IX):

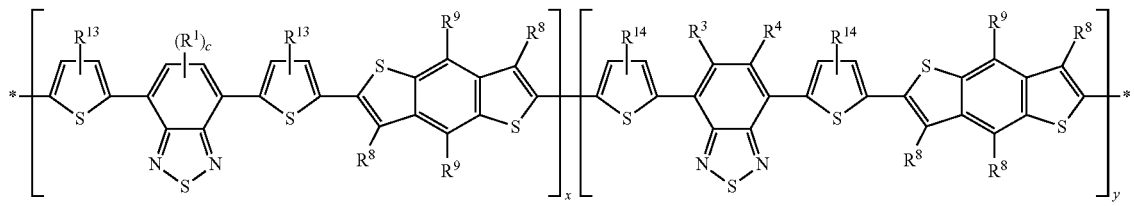

$R^8$ and $R^9$ independently are H, $R^{15}$, $OR^{15}$, $SR^{15}$ or -Het-$R^{15}$, wherein -Het- is a divalent 5-8 membered aryl or heteroaryl group; provided that at least one of $R^8$ and $R^9$ is not H;

$R^{13}$ and $R^{14}$ independently are selected from the group consisting of H, $R^{15}$, $OR^{15}$, and $SR^{15}$;

$R^{15}$, at each occurrence, independently is selected from the group consisting of a $C_{1-20}$ alkyl group, a $C_{1-20}$ alkenyl group, and a $C_{1-20}$ haloalkyl group;

c is 1; and $R^1$, $R^3$, $R^4$, x and y are as defined in claim 1.

9. The device of claim 1, wherein the repeating unit comprising x mole fraction of the polymer and the repeating unit comprising y mole fraction of the polymer are different, and wherein $0.3 \leq x \leq 0.7$ and $0.3 \leq y \leq 0.7$, and wherein the sum of x and y is about 1.

10. The device of claim 9, wherein the repeating unit comprising x mole fraction of the polymer and the repeating unit comprising y mole fraction of the polymer are repeated in a random manner.

11. The device of claim 1, wherein the polymer has a formula selected from the group consisting of:

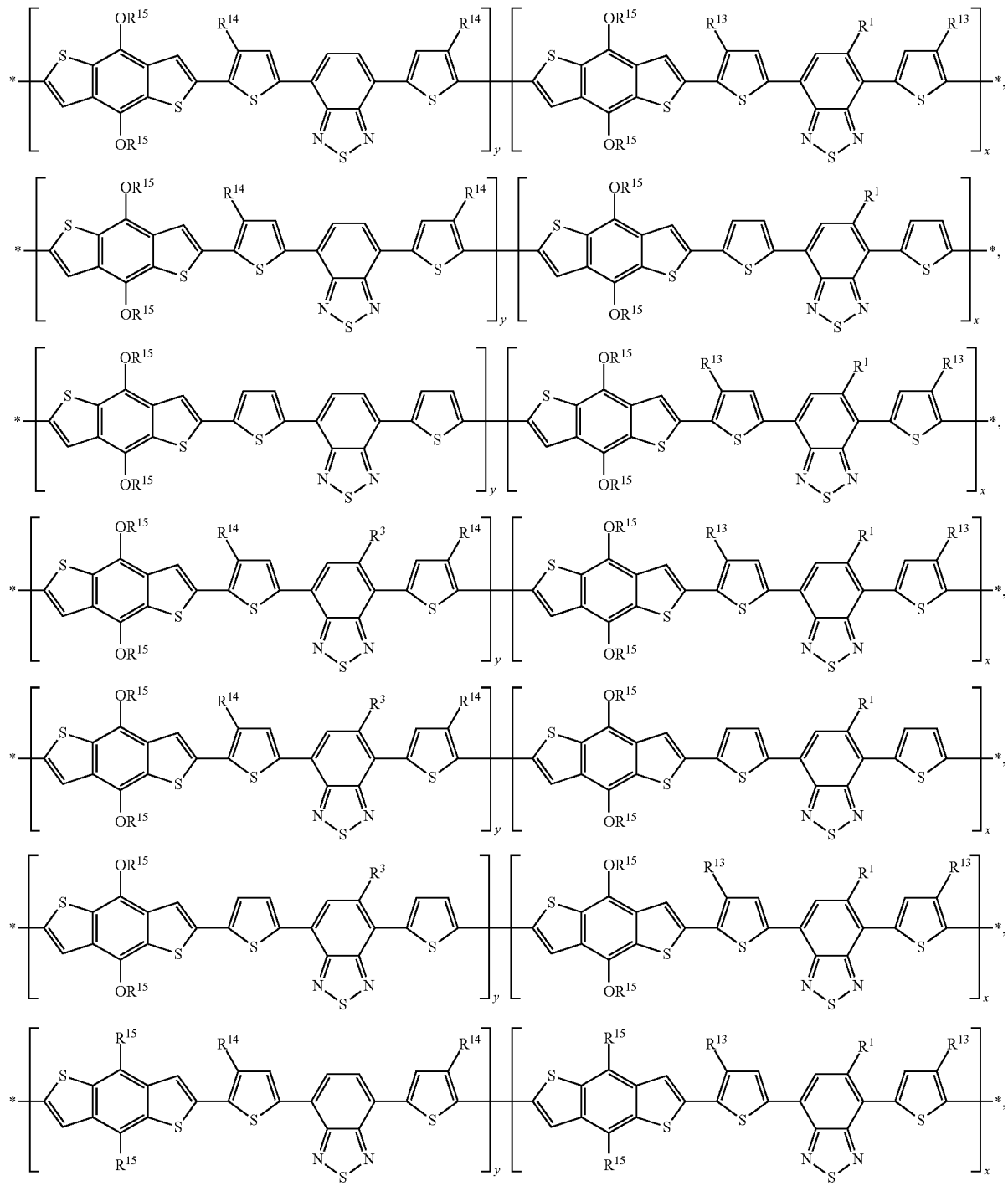

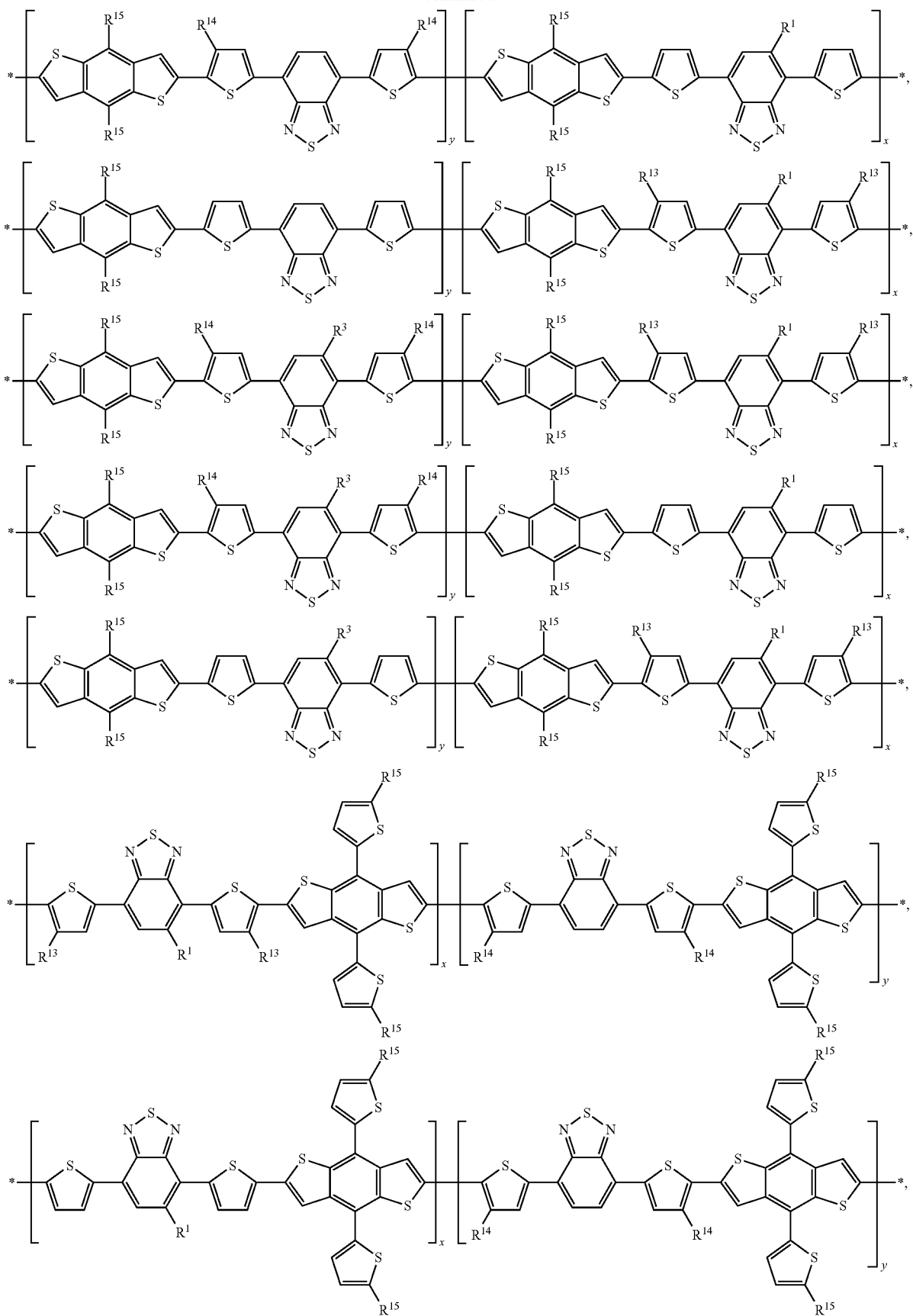

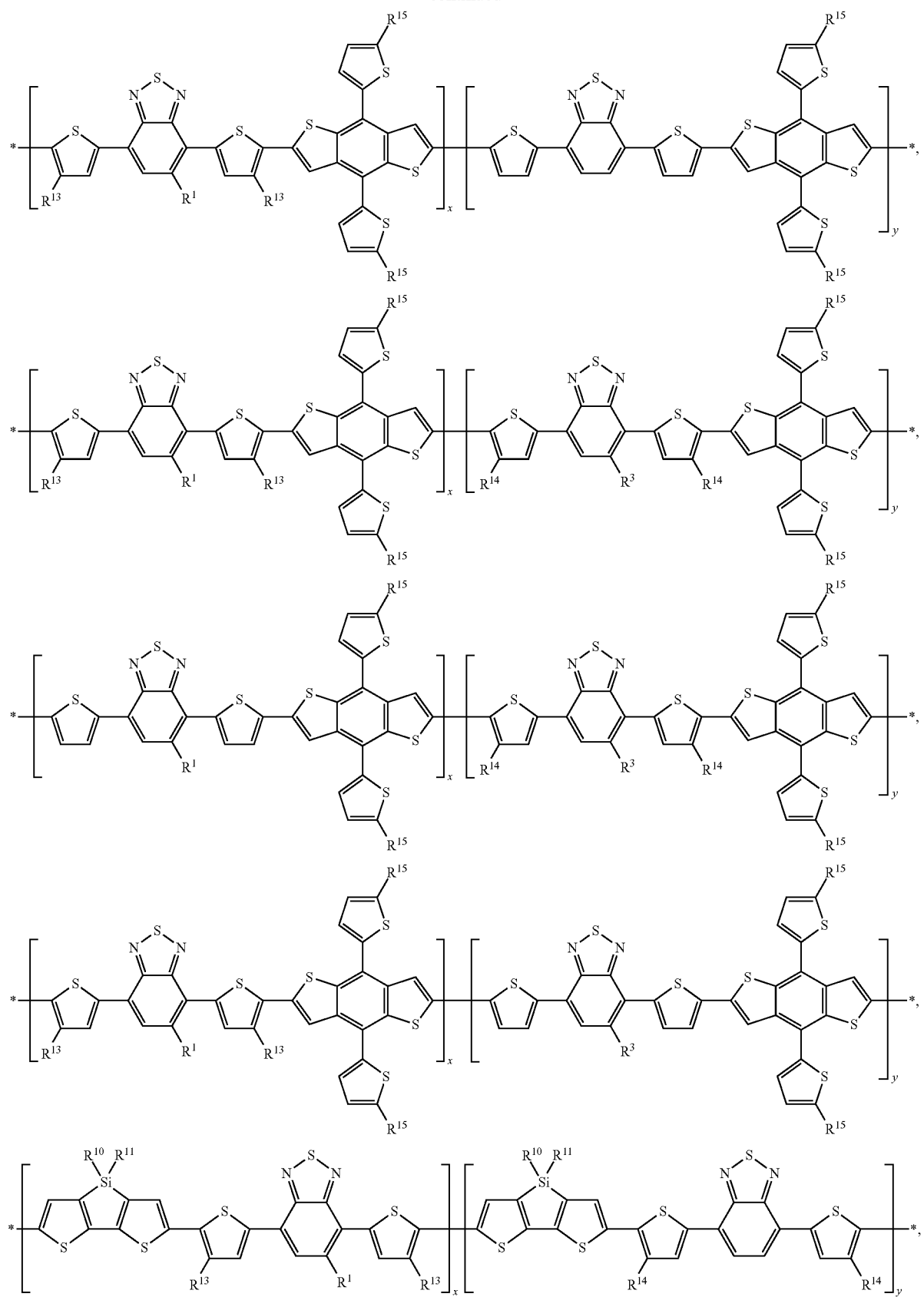

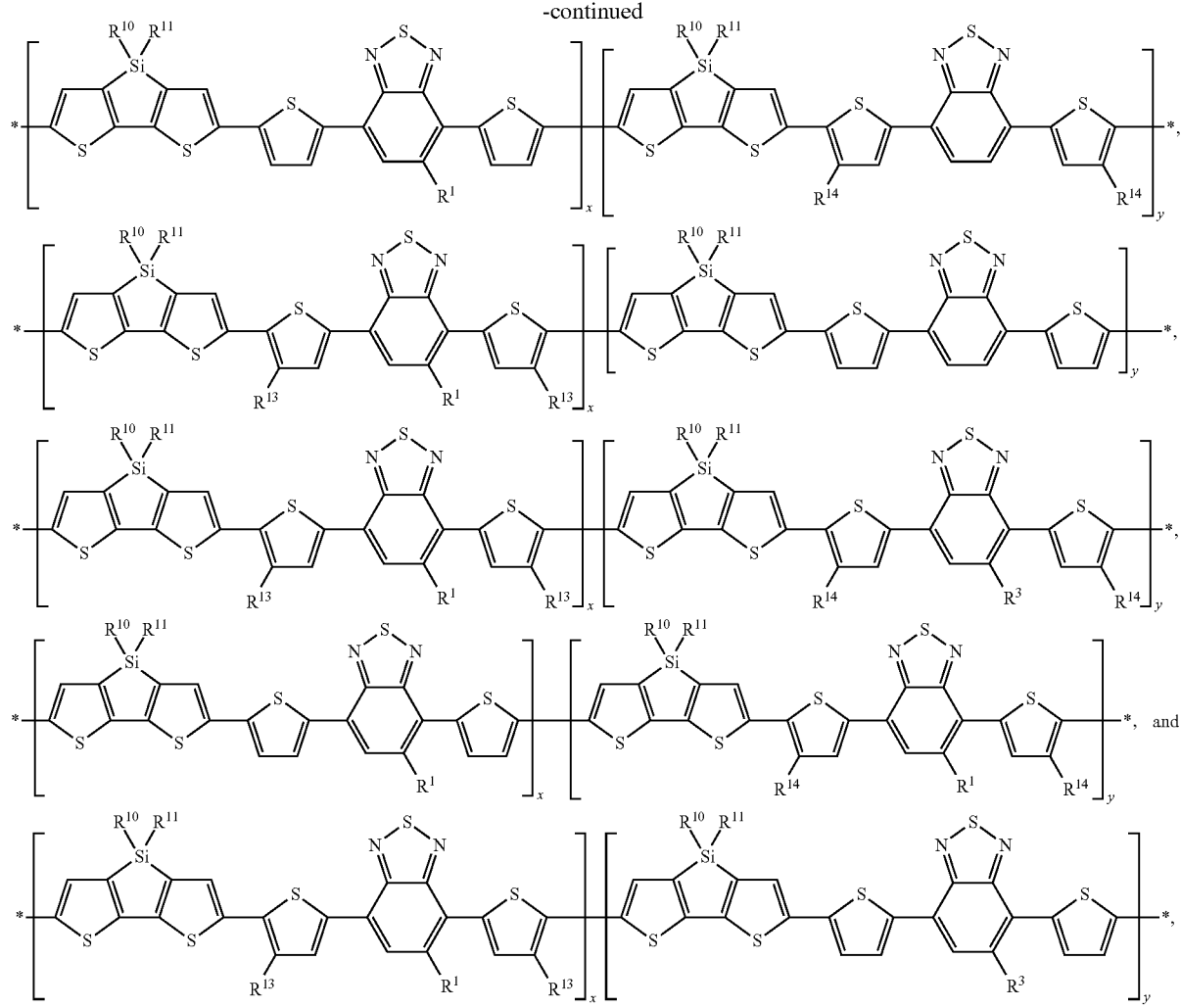

wherein R¹ and R³ independently are F or Cl; $R^{10}$, $R^{11}$, and $R^{15}$ independently are a branched $C_{6-20}$ alkyl group; $R^{13}$ and $R^{14}$ independently are a linear or branched $C_{6-20}$ alkyl group; and x and y are real numbers representing mole fractions, wherein $0.1 \leq x \leq 0.9$, $0.1 \leq y \leq 0.9$, and the sum of x and y is about 1.

12. The device of claim 1 configured as an organic photovoltaic device comprising an anode, a cathode, optionally one or more anode interlayers, optionally one or more cathode interlayers, and in between the anode and the cathode the polymeric semiconductor component according to claim 1.

13. The device of claim 12, wherein the organic photovoltaic device is a bulk heterojunction photovoltaic device.

14. The device of claim 13, wherein the polymeric semiconductor component is photoactive and the polymer of formula (I) is present in a blend material, wherein the polymer of formula (I) functions as an electron-donor compound and the blend material further comprises an electron-acceptor compound.

15. The device of claim 14, wherein the electron-acceptor compound is a fullerene compound.

16. The device of claim 12, wherein the power conversion efficiency is at least about 3%.

17. The device of claim 1 configured as an organic light emitting diode comprising a substrate, an anode, a cathode, and in between the anode and the cathode the polymeric semiconductor component according to claim 1.

18. The device of claim 1 configured as an organic transistor, further comprising a source electrode, a drain electrode, a gate electrode, and a dielectric layer, wherein the dielectric layer is in contact with the polymeric semiconductor component on one surface, and the gate electrode on another surface.

19. The device of claim 18, wherein the organic transistor is an organic field effect transistor.

20. The device of claim 18, wherein the organic transistor is an organic light emitting transistor.

* * * * *